United States Patent
Matsumoto

(10) Patent No.: US 9,190,238 B2
(45) Date of Patent: Nov. 17, 2015

(54) BLANKING DEVICE FOR MULTI CHARGED PARTICLE BEAM, AND MULTI CHARGED PARTICLE BEAM WRITING METHOD

(71) Applicant: NuFlare Technology, Inc., Yokohama (JP)

(72) Inventor: Hiroshi Matsumoto, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/532,430

(22) Filed: Nov. 4, 2014

(65) Prior Publication Data

US 2015/0129773 A1    May 14, 2015

(30) Foreign Application Priority Data

Nov. 12, 2013    (JP) .................................. 2013-233821

(51) Int. Cl.
| | |
|---|---|
| *G21K 5/04* | (2006.01) |
| *H01J 37/04* | (2006.01) |
| *H01J 37/317* | (2006.01) |
| *H01J 37/30* | (2006.01) |

(52) U.S. Cl.
CPC ........... *H01J 37/045* (2013.01); *H01J 37/3007* (2013.01); *H01J 37/3177* (2013.01)

(58) Field of Classification Search
USPC .......... 250/396 R, 397, 492.1, 492.2, 492.21, 250/492.22, 492.23, 492.3
See application file for complete search history.

(56) References Cited

U.S. PATENT DOCUMENTS

| | | | |
|---|---|---|---|
| 5,144,142 A | 9/1992 | Fueki et al. | |
| 5,262,341 A * | 11/1993 | Fueki et al. | .................. 438/618 |
| 2002/0027198 A1 | 3/2002 | Nagata et al. | |
| 2005/0242302 A1 | 11/2005 | Platzgummer et al. | |
| 2005/0242303 A1 | 11/2005 | Platzgummer | |
| 2009/0140160 A1 | 6/2009 | Platzgummer et al. | |
| 2013/0264497 A1* | 10/2013 | Muraki et al. | ............. 250/492.3 |

FOREIGN PATENT DOCUMENTS

| | | |
|---|---|---|
| JP | 2835140 | 12/1998 |
| JP | 3394237 | 4/2003 |
| JP | 2009-502033 | 1/2009 |
| JP | 4843248 | 12/2011 |

* cited by examiner

*Primary Examiner* — Nicole Ippolito
(74) *Attorney, Agent, or Firm* — Oblon, McClelland, Maier & Neustadt, L.L.P.

(57) ABSTRACT

A blanking device for multi-charged particle beams includes plural shift registers arranged in two dimensions, and plural data transmitters each configured to be arranged, where each of first shift register groups is aligned in the same row or column, in the plural shift registers arranged in two dimensions, the plural data transmitters each arranged for each of second shift register groups each obtained by grouping shift registers of one of the first shift register groups into one or more groups, wherein each of the second shift register groups is further grouped into third shift register groups each having shift registers serially connected, as plural subgroups, and each of the plural data transmitters is connected to shift registers configuring a part of shift registers serially connected in each of the third shift register groups such that all of the plural subgroups in a corresponding second shift register group are parallelly connected.

12 Claims, 29 Drawing Sheets

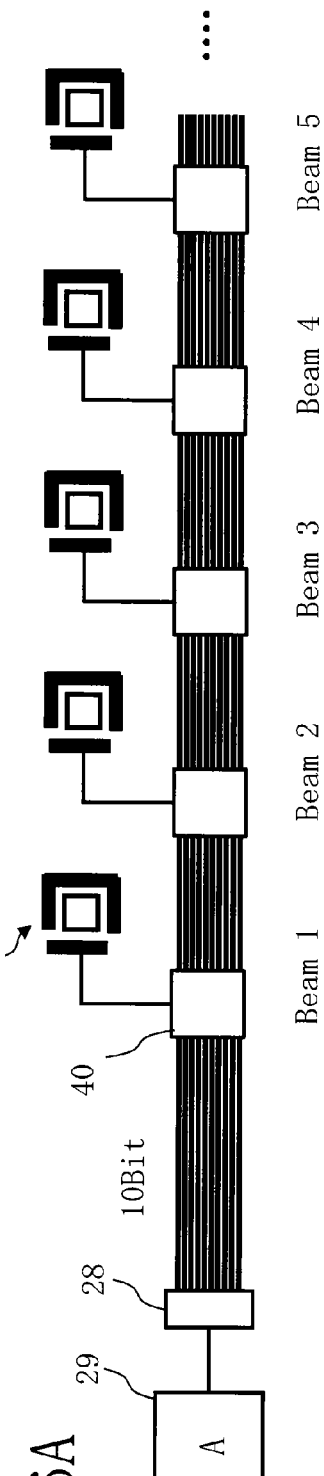
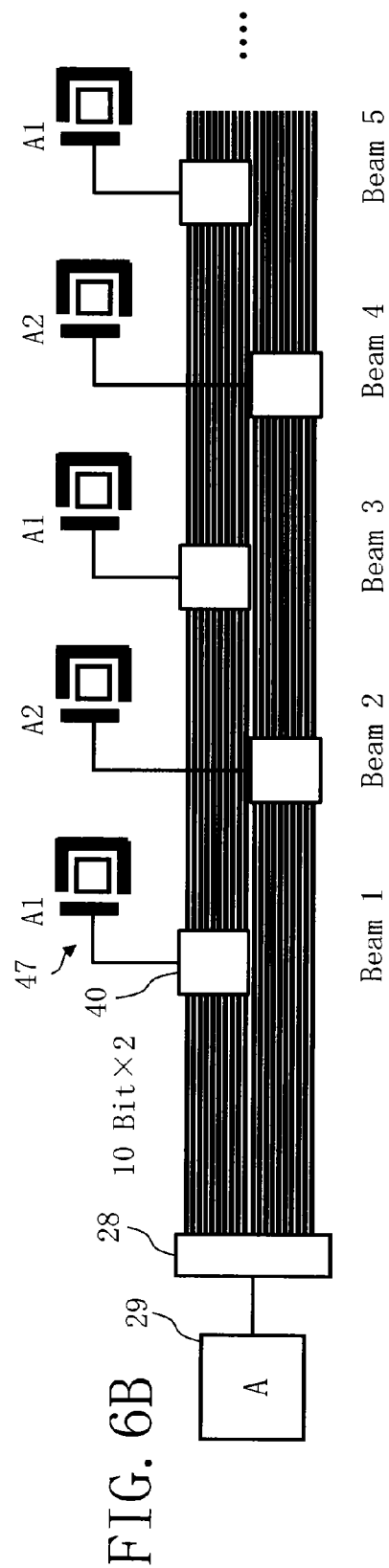
FIG. 6A
FIG. 6B

| Digit  | k   | k-1 | k-2 | k-3 | ... |
|--------|-----|-----|-----|-----|-----|
| Beam 1 | 1   | 1   | 0   | 1   | ... |
| Beam 2 | 1   | 1   | 0   | 0   | ... |
| Beam 3 | 0   | 1   | 1   | 0   | ... |
| Beam 4 | 0   | 1   | 1   | 1   | ... |
| ...    | ... | ... | ... | ... | ... |

FIG. 21

BLANKING DEVICE FOR MULTI CHARGED PARTICLE BEAM, AND MULTI CHARGED PARTICLE BEAM WRITING METHOD

CROSS-REFERENCE TO RELATED APPLICATION

This application is based upon and claims the benefit of priority from the prior Japanese Patent Application No. 2013-233821 filed on Nov. 12, 2013 in Japan, the entire contents of which are incorporated herein by reference.

BACKGROUND OF THE INVENTION

1. Field of the Invention

The present invention relates to a blanking device for blanking multiple charged particle beams and to a multi charged particle beam writing method. More specifically, the present invention relates to a blanking device used in multi-beam writing, and to a writing method using the blanking device, for example.

2. Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer and the like with electron beams.

As an example employing the electron beam writing technique, a writing apparatus using multiple beams (multi-beams) can be cited. Compared with the case of writing a pattern by using a single electron beam, since it is possible to emit multiple beams at a time in multiple writing, the throughput can be greatly increased. For example, in the writing apparatus employing a multi-beam system, multiple beams are formed by letting an electron beam emitted from an electron gun assembly pass through a mask with a plurality of holes, blanking control is performed for each of the beams, and each unblocked beam is reduced by an optical system and deflected by a deflector so as to irradiate a desired position on a target object or "sample".

In multi-beam writing, the dose of each beam is individually controlled based on an irradiation time. For highly accurately controlling such a dose of each beam, it is necessary to perform blanking control to provide on or off of a beam at high speed. In a writing apparatus of a multi-beam system, a blanking control circuit for each beam is placed on a blanking plate where each blanker for use in multiple beams is arranged. It has been considered that a shift register is embedded in each control circuit for each beam, and a signal from a pad is input into shift registers connected in series in each row in a plurality of blankers arranged in a matrix.

Here, for transmitting data to N shift registers connected in series, it is necessary to execute clock operations N times by the shift registers. The heating value of a shift register is proportional to the number of times of clock operation per unit time. On the other hand, if the number of beams increases, the number of shift registers arranged in one row increases. Therefore, the number of times of clock operation per unit time increases, and the heating value increases. Consequently, the heating value of a blanking plate increases. Since the blanking plate is arranged in a vacuum region, and, further, the shift register is arranged in a membrane region of the blanking plate, the heat exhaust efficiency is low. Accordingly, for controlling the heating value to be within an acceptable value, limitation occurs to the number of times of clock operation per unit time. Thus, it becomes difficult to perform a high-speed operation. Furthermore, when the number of beams increases and the number of shift registers arranged in one row increases, data transmission will take time. Therefore, also from this point of view, it becomes difficult to achieve a high-speed operation.

Moreover, for inputting a signal from a pad to shift registers connected in series in each row, it is necessary to arrange, on the blanking plate, pads of the same number as that of rows of a plurality of blankers. Therefore, if aiming to reduce the number of shift registers arranged in one row by dividing them, it will be necessary to increase the number of pads. However, since each blanker and each control circuit arranged at the blanking plate are manufactured using the LSI manufacturing technology, there is an upper limit for the chip size, which is about 20 mm. Therefore, if the number of beams increases and thus the number of rows increases, it becomes difficult to arrange pads, whose number is corresponding to the number of the rows, at one side of the blanking plate. For example, assuming that the beam arrangement is 512×512, the beam pitch is about 32 μm and thus the distance between pads becomes too narrow to arrange the pads. Accordingly, it is required to inhibit the increase of the number of pads.

As technology relating to the blanking system using shift registers, there is disclosed technology in which a plurality of blankers (electrodes) are connected in parallel to one circuit where a shift register and a switch are arranged, and a plurality of circuits each have the configuration described above are in order connected to one data line so as to perform data transmission (e.g., refer to Japanese Published Unexamined Patent Application (JP-A) No. 2009-502033). However, though not described in the disclosed technology, since a large number of times of clock operation is still needed even if shift registers in accordance with the number of blankers are arranged in each circuit, it is still difficult to solve the above-described problem that occurs when the number of beams increases and therefore the number of shift registers arranged in one row increases.

BRIEF SUMMARY OF THE INVENTION

According to one aspect of the present invention, a blanking device for multiple charged particle beams includes: a plurality of shift registers configured to be arranged in two dimensions; and a plurality of data transmitters each configured to be arranged, where each of first shift register groups is aligned in a same row or a same column, in the plurality of shift registers arranged in two dimensions, the plurality of data transmitters each arranged for each of second shift register groups each obtained by grouping shift registers of any one of the first shift register groups into one or more groups, wherein each of the second shift register groups is further grouped into third shift register groups each having shift registers connected in series, as a plurality of subgroups, and each of the plurality of data transmitters is connected to shift registers configuring a part of shift registers connected in series in each of the third shift register groups such that all of the plurality of subgroups in a corresponding second shift register group are connected in parallel.

According to another aspect of the present invention, a multi charged particle beam writing method includes: performing ON/OFF switching of a beam by an individual blanking system for the beam concerned, for each beam in multi-beams of charged particle beam, with respect to each time irradiation of irradiation of a plurality of times, by using a plurality of individual blanking systems that respectively perform beam ON/OFF control of a corresponding beam in the multi-beams; and performing blanking control, in addition to the performing ON/OFF switching of the beam for the each beam by the individual blanking system, with respect to the each time irradiation of the irradiation of the plurality of times, so that the beam is in an ON state during an irradiation time corresponding to irradiation concerned, by using a common blanking system that collectively performs beam ON/OFF control for a whole of the multi-beams, wherein the plurality of individual blanking systems includes a plurality of shift registers configured to be arranged in two dimensions, and a plurality of data transmitters each configured to be arranged, where each of first shift register groups is aligned in a same row or a same column, in the plurality of shift registers arranged in two dimensions, the plurality of data transmitters each arranged for each of second shift register groups each obtained by grouping shift registers of any one of the first shift register groups into one or more groups, wherein each of the second shift register groups is further grouped into third shift register groups each having shift registers connected in series, as a plurality of subgroups, and each of the plurality of data transmitters is connected to shift registers configuring a part of shift registers connected in series in each of the third shift register groups such that all of the plurality of subgroups in a corresponding second shift register group are connected in parallel.

BRIEF DESCRIPTION OF THE DRAWINGS

FIGS. 6A and 6B show examples of a connected state of shift registers according to the first embodiment and a comparative example;

FIG. 21 shows an example of a part of irradiation time arrangement data according to the second embodiment;

DETAILED DESCRIPTION OF THE INVENTION

In the following embodiments, there will be described a blanking device that can reduce the number of times of clock operation of shift registers connected in series and perform a high-speed operation.

In the following embodiments, there will be described a configuration in which an electron beam is used as an example of a charged particle beam. The charged particle beam is not limited to the electron beam, and other charged particle beam such as an ion beam may also be used.

First Embodiment

Figure 1:
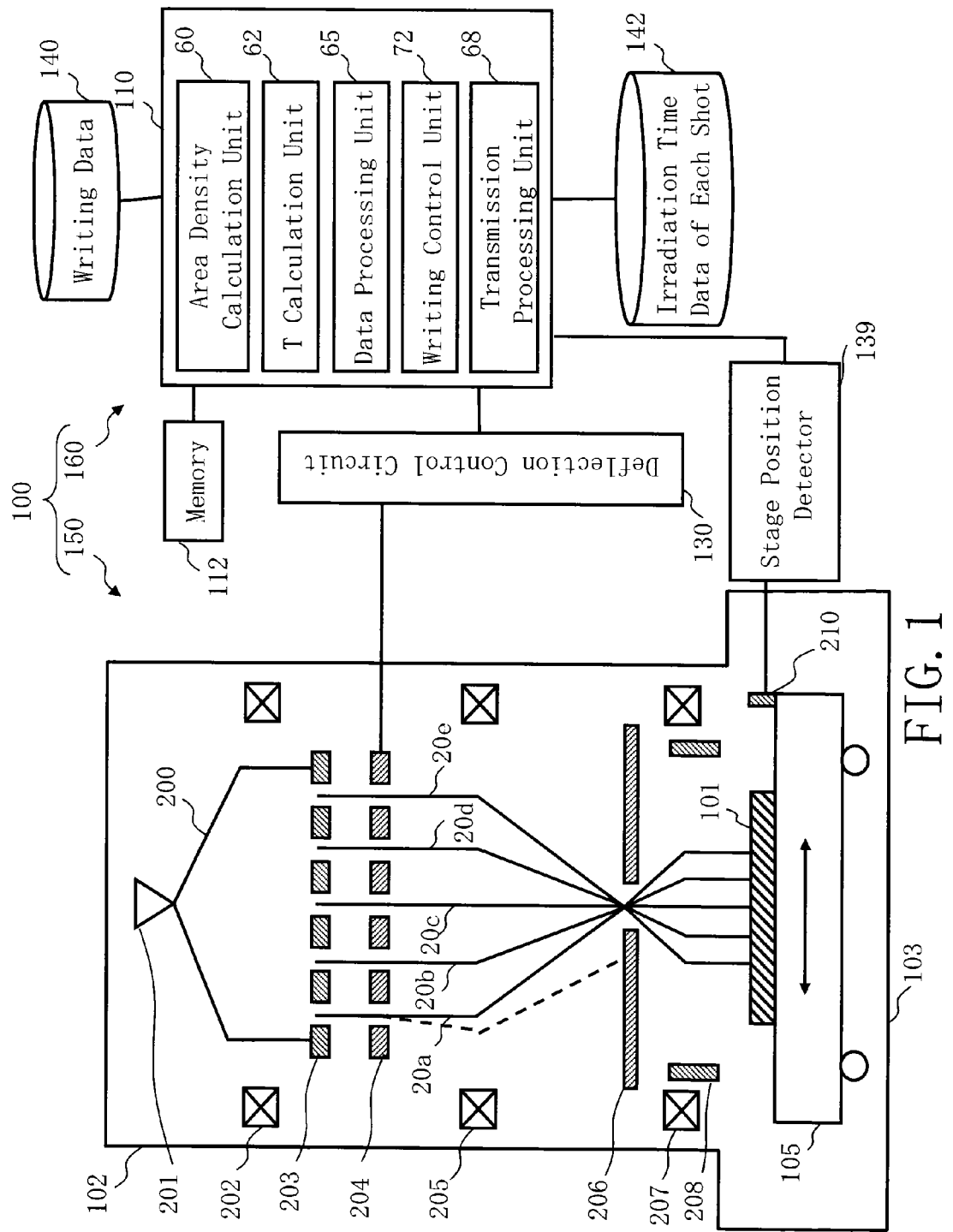
FIG. 1 is a schematic diagram showing a configuration of a writing apparatus according to a first embodiment.

FIG. 1 is a schematic diagram showing a configuration of a writing or "drawing" apparatus according to the first embodiment. In FIG. 1, a writing apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun assembly 201, an illumination lens 202, an aperture member 203, a blanking plate 204, a reducing lens 205, a limiting aperture member 206, an objective lens 207, and a deflector 208. In the writing chamber 103, there is arranged an XY stage 105. On the XY stage 105, there is placed a target object or "sample" 101 such as a mask serving as a writing target substrate when performing writing. The target object 101 is, for example, an exposure mask used for manufacturing semiconductor devices, or is a semiconductor substrate (silicon wafer) on which semiconductor elements are formed. The target object 101 may be, for example, a mask blank on which resist is applied and a pattern has not yet been formed. On the XY stage 105, further, there is arranged a mirror 210 for measuring the position of the XY stage.

The control unit 160 includes a control computer 110, a memory 112, a deflection control circuit 130, a stage position detector 139, and storage devices 140, and 142, such as magnetic disk drives. The control computer 110, the memory 112, the deflection control circuit 130, the stage position detector 139, and the storage devices 140 and 142 are mutually connected through a bus (not shown). Writing data is input into the storage device 140 (storage unit) from the outside to be stored therein.

In the control computer 110, there are arranged an area density calculation unit 60, an irradiation time T calculation unit 62, a data processing unit 65, a writing control unit 72, and a transmission processing unit 68. Functions such as the area density calculation unit 60, the irradiation time T calculation unit 62, the data processing unit 65, the writing control unit 72, and the transmission processing unit 68 may be configured by hardware such as an electric circuit, or by software such as a program causing a computer to implement these functions. Alternatively, they may be configured by a combination of hardware and software. Data which is input and output to/from the area density calculation unit 60, the irradiation time T calculation unit 62, the data processing unit 65, the writing control unit 72, or the transmission processing unit 68 and data being calculated are stored in the memory 112 each time.

FIG. 1 shows a configuration necessary for explaining the first embodiment. Other configuration elements generally necessary for the writing apparatus 100 may also be included.

Figure 2A:
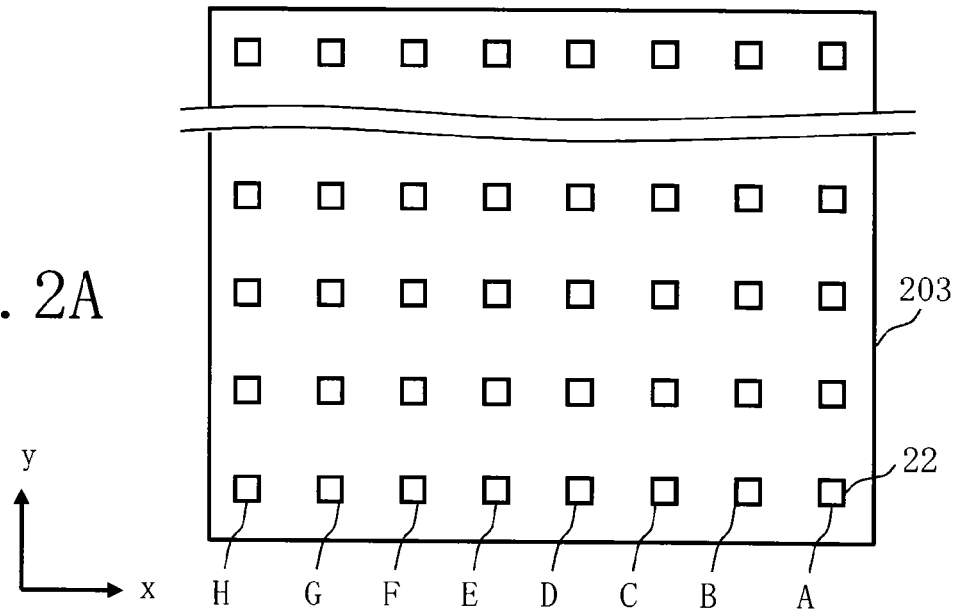
FIGS. 2A and 2B are conceptual diagrams each showing an example of the configuration of an aperture member according to the first embodiment.
Figure 2B:
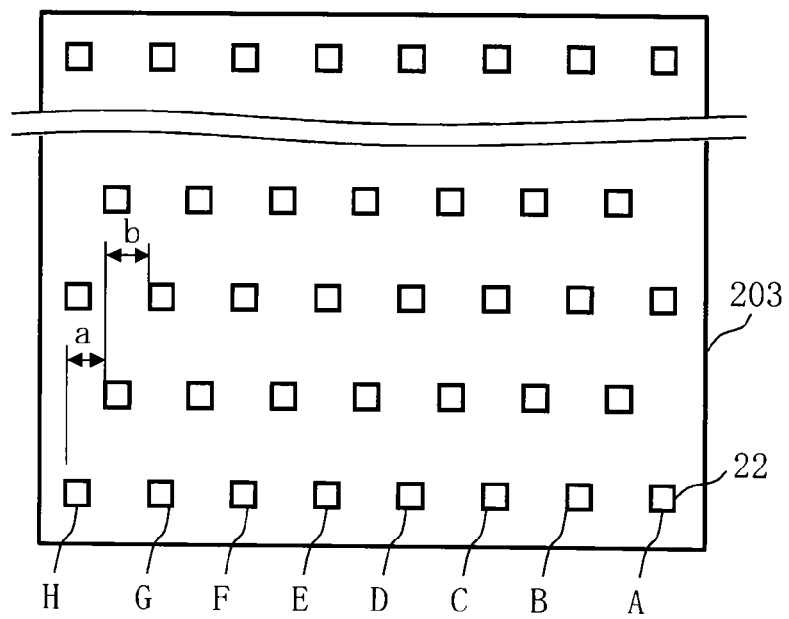

FIGS. 2A and 2B are conceptual diagrams each showing an example of the configuration of an aperture member according to the first embodiment. In FIG. 2A, holes (openings) 22 are formed at a predetermined arrangement pitch, in the shape of a matrix, in the aperture member 203, wherein m×n (m≥2, n≥2) holes 22 are arranged in m columns in the vertical direction (the y direction) and n rows in the horizontal direction (the x direction). In FIG. 2A, holes 22 of 512 (rows)×8 (columns) are formed, for example. Each hole 22 is a quadrangle of the same dimensions and shape. Alternatively, each hole may be a circle of the same circumference. In this case, there is shown an example of each row having eight holes 22 from A to H in the x direction. Multi-beams 20 are formed by letting portions of an electron beam 200 respectively pass through a corresponding hole of a plurality of holes 22. Here, there is shown the case where the holes 22 are arranged in a plurality of columns and rows in both the x and the y directions, but it is not limited thereto. For example, it is also acceptable to arrange a plurality of holes 22 in only one row or in only one column, that is, in one row where a plurality of holes are arranged as columns, or in one column where a plurality of holes are arranged as rows. Moreover, the method of arranging the holes 22 is not limited to the case of FIG. 2A where holes are aligned in a grid. It is also preferable to arrange the holes 22 as shown in FIG. 2B where the position of each hole in the second row is shifted from the position of each hole in the first row by a dimension "a" in the horizontal direction (x direction), for example. Similarly, it is also preferable to arrange the holes 22 such that the position of each hole in the third row is shifted from the position of each hole in the second row by a dimension "b" in the horizontal direction (x direction).

Figure 3:
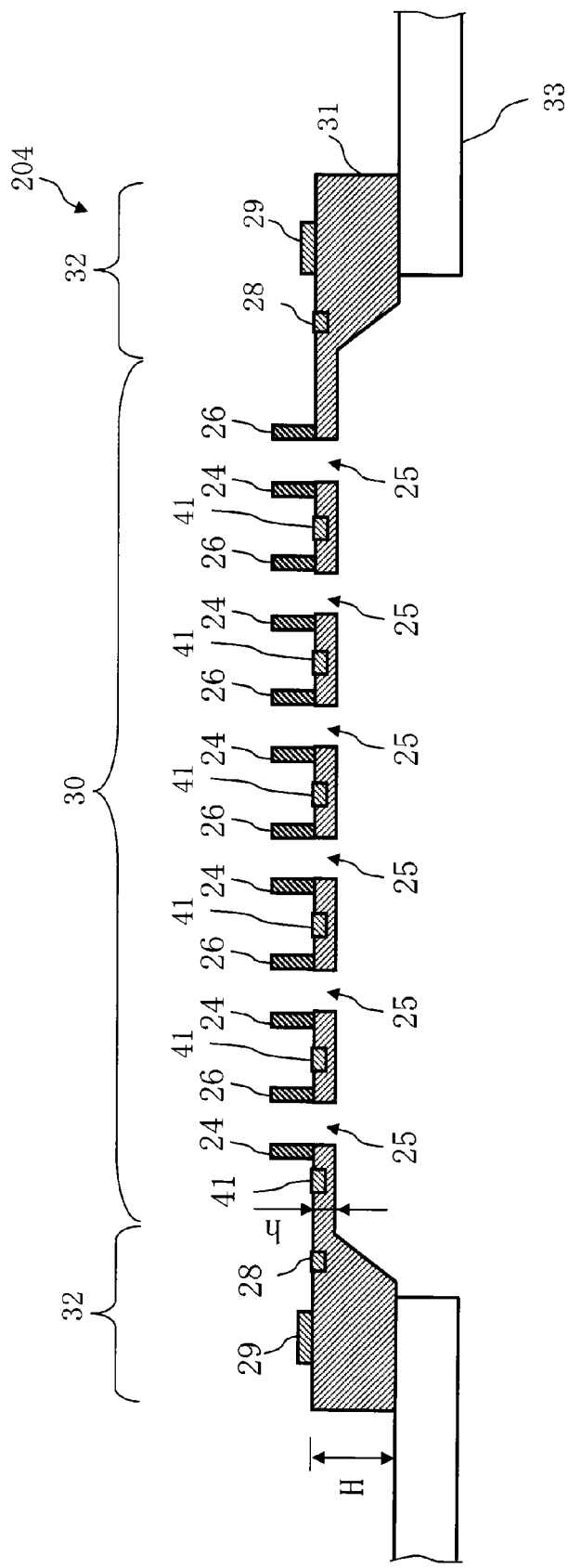
FIG. 3 is a sectional view showing the configuration of a blanking plate according to the first embodiment.
Figure 4A:
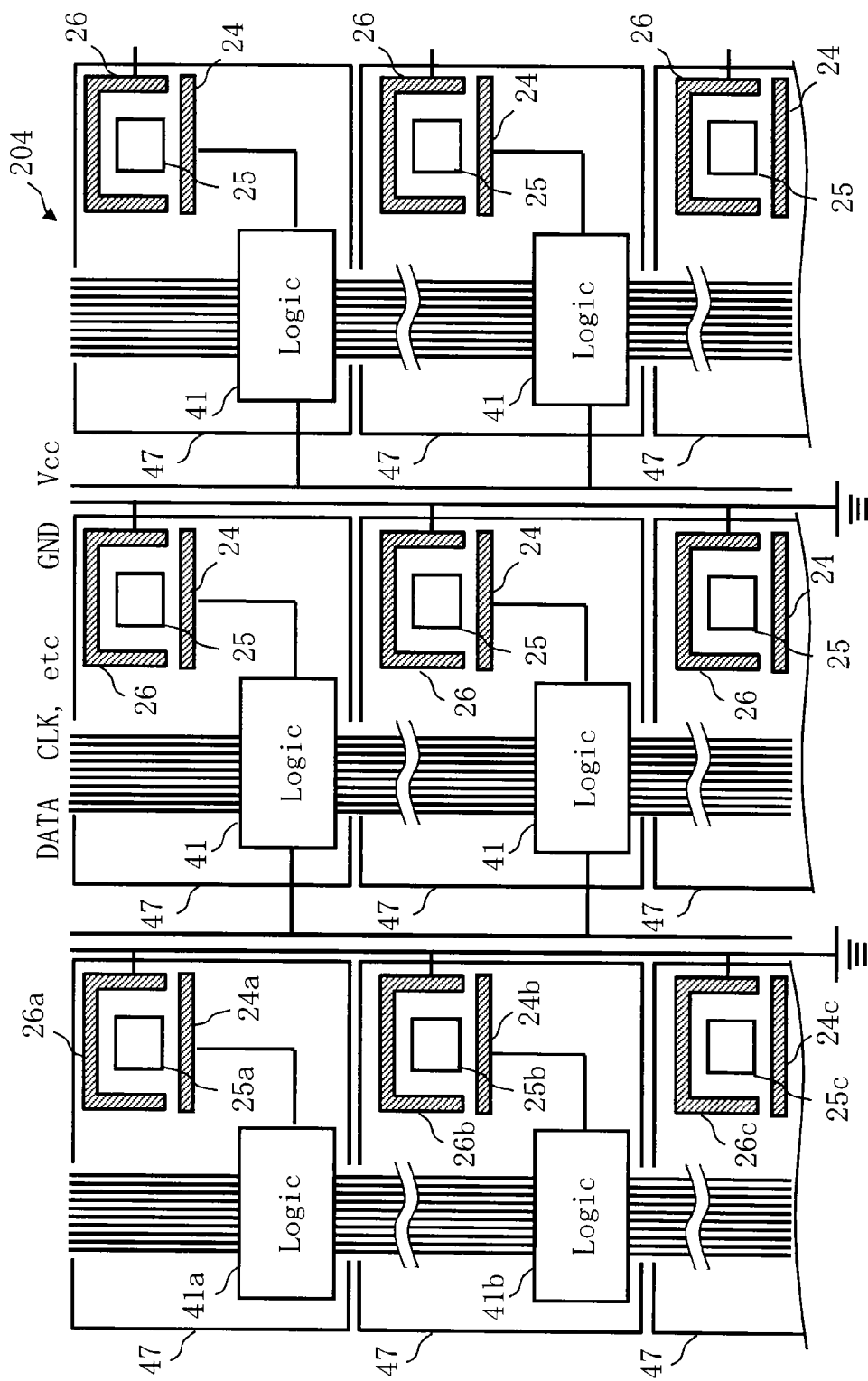
FIG. 4A is a top view conceptual diagram showing a part of the configuration in a membrane region of a blanking plate according to the first embodiment.

FIG. 3 is a sectional view showing the configuration of a blanking plate according to the first embodiment. FIG. 4A is a top view conceptual diagram showing a part of the configuration in a membrane region of a blanking plate according to the first embodiment. In FIGS. 3 and 4A, the positions of electrodes 24 and 26 and the position of a control circuit 41 are not in accordance with each other. With regard to the configuration of the blanking plate 204, as shown in FIG. 3, a semiconductor substrate 31 made of silicon, etc. is placed on a support table 33. The central part of the substrate 31 is shaved from the back side and processed to be a membrane region 30 (first region) whose thin film thickness is h. The circumference surrounding the membrane region 30 is a circumference region 32 (second region) whose thick film thickness is H. The upper surface of the membrane region 30 and the upper surface of the circumference region 32 are formed to have equal height positions, or substantially equal height positions. At the back side of the circumference region 32, the substrate 31 is supported to be on the support table 33. The central part of the support table 33 is open, and the position of the membrane region 30 is located in the opening part of the support table 33.

In the membrane region 30, there are formed apertured passage holes 25 (openings) through which multiple beams respectively pass at the positions each corresponding to each hole 22 of the aperture member 203 shown in FIGS. 2A and 2B. As shown in FIGS. 3 and 4A, there are arranged, on the membrane region 30, pairs of the electrodes 24 and 26 (blankers: blanking deflectors) for blanking deflection, and these electrodes of each pair are at opposite sides of each passage hole 25. Moreover, close to each passage hole 25 in the membrane region 30, there is arranged the control circuit 41 (logic circuit) for applying a deflection voltage to the electrode 24, for example, of each passage hole 25. The other (for example, the electrode 26) of the two electrodes 24 and 26 for each beam is earthed. Moreover, as shown in FIG. 4A, for example, a 10-bit parallel line for control signals is connected to each control circuit 41. In addition to, for example, the 10-bit parallel line, a clock signal line and a power source line are connected to each control circuit 41. A part of the parallel line may be used as the clock signal line and the power source line. An individual blanking system 47 composed of the electrodes 24 and 26 and the control circuit 41 is configured for each beam of multiple beams. Moreover, a shift register to be described later is arranged in the control circuit 41 for each beam. Thus, a plurality of shift registers and a plurality of blankers are arranged in the membrane region 30 where the film thickness of the substrate 31 is thin.

Figure 4B:
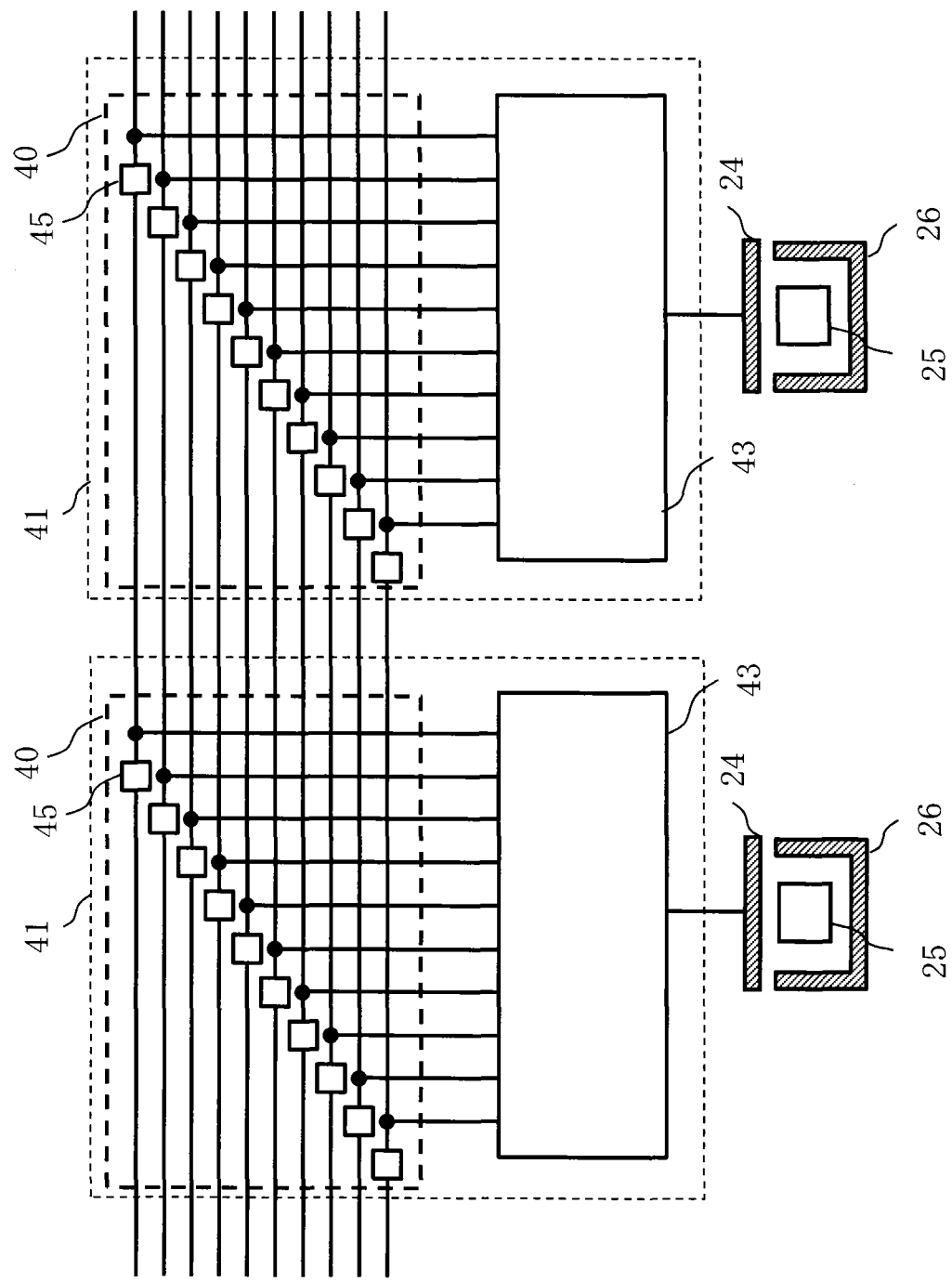
FIG. 4B shows a detailed relation between a control circuit 41 and a 10-bit parallel line of FIG. 4A.

FIG. 4B shows a detailed relation between the control circuit 41 and the 10-bit parallel line of FIG. 4A. A shift register 40, as a part of the control circuit 41, is placed on the parallel line. Outputs from this shift register 40 are connected to an input to a main circuit 43 (electric potential supply circuit) of the beam control circuit 41 and an input to the shift register 40 of the control circuit 41 for the next beam. In the case of FIG. 4B, a 10-bit shift register 40 is shown as an example. In each shift register 40 corresponding to a plurality of bits, data shift transmission systems 45 each capable of bit-by-bit data transmission are arranged in parallel on the parallel line according to the number of corresponding bits of the shift register 40. The same clocks are respectively input to all of the data shift transmission systems 45 in the shift register 40, and data is transmitted, at each clock, to each data shift transmission system 45 in the next shift register 40. It should be understood that if it is a shift register corresponding to one bit, for example, one data shift transmission system 45 is arranged. In the state in which exposure time data of each beam has been respectively transferred to the shift register 40 of the control circuit 41 of the beam concerned, an exposure operation is performed after the value of the shift register 40 is read out to the main circuit 43.

On the circumference region 32 whose film thickness is thick, a plurality of sets, each composed of a serial parallel conversion unit 28 (an example of a data transmitter) and a pad 29 that receives a control signal corresponding to writing data from the deflection control circuit 130, are arranged as shown in FIG. 3.

The electron beams 20 each pass through a corresponding passage hole are respectively deflected by voltages each independently applied to the pair of the two electrodes 24 and 26. Blanking control is performed by this deflection. In other words, a plurality of blankers respectively provide a blanking deflection to a corresponding beam in multiple beams each controlled through a shift register for a corresponding beam in a plurality of shift registers. Thus, a plurality of blankers respectively provide a blanking deflection to a corresponding beam in multiple beams respectively having passed through a plurality of holes 22 (openings) of the aperture member 203.

Figure 5:
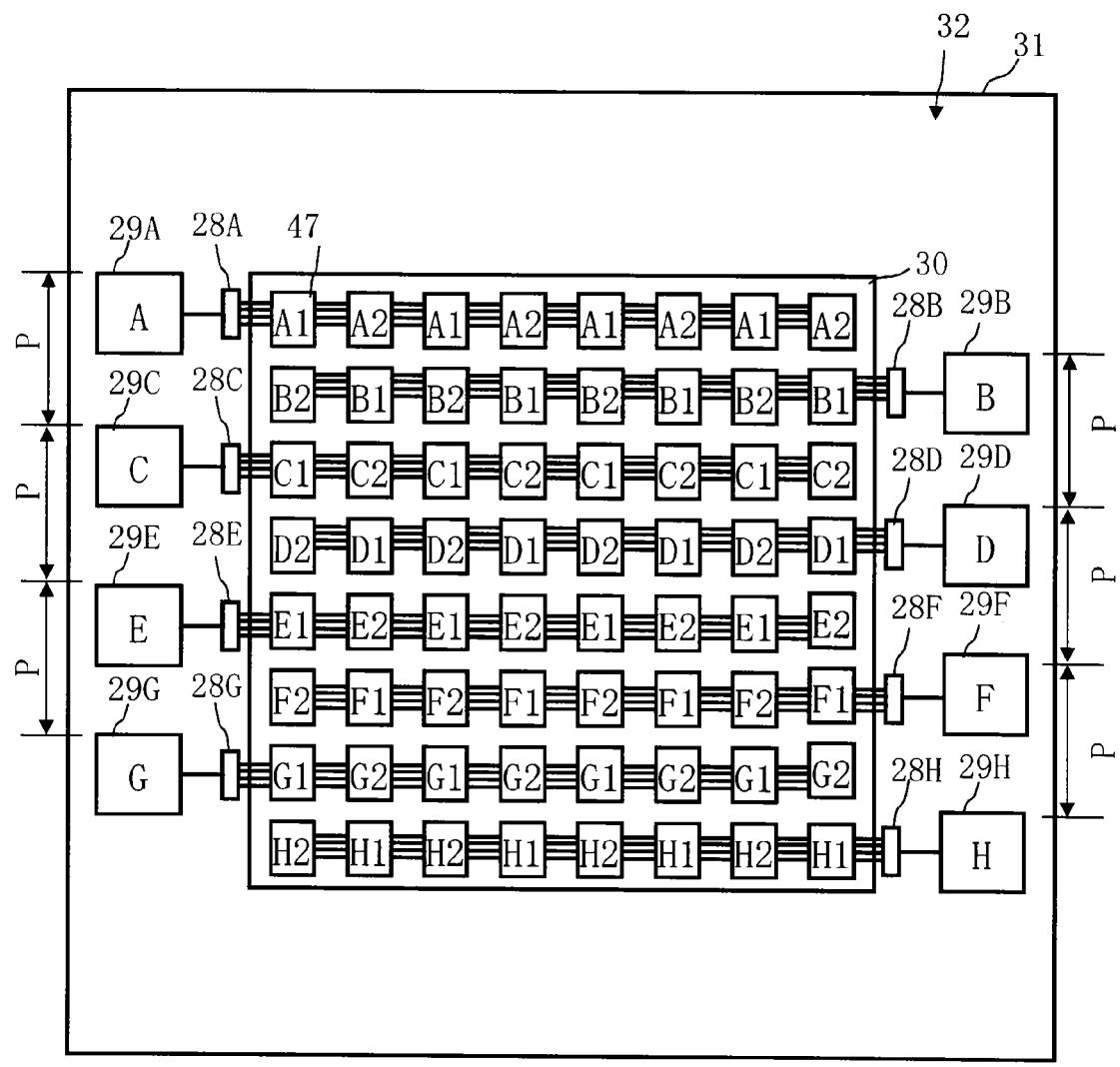
FIG. 5 is a top view showing an example of the configuration of a blanking plate according to the first embodiment.

FIG. 5 is a top view showing an example of the configuration of a blanking plate according to the first embodiment. The substrate 31 is formed in a quadrangle viewed from the above, and the membrane region 30 at the central part is also formed in a quadrangle. A plurality of individual blanking systems 47 are arranged in two dimensions in the membrane region 30. For example, they are arranged in a matrix. A plurality of individual blanking systems 47 arranged in eight rows by eight columns (8×8) are shown in the example of FIG. 5. In the control circuit 41 of each individual blanking system 47, there is arranged a shift register to be described later. A plurality of shift registers for all beams in the membrane region 30 configure a plurality of groups thereof connected in series.

In the example of FIG. 5, a group (row group) is configured by shift registers in a plurality of individual blanking systems 47 arranged in a straight line along the parallel line (arranged laterally) in each row. For example, as shown in FIG. 5, one group (row group) is composed of shift registers in, for example, eight individual blanking systems 47 each denoted by "A" in the first row from the top. Similarly, one group (row group) is composed of shift registers in, for example, eight individual blanking systems 47 each denoted by "B" in the second row. Similarly, one group (row group) is composed of shift registers in, for example, eight individual blanking systems 47 each denoted by "C" in the third row. Similarly, one group (row group) is composed of shift registers in, for example, eight individual blanking systems 47 each denoted by "D" in the fourth row. Similarly, one group (row group) is composed of shift registers in, for example, eight individual blanking systems 47 each denoted by "E" in the fifth row. Similarly, one group (row group) is composed of shift registers in, for example, eight individual blanking systems 47 each denoted by "F" in the sixth row. Similarly, one group (row group) is composed of shift registers in, for example, eight individual blanking systems 47 each denoted by "G" in the seventh row. Similarly, one group (row group) is composed of shift registers in, for example, eight individual blanking systems 47 each denoted by "H" in the eighth row.

One serial parallel conversion unit 28 (an example of a data transmitter) is arranged for each of groups of shift registers. Then, one pad 29 is arranged for each serial parallel conversion unit 28. In addition, when not a single ended signal but a differential signal is input into the substrate 31 of the blanking plate, a signal input through a pair of pads is converted into a single ended signal to be input into the serial parallel conversion unit 28.

FIG. 5 shows the case in which a group (row group) is composed of shift registers (first shift register group) arranged in a straight line along the parallel line in each row, in shift registers in a plurality of individual blanking systems 47 arranged in two dimensions, but it is not limited thereto. It is also acceptable that the shift registers (first shift register group) arranged in a straight line are grouped into two or more groups (row groups) each of which is composed of shift registers (second shift register group). That is, FIG. 5 shows the case where the first shift register group and the second shift register group indicate the same shift register group.

Thus, each of a plurality of serial parallel conversion units 28 is arranged for each of shift register groups (second shift register groups) obtained by grouping shift registers (first shift register group) arranged in a straight line in a plurality of shift registers arranged in two dimensions into one or more groups.

For example, to each group (row group) composed of shift registers (first shift register group) in each row, a corresponding serial parallel conversion unit 28 is connected by a parallel line. The pad 29 is connected to each of a plurality of serial parallel conversion units 28 by a single line.

For the sake of simplification, the serial parallel conversion unit 28 and the shift register are connected with each other by a 4-bit parallel line in the case of FIG. 5, but, they are connected by a line whose number of bits is the same as that shown in FIGS. 6A and 6B to be described later, for example, by a 20-bit parallel line.

In the example of FIG. 5, along the left side of the four sides of the membrane region 30, there are arranged a set "A" composed of a serial parallel conversion unit 28A and a pad 29A, a set "C" composed of a serial parallel conversion unit 28C and a pad 29C, a set "E" composed of a serial parallel conversion unit 28E and a pad 29E, and a set "G" composed of a serial parallel conversion unit 28G and a pad 29G. Along the right side of the four sides of the membrane region 30, there are arranged a set "B" composed of a serial parallel conversion unit 28B and a pad 29B, a set "D" composed of a serial parallel conversion unit 28D and a pad 29D, a set "F" composed of a serial parallel conversion unit 28F and a pad 29F, and a set "H" composed of a serial parallel conversion unit 28H and a pad 29H.

Then, shift registers in each group (the first shift register group or the second shift register group) are further grouped into a plurality of subgroups. In the example of FIG. 5, the shift registers in a group (row group) in each row are further grouped into a plurality of subgroups.

For example, as shown in FIG. 5, with respect to the shift registers in the eight individual blanking systems 47 each denoted by "A" in the first row from the top, one subgroup is composed of shift registers (third shift register group) in the four individual blanking systems 47 each denoted by "A1". Moreover, for example, another subgroup is composed of shift registers (third shift register group) in the four individual blanking systems 47 each denoted by "A2".

Similarly, for example, as shown in FIG. 5, with respect to the shift registers in the eight individual blanking systems 47 each denoted by "B" in the second row from the top, one subgroup is composed of shift registers (third shift register group) in the four individual blanking systems 47 each denoted by "B1". Moreover, for example, another subgroup is composed of shift registers (third shift register group) in the four individual blanking systems 47 each denoted by "B2".

Similarly, for example, as shown in FIG. 5, with respect to the shift registers in the eight individual blanking systems 47 each denoted by "C" in the third row from the top, one subgroup is composed of shift registers (third shift register group) in the four individual blanking systems 47 each denoted by "C1". Moreover, for example, another subgroup is composed of shift registers (third shift register group) in the four individual blanking systems 47 each denoted by "C2".

Similarly, for example, as shown in FIG. 5, with respect to the shift registers in the eight individual blanking systems 47 each denoted by "D" in the fourth row from the top, one subgroup is composed of shift registers (third shift register group) in the four individual blanking systems 47 each denoted by "D1". Moreover, for example, another subgroup is composed of shift registers (third shift register group) in the four individual blanking systems 47 each denoted by "D2".

Similarly, for example, as shown in FIG. 5, with respect to the shift registers in the eight individual blanking systems 47 each denoted by "E" in the fifth row from the top, one subgroup is composed of shift registers (third shift register group) in the four individual blanking systems 47 each denoted by "E1". Moreover, for example, another subgroup is composed of shift registers (third shift register group) in the four individual blanking systems 47 each denoted by "E2".

Similarly, for example, as shown in FIG. 5, with respect to the shift registers in the eight individual blanking systems 47 each denoted by "F" in the sixth row from the top, one subgroup is composed of shift registers (third shift register group) in the four individual blanking systems 47 each denoted by "F1". Moreover, for example, another subgroup is composed of shift registers (third shift register group) in the four individual blanking systems 47 each denoted by "F2".

Similarly, for example, as shown in FIG. 5, with respect to the shift registers in the eight individual blanking systems 47 each denoted by "G" in the seventh row from the top, one subgroup is composed of shift registers (third shift register group) in the four individual blanking systems 47 each denoted by "G1". Moreover, for example, another subgroup is composed of shift registers (third shift register group) in the four individual blanking systems 47 each denoted by "G2".

Similarly, for example, as shown in FIG. 5, with respect to the shift registers in the eight individual blanking systems 47 each denoted by "H" in the eighth row from the top, one subgroup is composed of shift registers (third shift register group) in the four individual blanking systems 47 each denoted by "H1". Moreover, for example, another subgroup is composed of shift registers (third shift register group) in the four individual blanking systems 47 each denoted by "H2".

FIGS. 6A and 6B show examples of a connected state of shift registers according to the first embodiment and a comparative example. In FIGS. 6A and 6B, circuits other than the shift registers 40 in the control circuits 41 are not shown. The comparative example of FIG. 6A shows a part of the case where all the shift registers (first shift register group) in each row are connected in series. In the example of FIG. 6A, all the shift registers 40 in the eight individual blanking systems 47 each denoted by "A" in the first row from the top shown in FIG. 5 are connected in series by a 10-bit parallel line, for example. The serial parallel conversion unit 28 is connected to one of the shift registers in a group in each row, (that is, the shift register 40 at the end and close to the serial parallel conversion unit 28), by a 10-bit parallel line. In the case of FIG. 6A, only five of the eight individual blanking systems 47 are shown, and the others are omitted. Moreover, in the case of FIG. 6A, beams passing through the eight individual blanking systems 47 each denoted by "A" in the first row are defined, for example, from the side close to the serial parallel conversion unit 28, as a beam 1, a beam 2, and so on. In the configuration shown in FIG. 6A, for example, when eight individual blanking systems 47 are arranged at "A" in the first row, performing clock operation eight times is needed for transmitting a blanking signal up to a beam 8 by using the shift registers 40. Therefore, in the case of FIG. 6A, clock operation of eight times is needed for one beam shot.

As described above, for transmitting data to N shift registers connected in series, it is necessary to execute clock operations N times by the shift registers. The heating value of a shift register is proportional to the number of times of clock operation per unit time. On the other hand, if the number of beams increases, the number of shift registers arranged in one row increases. Therefore, the number of times of clock operation per unit time increases, and the heating value increases. Consequently, the heating value of a blanking plate increases. Since the blanking plate is arranged in a vacuum region, and, further, shift registers are arranged in the membrane region of the blanking plate, the heat exhaust efficiency is low. Accordingly, for controlling the heating value to be within an acceptable value, limitation occurs to the number of times of clock operation per unit time. Thus, it becomes difficult to perform a high-speed operation. Furthermore, when the number of beams increases and the number of shift registers arranged in one row increases, data transmission will take time. Therefore, also from this point of view, it becomes difficult to achieve a high-speed operation.

By contrast, according to the first embodiment, FIG. 6B shows a part of the case where shift registers (third shift register group) in a subgroup in the group of each row are connected in series. For example, the shift registers 40 in the four individual blanking systems 47 in a subgroup "A1" are connected in series by a 10-bit parallel line. Moreover, for example, the shift registers 40 in the four individual blanking systems 47 in a subgroup "A2" are connected in series by a 10-bit parallel line. The serial parallel conversion unit 28 is connected, totally by a 20-bit parallel line, to each shift register (the shift register 40 at the end and close to the serial parallel conversion unit 28, in each subgroup) in shift registers in a subgroup in the group of each row. The same is applied to other groups.

In other words, each serial parallel conversion unit 28 is connected to the shift registers (third shift register group) in each subgroup in a corresponding group by parallel lines, the number of which is equal to the number obtained by multiplying the number of bits to be data processed by the shift register 40 by the number of subgroups.

Moreover, in the case of FIG. 6B, similarly to FIG. 6A, only five of the eight individual blanking systems 47 are shown, and the others are omitted. In the case of FIG. 6B, beams passing through the eight individual blanking systems 47 each denoted by "A" in the first row are defined, for example, from the side close to the serial parallel conversion unit 28, as a beam 1, a beam 2, and so on. In the configuration shown in FIG. 6B, when eight individual blanking systems 47 are arranged at "A" in the first row, performing clock operation four times is sufficient for transmitting a blanking signal up to a beam 8 by using the shift registers 40 because two subgroups, each of which is composed of four shift registers 40 connected in series, are connected in parallel. Therefore, the number of times of clock operation can be reduced to one K-th (K being the number of subgroups). Here, the number of times of clock operation can be reduced to one half ($\frac{1}{2}$).

Therefore, the number of times of clock operation per unit time can be reduced, and a heating value can be suppressed (or reduced). Consequently, the heating value of a blanking plate can be suppressed (or reduced). Therefore, a high-speed operation can be achieved. Furthermore, even if the number of beams increases and the number of shift registers arranged in one row increases, the heating value of the blanking plate can be suppressed and the high-speed operation can be achieved by increasing the number of subgroups. For example, even when the number of beams increases, the heating value can be reduced to 1/K, without increasing the number of times of clock operation. Alternatively, K times the high-speed operation can be achieved by the same heating value.

Furthermore, according to the first embodiment, one set composed of the serial parallel conversion units 28 and the pad 29 is connected to each group. Therefore, even if the number of subgroups increases, it is possible not to increase the number of sets each composed of the serial parallel conversion unit 28 and the pad 29. Accordingly, the problem that it is difficult to arrange pads because the distance between the pads is too narrow can be avoided.

Furthermore, according to the first embodiment, as shown in FIGS. 5 and 6B, it is preferable that shift registers 40 connected in series in each subgroup are arranged at the same pitch. Thereby, the wiring lengths between shift registers connected in series in a subgroup can be substantially equal to each other. Therefore, impedance can be equal to each other, and transmission delay of a signal to a clock can be uniform. Therefore, the transmission timing of signals can be coincident with each other. Furthermore, according to the first embodiment, as shown in FIG. 5, for example, with respect to each row of a plurality of individual blanking systems 47 arranged in eight rows by eight columns (8×8), the individual blanking systems 47, also referred to as the shift registers 40, are arranged at the same pitch such that the first subgroup (A1, B1, H1) and the second subgroup (A2, B2, . . . , H2) are alternate with each other. Therefore, with respect to all the shift registers arranged in two dimensions on the blanking plate 204, the wiring lengths each between the shift registers connected in series can be substantially equal to each other. Accordingly, in transmission of each shot data of multiple beams, signal transmission delay can be uniform, and thus, transmission rate can be improved and transmission error can be reduced.

Furthermore, according to the first embodiment, it is preferable that each subgroup in a plurality of subgroups in each group is composed of shift registers (third shift register group) whose number is equal to that of shift registers in another subgroup as shown in FIG. 5. If the number of shift registers differs between subgroups, when performing each shot, operation speed is rate-determined by the number of times of clock operation of a subgroup which has more shift registers. Therefore, as described in the first embodiment, the number of times of clock operation can be reduced by equalizing the number of shift registers between subgroups.

Figure 7A:
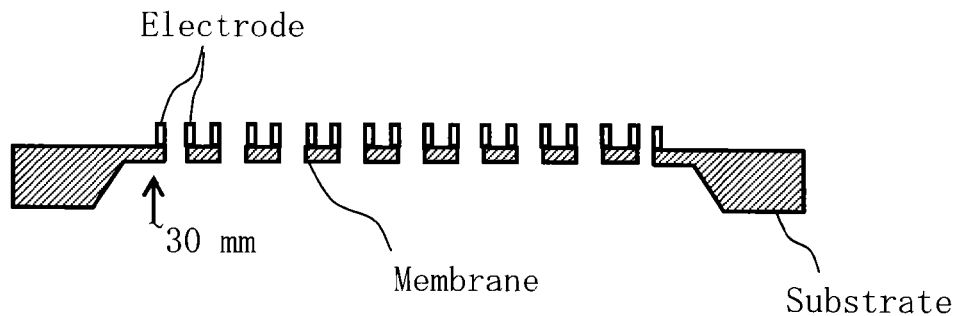
FIGS. 7A and 7B are top views showing another example of the configuration of a blanking plate according to the first embodiment.
Figure 7B:
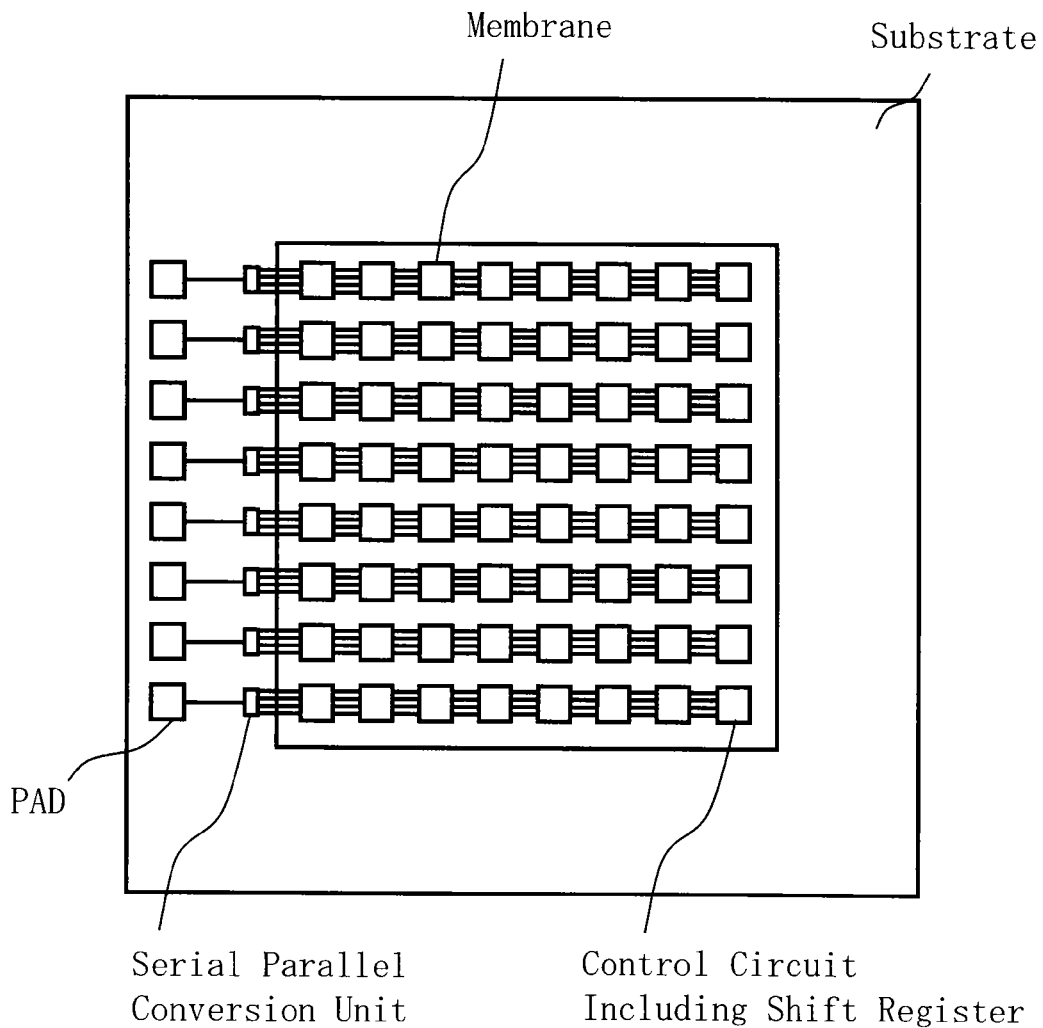

FIG. 7A is a top sectional view and 7B is a top view showing another example of the configuration of the blanking plate according to the first embodiment. In the example of FIG. 5 described above, the sets each composed of the serial parallel conversion unit 28 and the pad 29 are arranged along the two sides, the left side and the right side, of the four sides of the membrane region 30, but, it is not limited thereto. As shown in FIGS. 7A and 7B, it is also preferable that the sets each composed of the serial parallel conversion unit 28 and the pad 29 are arranged along one side, the left side for example, of the four sides of the membrane region 30. What is necessary is just to select whether to arrange the sets each composed of the serial parallel conversion unit 28 and the pad 29 along one side, or two sides, right and left, according to the size and the number of rows of the membrane region 30.

Figure 8:
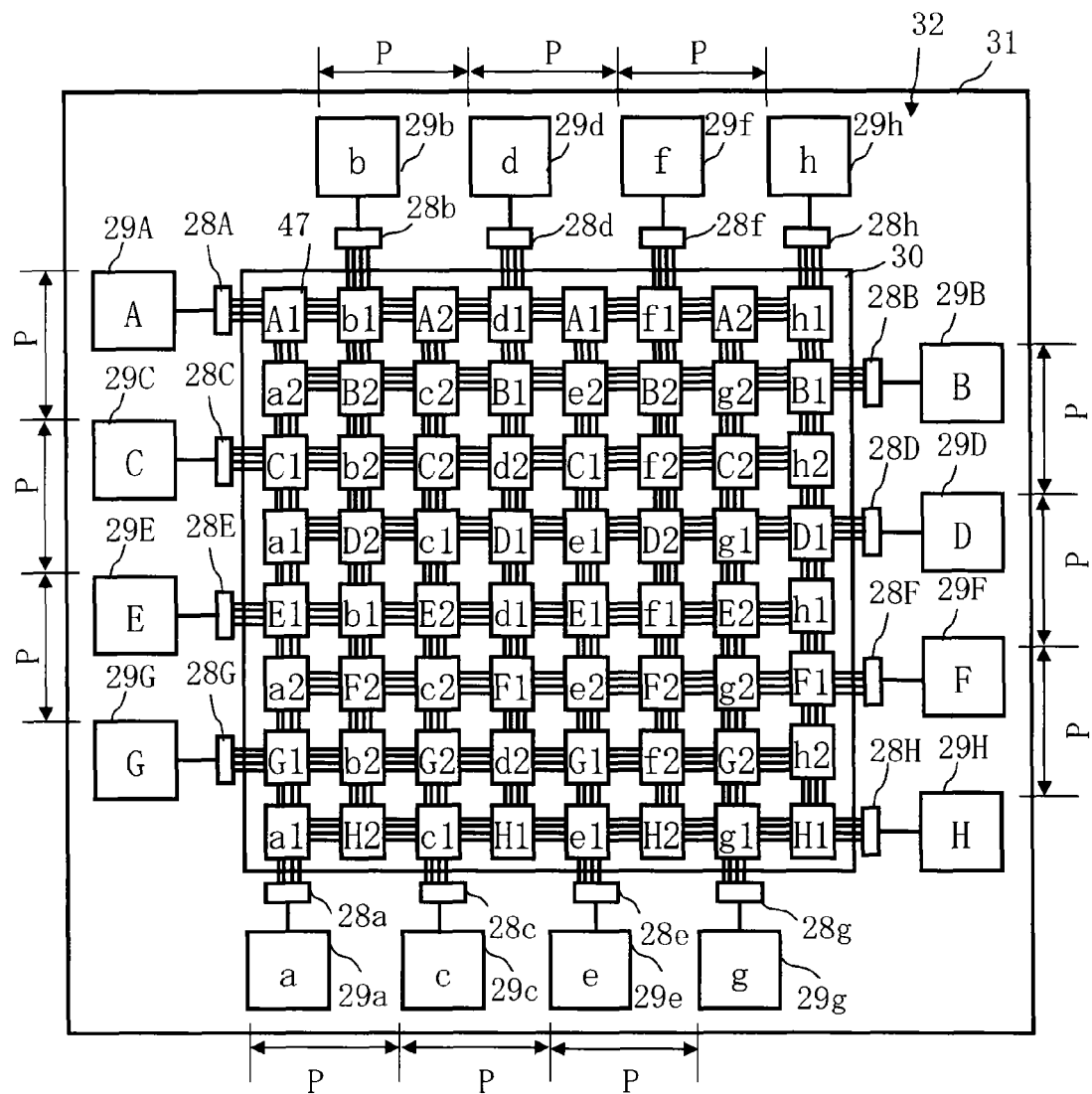
FIG. 8 is a top view showing another example of the configuration of a blanking plate according to the first embodiment.

FIG. 8 is a top view showing another example of the configuration of a blanking plate according to the first embodiment. In the example of FIG. 8, with respect to a plurality of individual blanking systems 47 arranged in each row (lateral direction), one group is composed of shift registers in a plurality of individual blanking systems 47 arranged at intervals of k individual blanking systems 47, for example, every other individual blanking system 47. For example, as shown in FIG. 8, one group is composed of shift registers in, for example, four individual blanking systems 47 each denoted by "A" in the first row from the top. Similarly, one group is composed of shift registers in, for example, four individual blanking systems 47 each denoted by "B" in the second row. Similarly, one group is composed of shift registers in, for example, four individual blanking systems 47 each denoted by "C" in the third row. Similarly, one group is composed of shift registers in, for example, four individual blanking systems 47 each denoted by "D" in the fourth row. Similarly, one group is composed of shift registers in, for example, four individual blanking systems 47 each denoted by "E" in the fifth row. Similarly, one group is composed of shift registers in, for example, four individual blanking systems 47 each denoted by "F" in the sixth row. Similarly, one group is composed of shift registers in, for example, four individual blanking systems 47 each denoted by "G" in the seventh row. Similarly, one group is composed of shift registers in, for example, four individual blanking systems 47 each denoted by "H" in the eighth row.

Moreover, in the example of FIG. 8, in each row, one group is composed of, for example, four individual blanking systems 47 arranged in positions sifted by one column to each other with respect to groups adjacent in the column direction. For example, as shown in FIG. 8, with respect to the groups of four individual blanking systems 47 in the first, third, fifth and seventh rows, each of them is composed of the individual blanking systems 47, for example, in the first, third, fifth, and seventh columns. With respect to the groups of four individual blanking systems 47 in the second, fourth, sixth and eighth rows, each of them is composed of the individual blanking systems 47, for example, in the second, fourth, sixth, and eighth columns.

Moreover, in the example of FIG. 8, with respect to a plurality of individual blanking systems 47 arranged in each column (vertical direction), one group is composed of shift registers in a plurality of individual blanking systems 47 arranged at intervals of k' individual blanking systems 47, for example, every other individual blanking system 47. For example, as shown in FIG. 8, one group is composed of shift registers in, for example, four individual blanking systems 47 each denoted by "a" in the first column from the left. Similarly, one group is composed of shift registers in, for example, four individual blanking systems 47 each denoted by "b" in the second column. Similarly, one group is composed of shift registers in, for example, four individual blanking systems 47 each denoted by "c" in the third column. Similarly, one group is composed of shift registers in, for example, four individual blanking systems 47 each denoted by "d" in the fourth column. Similarly, one group is composed of shift registers in, for example, four individual blanking systems 47 each denoted by "e" in the fifth column. Similarly, one group is composed of shift registers in, for example, four individual blanking systems 47 each denoted by "f" in the sixth column. Similarly, one group is composed of shift registers in, for example, four individual blanking systems 47 each denoted by "g" in the seventh column. Similarly, one group is composed of shift registers in, for example, four individual blanking systems 47 each denoted by "h" in the eighth column.

Moreover, in the example of FIG. 8, in each column, one group is composed of, for example, four individual blanking systems 47 arranged in positions sifted by one row to each other with respect to groups adjacent in the row direction. For example, as shown in FIG. 8, with respect to the groups of four individual blanking systems 47 in the first, third, fifth and seventh columns, each of them is composed of the individual blanking systems 47, in the second, fourth, sixth, and eighth rows. With respect to the groups of four individual blanking systems 47 in the second, fourth, sixth and eighth columns, each of them is composed of the individual blanking systems 47, in the first, third, fifth, and seventh rows.

With the configuration described above, the individual blanking systems 47 (internal shift registers) are combined such that they are not overlappingly used (not overlapped with each other) between the groups (eight groups in the example of FIG. 8) in rows and the groups (eight groups in the example of FIG. 8) in columns.

Then, for each group of shift registers, one serial parallel conversion unit 28 (an example of a data transmitter) is arranged. One pad 29 is arranged for each serial parallel conversion unit 28.

A plurality of serial parallel conversion units 28 in FIG. 8 are arranged along the four sides of the membrane region 30 (quadrangular region) surrounding the whole of a plurality of shift registers.

To each of a plurality of serial parallel conversion units 28, the pad 29 is connected by a single wiring. In other words, each of a plurality of pads 29 is respectively in combination with one of a plurality of serial parallel conversion units 28, and each combination of a pad and a serial parallel conversion unit is connected by single wiring. A plurality of pads 29 are arranged along the four sides of the membrane region 30.

In the example of FIG. 8, along the left side of the four sides of the membrane region 30, there are arranged a set "A" composed of a serial parallel conversion unit 28A and a pad 29A, a set "C" composed of a serial parallel conversion unit 28C and a pad 29C, a set "E" composed of a serial parallel conversion unit 28E and a pad 29E, and a set "G" composed of a serial parallel conversion unit 28G and a pad 29G. Along the right side of the four sides of the membrane region 30, there are arranged a set "B" composed of a serial parallel conversion unit 28B and a pad 29B, a set "D" composed of a serial parallel conversion unit 28D and a pad 29D, a set "F" composed of a serial parallel conversion unit 28F and a pad 29F, and a set "H" composed of a serial parallel conversion unit 28H and a pad 29H.

Along the upper side of the four sides of the membrane region 30, there are arranged a set "b" composed of a serial parallel conversion unit 28b and a pad 29b, a set "d" composed of a serial parallel conversion unit 28d and a pad 29d, a set "f" composed of a serial parallel conversion unit 28f and a pad 29f, and a set "h" composed of a serial parallel conversion unit 28h and a pad 29h. Along the lower side of the four sides of the membrane region 30, there are arranged a set "a" composed of a serial parallel conversion unit 28a and a pad 29a, a set "c" composed of a serial parallel conversion unit 28c and a pad 29c, a set "e" composed of a serial parallel conversion unit 28e and a pad 29e, and a set "g" composed of a serial parallel conversion unit 28g and a pad 29g.

The shift registers (first shift register group or second shift register group) of each group are further divided into a plurality of subgroups. In the example of FIG. 8, shift registers in a group of each row (that is, a row group), are further divided into a plurality of subgroups, and shift registers in a group of each column (that is, a column group), are further divided into a plurality of subgroups.

For example, as shown in FIG. 8, with respect to the shift registers in the four individual blanking systems 47 each denoted by "A" in the first row from the top, one subgroup is composed of shift registers (third shift register group) in the two individual blanking systems 47 each denoted by "A1". Moreover, for example, another subgroup is composed of shift registers (third shift register group) in the two individual blanking systems 47 each denoted by "A2".

Similarly, for example, as shown in FIG. 8, with respect to the shift registers in the four individual blanking systems 47 each denoted by "B" in the second row from the top, one subgroup is composed of shift registers (third shift register group) in the two individual blanking systems 47 each denoted by "B1". Moreover, for example, another subgroup is composed of shift registers (third shift register group) in the two individual blanking systems 47 each denoted by "B2".

Similarly, for example, as shown in FIG. 8, with respect to the shift registers in the four individual blanking systems 47 each denoted by "C" in the third row from the top, one subgroup is composed of shift registers (third shift register group) in the two individual blanking systems 47 each denoted by "C1". Moreover, for example, another subgroup is composed of shift registers (third shift register group) in the two individual blanking systems 47 each denoted by "C2".

Similarly, for example, as shown in FIG. 8, with respect to the shift registers in the four individual blanking systems 47 each denoted by "D" in the fourth row from the top, one subgroup is composed of shift registers (third shift register group) in the two individual blanking systems 47 each denoted by "D1". Moreover, for example, another subgroup is composed of shift registers (third shift register group) in the two individual blanking systems 47 each denoted by "D2".

Similarly, for example, as shown in FIG. 8, with respect to the shift registers in the four individual blanking systems 47 each denoted by "E" in the fifth row from the top, one subgroup is composed of shift registers (third shift register group) in the two individual blanking systems 47 each denoted by "E1". Moreover, for example, another subgroup is composed of shift registers (third shift register group) in the two individual blanking systems 47 each denoted by "E2".

Similarly, for example, as shown in FIG. 8, with respect to the shift registers in the four individual blanking systems 47 each denoted by "F" in the sixth row from the top, one subgroup is composed of shift registers (third shift register group) in the two individual blanking systems 47 each denoted by "F1". Moreover, for example, another subgroup is composed of shift registers (third shift register group) in the two individual blanking systems 47 each denoted by "F2".

Similarly, for example, as shown in FIG. 8, with respect to the shift registers in the four individual blanking systems 47 each denoted by "G" in the seventh row from the top, one subgroup is composed of shift registers (third shift register group) in the two individual blanking systems 47 each denoted by "G1". Moreover, for example, another subgroup is composed of shift registers (third shift register group) in the two individual blanking systems 47 each denoted by "G2".

Similarly, for example, as shown in FIG. 8, with respect to the shift registers in the four individual blanking systems 47 each denoted by "H" in the eighth row from the top, one subgroup is composed of shift registers (third shift register group) in the two individual blanking systems 47 each denoted by "H1". Moreover, for example, another subgroup is composed of shift registers (third shift register group) in the two individual blanking systems 47 each denoted by "H2".

Similarly, for example, as shown in FIG. 8, with respect to the shift registers in the four individual blanking systems 47 each denoted by "a" in the first column from the left, one subgroup is composed of shift registers (third shift register group) in the two individual blanking systems 47 each denoted by "a1". Moreover, for example, another subgroup is composed of shift registers (third shift register group) in the two individual blanking systems 47 each denoted by "a2".

Similarly, for example, as shown in FIG. 8, with respect to the shift registers in the four individual blanking systems 47 each denoted by "b" in the second column from the left, one subgroup is composed of shift registers (third shift register group) in the two individual blanking systems 47 each denoted by "b1". Moreover, for example, another subgroup is composed of shift registers (third shift register group) in the two individual blanking systems 47 each denoted by "b2".

Similarly, for example, as shown in FIG. 8, with respect to the shift registers in the four individual blanking systems 47 each denoted by "c" in the third column from the left, one subgroup is composed of shift registers (third shift register group) in the two individual blanking systems 47 each denoted by "c1". Moreover, for example, another subgroup is composed of shift registers (third shift register group) in the two individual blanking systems 47 each denoted by "c2".

Similarly, for example, as shown in FIG. 8, with respect to the shift registers in the four individual blanking systems 47 each denoted by "d" in the fourth column from the left, one subgroup is composed of shift registers (third shift register group) in the two individual blanking systems 47 each denoted by "d1". Moreover, for example, another subgroup is composed of shift registers (third shift register group) in the two individual blanking systems 47 each denoted by "d2".

Similarly, for example, as shown in FIG. 8, with respect to the shift registers in the four individual blanking systems 47 each denoted by "e" in the fifth column from the left, one subgroup is composed of shift registers (third shift register group) in the two individual blanking systems 47 each denoted by "e1". Moreover, for example, another subgroup is composed of shift registers (third shift register group) in the two individual blanking systems 47 each denoted by "e2".

Similarly, for example, as shown in FIG. 8, with respect to the shift registers in the four individual blanking systems 47 each denoted by "f" in the sixth column from the left, one subgroup is composed of shift registers (third shift register group) in the two individual blanking systems 47 each denoted by "f1". Moreover, for example, another subgroup is composed of shift registers (third shift register group) in the two individual blanking systems 47 each denoted by "f2".

Similarly, for example, as shown in FIG. 8, with respect to the shift registers in the four individual blanking systems 47 each denoted by "g" in the seventh column from the left, one subgroup is composed of shift registers (third shift register group) in the two individual blanking systems 47 each denoted by "g1". Moreover, for example, another subgroup is composed of shift registers (third shift register group) in the two individual blanking systems 47 each denoted by "g2".

Similarly, for example, as shown in FIG. 8, with respect to the shift registers in the four individual blanking systems 47 each denoted by "h" in the eighth column from the left, one subgroup is composed of shift registers (third shift register group) in the two individual blanking systems 47 each denoted by "h1". Moreover, for example, another subgroup is composed of shift registers (third shift register group) in the two individual blanking systems 47 each denoted by "h2".

With respect to the group "A", for example, the shift registers 40 of a subgroup "A1" composed of the two individual blanking systems 47 each denoted by "A1" are connected in series by a 10-bit parallel line. Simultaneously, for example, the shift registers 40 of a subgroup "A2" composed of the two individual blanking systems 47 each denoted by "A2" are connected in series by a 10-bit parallel line. The serial parallel conversion unit 28A is connected, totally by a 20-bit parallel line, to one of shift registers in each subgroup, (that is, connected to the shift register 40 at the end and close to the serial parallel conversion unit 28A), in the group "A". The same is applied to other groups.

For the sake of simplification, the serial parallel conversion unit 28 and the shift register are connected with each other by a 4-bit parallel line in the case of FIG. 8, but, they are connected by a line whose number of bits is the same as that shown in FIGS. 6A and 6B to be described later, for example, by a 20-bit parallel line.

In the configuration shown in FIG. 8, for example, eight individual blanking systems 47 in the first row are divided into the group "A" and the column groups of "b", "d", "f", and "h". In other words, for example, the eight shift registers (first shift register group) in the first row includes all the shift registers (second shift register groups) in the group "A" (one group) and one of the shift registers (second shift register group) of each of the groups "b", "d", "f", and "h". Therefore, the group "A" is composed of four individual blanking systems 47. Also from this point of view, the number of shift registers can be one half (½) compared with the case where one group is composed of eight individual blanking systems 47 in the first row, for example. Further, for transmitting a blanking signal up to a beam 4 by using the four shift registers 40, since two subgroups, each of which is composed of two shift registers 40 connected in series, are connected in parallel, it is sufficient to perform clock operation twice. Therefore, the number of times of clock operation can be reduced to one K-th (K being the number of subgroups). In this case, the number of times of clock operation can be reduced to one half (½). Therefore, compared with the case where one group is composed of eight individual blanking systems 47 in the first row, the number of times of clock operation can be reduced to one 2K-th (½K).

Therefore, the number of times of clock operation per unit time can be further reduced than the case of FIG. 5, and a heating value can be suppressed (or reduced). Consequently, the heating value of a blanking plate can be suppressed (or reduced). Therefore, a high-speed operation can be achieved.

Further, in the case of FIG. 8, since the four sides of the membrane region 30 (quadrangular region) are used for arrangement, it is possible to increase the arrangement region compared with the case of utilizing only one side or two sides. Therefore, even when the number of beams of multiple beams increases, the problem that it is difficult to arrange pads because the distance between the pads is too narrow can be avoided.

Furthermore, as shown in FIG. 8, it is preferable that each subgroup in a plurality of subgroups in each group is composed of shift registers (third shift register group) whose number is equal to that of shift registers in another subgroup. If the number of shift registers differs between subgroups, when performing each shot, operation speed is rate-determined by the number of times of clock operation of a subgroup which has more shift registers. Therefore, as has been described in the first embodiment, the number of times of clock operation can be reduced by equalizing the number of shift registers between subgroups.

Figure 9:
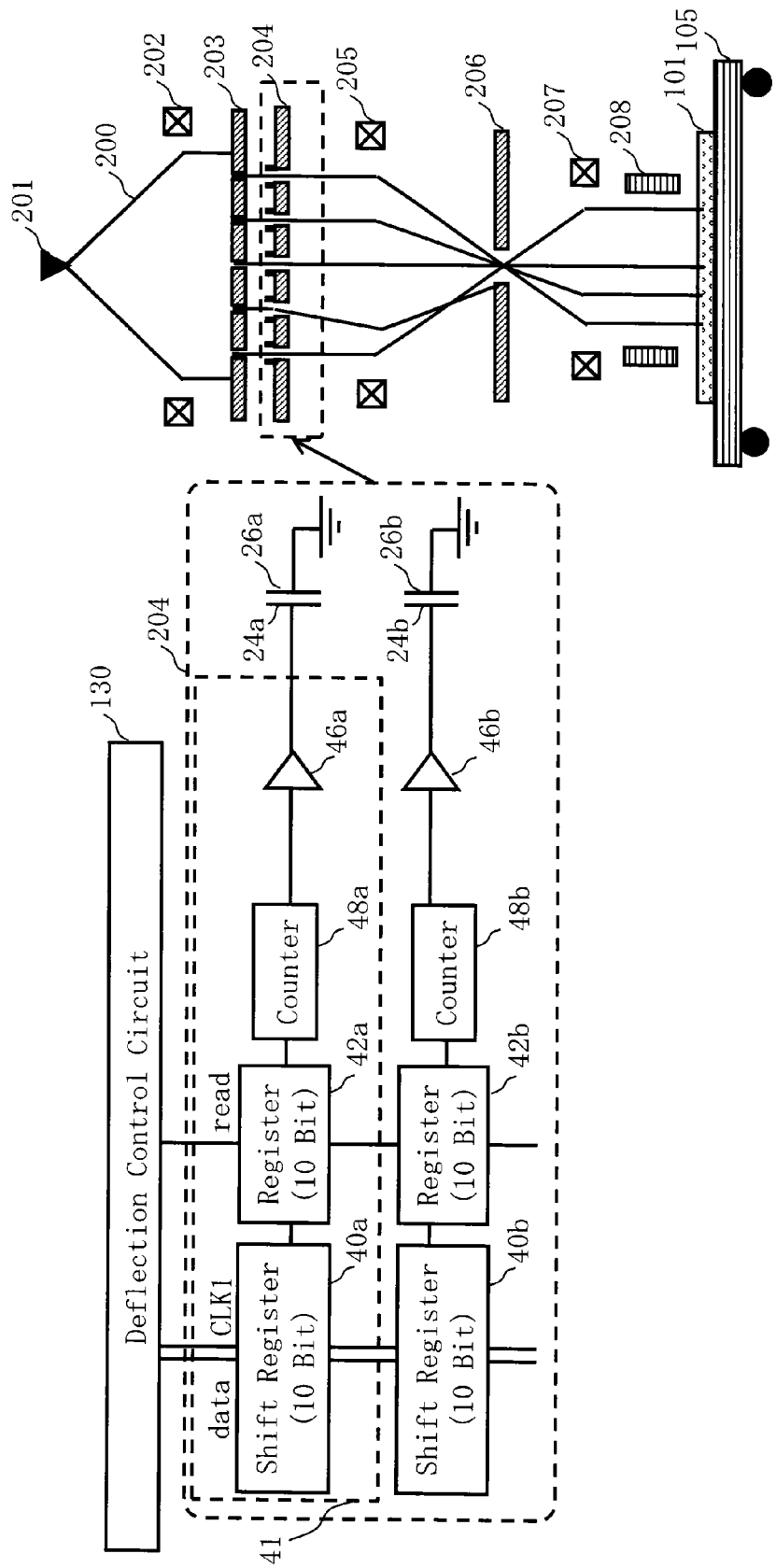
FIG. 9 is a schematic diagram showing the internal configuration of an individual blanking control circuit according to the first embodiment.

FIG. 9 is a schematic diagram showing the internal configuration of an individual blanking control circuit according to the first embodiment. In FIG. 9, in each control circuit 41 for individual blanking control arranged at the blanking plate

204 inside the body of the writing apparatus 100, there are arranged the shift register 40, a register 42, a counter 48, and an amplifier 46. According to the first embodiment, individual blanking control for each beam is controlled by a 10-bit control signal, for example. As shown in FIG. 9, when mounting the blanking plate 204 shown in FIG. 3 in the writing apparatus 100, it is preferable to arrange the surface, where the control circuit 41 and the electrodes 24 and 26 are formed, to be upward. In the case of FIG. 9, for example, the register 42, the counter 48, and the amplifier 46 are equivalent to the main circuit 43 shown in FIG. 4B.

Figure 10:
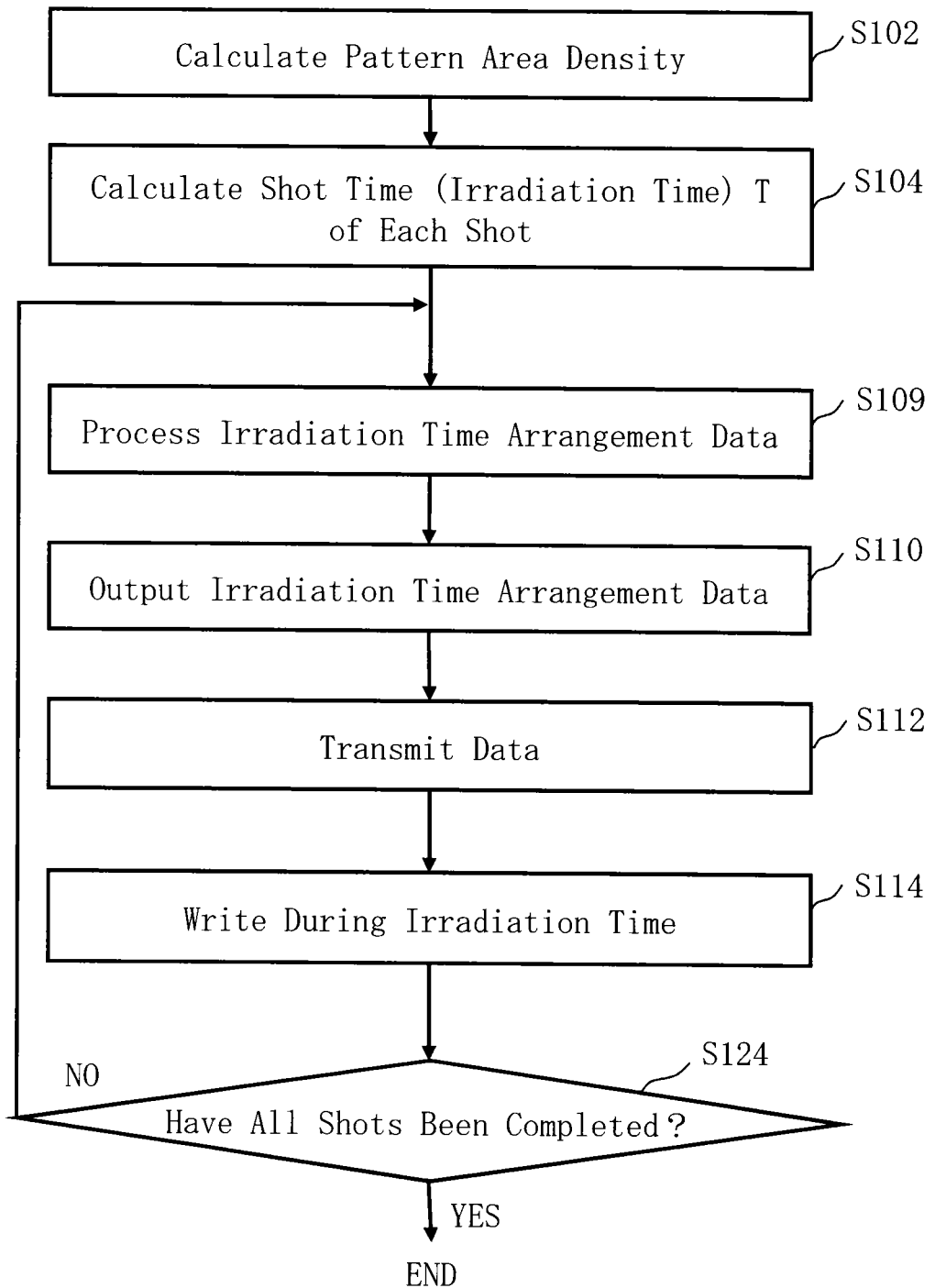
FIG. 10 is a flowchart showing main steps of a writing method according to the first embodiment.

FIG. 10 is a flowchart showing main steps of a writing method according to the first embodiment. In FIG. 10, the writing method of the first embodiment executes a series of steps: a pattern area density calculation step (S102), a shot time (irradiation time) T calculation step (S104), an irradiation time arrangement data processing step (S109), an irradiation time arrangement data output step (S110), a data transmission step (S112), a writing step (S114), and a determination step (S124).

In the pattern area density calculation step (S102), the area density calculation unit 60 reads writing data from the storage device 140, and calculates the area density of a pattern arranged in the writing region of the target object 101 or in each mesh region of a plurality of mesh regions obtained by virtually dividing a chip region to be written into meshes. For example, the writing region of the target object 101 or a chip region to be written is divided into strip-shaped stripe regions each having a predetermined width. Then, each stripe region is virtually divided into a plurality of mesh regions described above. It is preferable that the size of a mesh region is, for example, a beam size, or smaller than a beam size. For example, the size of a mesh region is preferably about 10 nm. The area density calculation unit 60 reads, for each stripe region, corresponding writing data from the storage device 140, and assigns a plurality of figure patterns defined in the writing data to a mesh region, for example. Then, the area density of a figure pattern arranged in each mesh region is calculated.

In the shot time (irradiation time) T calculation step (S104), the irradiation time calculation unit 62 calculates an irradiation time T (which hereinafter will also be called a shot time, a shot time period, or an exposure time) of an electron beam per shot, for each predetermined sized mesh region. When performing multi-pass writing, an irradiation time T of the electron beam per shot in each hierarchy of multi-pass writing should be calculated. It is preferable to obtain an irradiation time T, being a reference, to be in proportion to the area density of a calculated pattern. Moreover, it is preferable that the irradiation time T to be finally calculated is a time equivalent to a dose after correction, that is a dose having been corrected with respect to a dimension change amount by a dimension change phenomenon, such as a proximity effect, a fogging effect, a loading effect, etc. not shown. The size of a plurality of mesh regions used for defining an irradiation time T and the size of a plurality of mesh regions where a pattern area density is defined may be the same size or different sizes. When they are different sizes, each irradiation time T is calculated after interpolating an area density by linear interpolation, etc. The irradiation time T for each mesh region is defined in an irradiation time map, and the irradiation time map is stored in the storage device 142, for example.

In the irradiation time arrangement data processing step (S109), the data processing unit 65 reads data of an irradiation time for a mesh region to be irradiated with each beam, stored in the storage device 142, converts the data of the irradiation time of a corresponding beam to 10-bit data, for each group of shift registers (third shift register group) connected in series, and performs processing so that the data may be aligned according to the transmission order transmitted by a plurality of shift registers 40 in a corresponding subgroup. The arrangement processing is performed so that data may be aligned in order from the data for a shift register at the posterior side in a plurality of shift registers connected in series in a subgroup. Moreover, arrangement processing is performed such that data of subgroups are collected for each group. For example, the arrangement processing is performed such that data of each subgroup is aligned in order in each group.

In the irradiation time arrangement data output step (S110), the transmission processing unit 68 outputs, for each beam shot, irradiation time arrangement data whose order has been processed such that data of each subgroup is aligned in order in each group and processed to be in accordance with the arrangement of a plurality of shift registers connected in series in each subgroup, to the deflection control circuit 130.

In the data transmission step (S112), the deflection control circuit 130 outputs, for each shot, irradiation time arrangement data to the control circuit 41 corresponding to each group in which shift registers connected in series are arranged. The irradiation time arrangement data is serially transmitted.

According to the first embodiment, as shown in FIG. 9, in the case of data transmission, since the shift register 40 is used in the control circuit 41, the deflection control circuit 130 transmits data, in which data of each subgroup is aligned in order in each group and each 10-bit data configuring the same subgroup is aligned in accordance with the order of arrangement (or in order of identification numbers) of the shift registers 40 connected in series, to the pad 29 for each group in the blanking plate 204. Each pad 29 outputs signals (first signals), having been serially transmitted, to a corresponding serial parallel conversion unit 28. Each serial parallel conversion unit 28 converts the signal (first signal) having been serially transmitted into a 10-bit parallel signal (second signal to be transmitted in parallel) for each beam, and performs data transmission of the 10-bit parallel signal for each subgroup to a corresponding control circuit 41. Moreover, a clock signal (CLK1) for synchronization and a read signal (read) for data read-out are also output. According to a clock signal (CLK1), the shift register 40 of each beam transmits data 10 bits by 10 bits in order from the higher-order side, to a next shift register 40 sequentially.

Next, when inputting a read signal (read), the register 42 for each beam reads data of each beam from the shift register 40. When inputting 10-bit data, the individual register 42 for each beam outputs, based on the data, an ON/OFF signal to the counter 48. If the signal from the register 42 is ON, the counter 48 counts an irradiation time and outputs an ON signal to the amplifier 46 during the irradiation time. While receiving the ON signal, the amplifier 46 applies an ON voltage to the electrode 24 of the individual blanking deflector. In other cases, the counter 48 outputs an OFF signal to the amplifier 46, and the amplifier 46 applies an OFF voltage to the electrode 24 of the individual blanking deflector.

In the writing step (S114), the writing unit 150 performs writing during an irradiation time concerned, for each beam shot. Specifically, it operates as follows.

The electron beam 200 emitted from the electron gun assembly 201 (emission unit) almost perpendicularly illuminates the whole of the aperture member 203 by the illumination lens 202. A plurality of holes (openings), each being a quadrangle, are formed in the aperture member 203. The region including all the plurality of holes is irradiated with the electron beam 200. For example, a plurality of quadrangular electron beams (multiple beams) 20a to 20e are formed by letting parts of the electron beam 200 irradiating the positions of a plurality of holes pass through a corresponding hole of the plurality of holes of the aperture member 203 respectively. The multiple beams 20a to 20e respectively pass through a corresponding blanker (first deflector: individual blanking system) of the blanking plate 204. Each blanker respectively deflects (performs blanking deflection) the electron beam 20 passing individually.

The multiple beams 20a, 20b, . . . , 20e, having passed through the blanking plate 204 are reduced by the reducing lens 205, and go toward the hole at the center of the limiting aperture member 206. At this stage, the electron beam 20 which was deflected by the blanker of the blanking plate 204 deviates from the hole of the center of the limiting aperture member 206 (blanking aperture member) and is blocked by the limiting aperture member 206. On the other hand, the electron beam 20 which was not deflected by the blanker of the blanking plate 204 passes through the hole at the center of the limiting aperture member 206, as shown in FIG. 1. Blanking control is performed by ON/OFF of the individual blanking system so as to control ON/OFF of the beam. Thus, the limiting aperture member 206 blocks each beam which was deflected to be in a beam OFF condition by the individual blanking system. Then, one beam shot is formed by beams having been made during from a beam ON condition to a beam OFF condition and having passed through the limiting aperture member 206. The multi-beams 20 having passed through the limiting aperture member 206 are focused by the objective lens 207 in order to be a pattern image of a desired reduction ratio, and respective beams (the entire multi-beams 20) having passed through the limiting aperture member 206 are collectively deflected in the same direction by the deflector 208 so as to irradiate respective beam irradiation positions on the target object 101. While the XY stage 105 is continuously moving, controlling is performed by the deflector 208 so that irradiation positions of beams may follow the movement of the XY stage 105, for example. The position of the XY stage 105 is measured by using a reflected light which is obtained by irradiating a laser onto the mirror 210 on the XY stage 105 from the stage position detector 139. Ideally, multibeams 20 to irradiate at a time are aligned at pitches obtained by multiplying the arrangement pitch of a plurality of holes of the aperture member 203 by a desired reduction ratio described above. The writing apparatus 100 performs a writing operation by the raster scan method which continuously irradiates shot beams in order, and when writing a desired pattern, a required beam is controlled to be ON, according to the pattern, by blanking control.

In the determination step (S124), the writing control unit 72 determines whether all the shots have been completed. If all the shots have been completed, it ends. If all the shots have not been completed yet, it returns to the irradiation time arrangement data processing step (S109), and the steps from the irradiation time arrangement data processing step (S109) to the determination step (S124) are repeated until all the shots have been completed.

Figure 11:
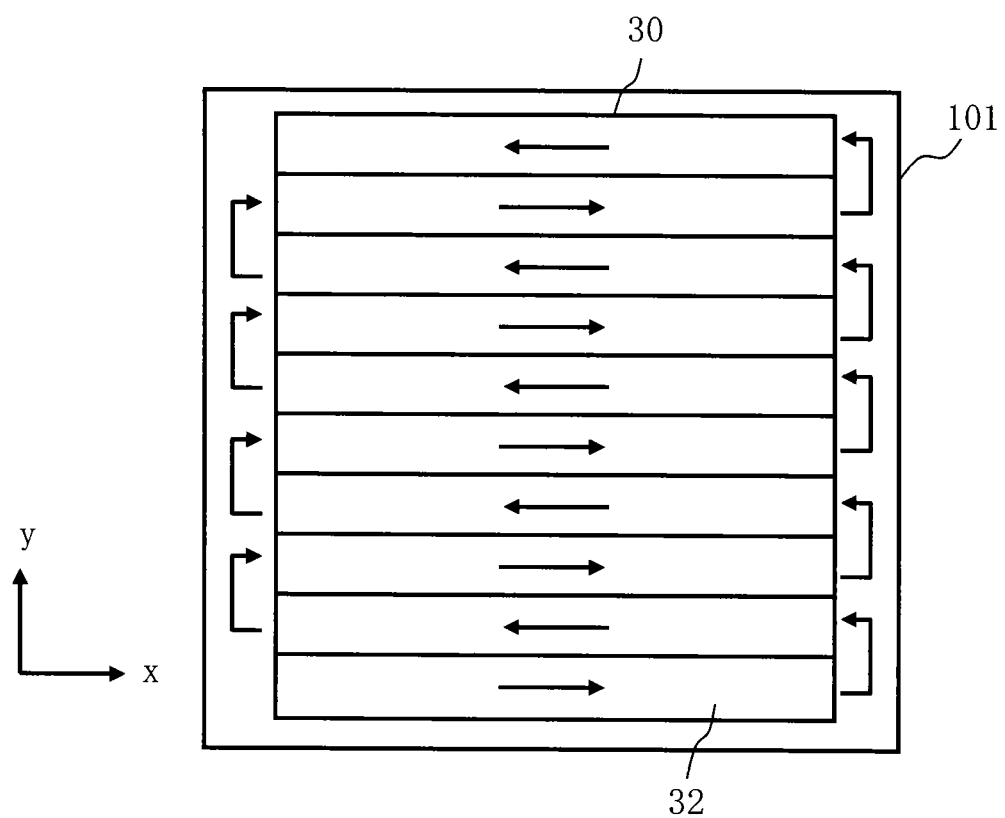
FIG. 11 is a conceptual diagram explaining a writing operation according to the first embodiment.

FIG. 11 is a conceptual diagram explaining a writing operation according to the first embodiment. As shown in FIG. 11, a writing region 30 of the target object 101 is virtually divided into a plurality of strip-shaped stripe regions 32 each having a predetermined width in the y direction, for example. Each of the stripe regions 32 serves as a writing unit region. The XY stage 105 is moved and adjusted such that an irradiation region 34 to be irradiated with one-time irradiation of the multi-beams 20 is located at the left end of the first stripe region 32 or at a position more left than the left end, and then writing is started. When writing the first stripe region 32, the writing advances relatively in the x direction by moving the XY stage 105 in the −x direction, for example. The XY stage 105 is continuously moved at a predetermined speed, for example. After writing the first stripe region 32, the stage position is moved in the −y direction and adjusted such that the irradiation region 34 is located at the right end of the second stripe region 32 or at a position more right than the right end and located to be relatively in the y direction. Then, similarly, writing advances in the −x direction by moving the XY stage 105 in the x direction, for example. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also acceptable to perform writing in the same direction when writing each stripe region 32. By one shot, a plurality of shot patterns of the same number as the holes 22 are formed at a time by multiple beams which have been formed by passing through respective corresponding holes 22 of the aperture member 203.

Figure 12A:
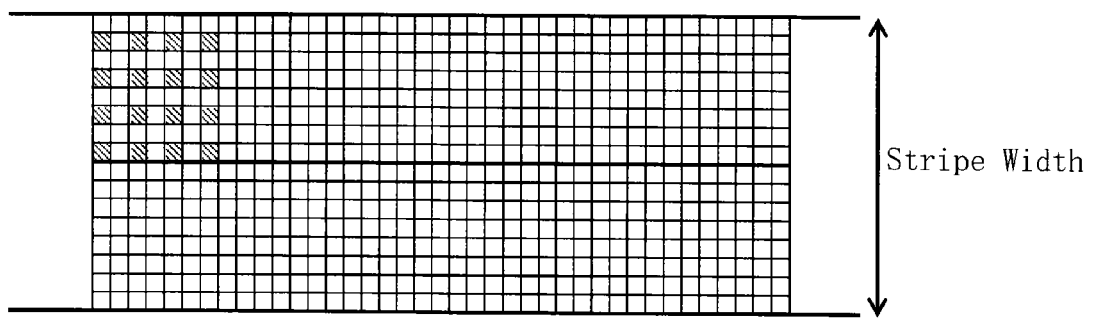
FIGS. 12A to 12C are conceptual diagrams explaining examples of a writing operation in a stripe according to the first embodiment.
Figure 12B:
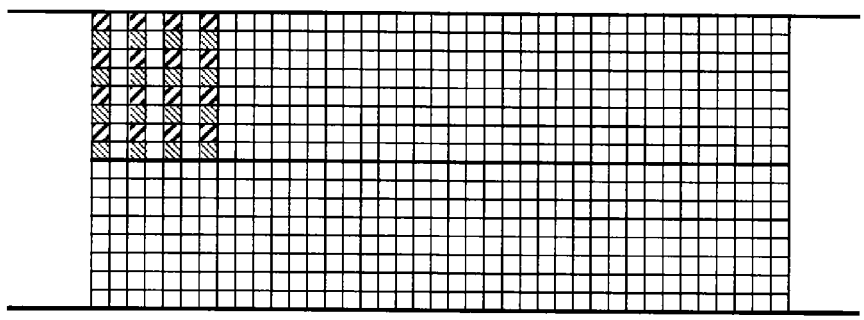
Figure 12C:
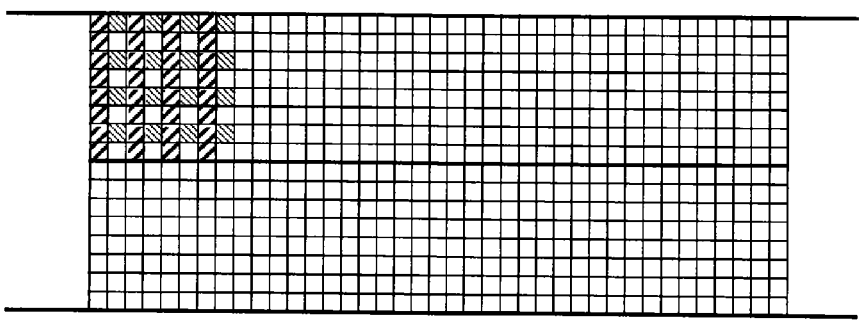

FIGS. 12A to 12C are conceptual diagrams explaining examples of a writing operation in a stripe according to the first embodiment. The examples of FIGS. 12A to 12C show the cases where writing is performed in a stripe by using multiple beams of 4×4 in the x and y directions, for example. The examples of FIGS. 12A to 12C show the cases where a stripe region is divided in the y direction by twice the width of an irradiation region of the whole multi-beam, for example. There is shown the case where exposure (writing) of one irradiation region of the whole of multiple beams is completed by four shots (one shot is a total of a plurality of irradiation steps) performed while shifting the irradiation position by one mesh in the x direction or the y direction. First, the upper region of the stripe region is to be written. FIG. 12A shows the mesh region irradiated by the first one-shot (one shot is a total of a plurality of irradiation steps). Next, as shown in FIG. 12B, the second one-shot (one shot is a total of a plurality of irradiation steps) is performed while shifting the position in the y direction to the mesh region not having been irradiated yet. Next, as shown in FIG. 12C, the third one-shot (one shot is a total of a plurality of irradiation steps) is performed while shifting the position in the x direction to the mesh region not having been irradiated yet.

Figure 13A:
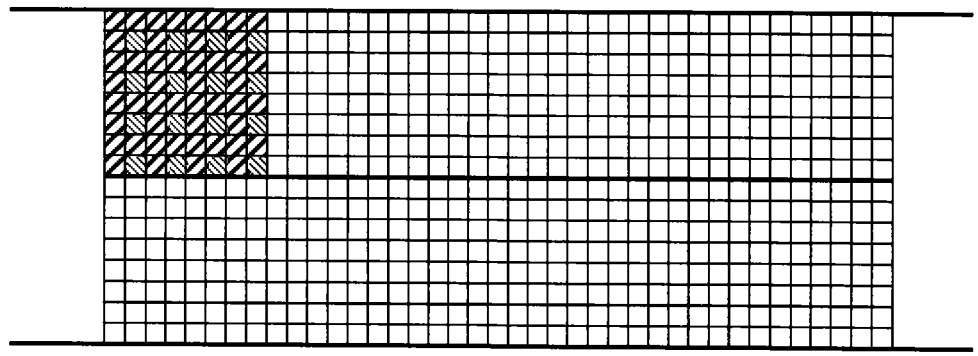
FIGS. 13A to 13C are conceptual diagrams explaining examples of a writing operation in a stripe according to the first embodiment.
Figure 13B:
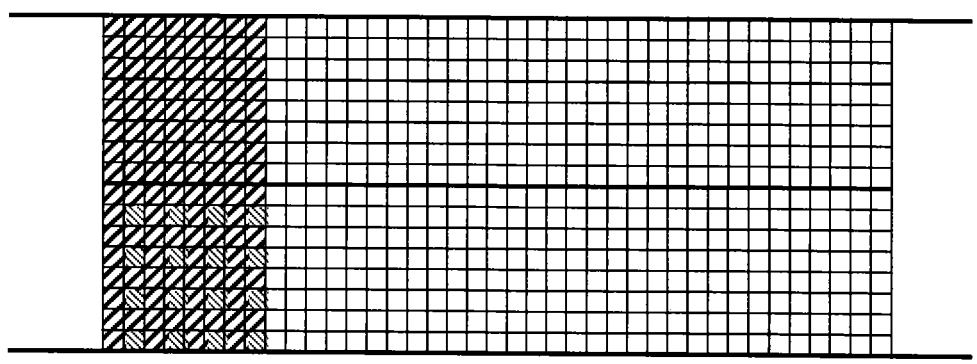
Figure 13C:
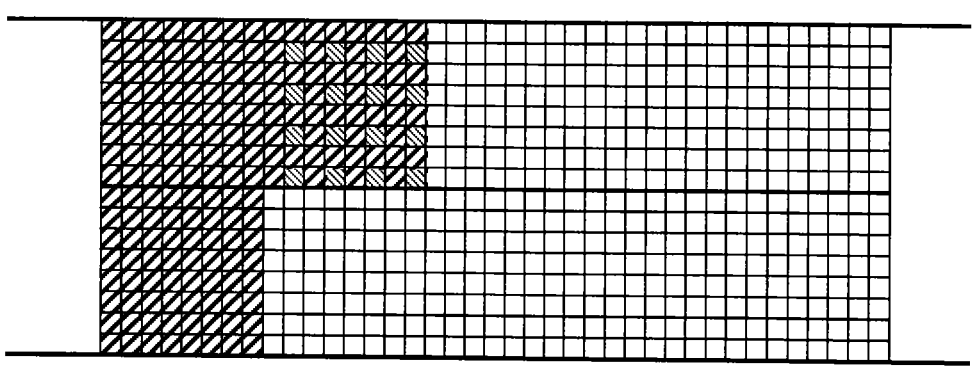

FIGS. 13A to 13C are conceptual diagrams explaining examples of a writing operation in a stripe according to the first embodiment. FIGS. 13A to 13C are continued from FIG. 12C. As shown in FIG. 13A, the fourth one-shot (one shot is a total of a plurality of irradiation steps) is performed while shifting the position in the y direction to the mesh region not having been irradiated yet. Exposure (writing) of one irradiation region of the whole of multiple beams is completed by these four shots (one shot is a total of a plurality of irradiation steps). Next, the lower region of the stripe region is to be written. As shown in FIG. 13B, the lower region of the stripe region is irradiated by the first one-shot (one shot is a total of a plurality of irradiation steps). Next, the second one-shot (one shot is a total of a plurality of irradiation steps) is performed while shifting the position in the y direction to the mesh region not having been irradiated yet. Next, the third one-shot (one shot is a total of a plurality of irradiation steps) is performed while shifting the position in the x direction to the mesh region not having been irradiated yet. The fourth one-shot (one shot is a total of a plurality of irradiation steps) is performed while shifting the position in the y direction to the mesh region not having been irradiated yet. By the operations described above, writing of the first column of the irradiation region of multiple beams in the stripe region is completed. Then, as shown in FIG. 13C, writing is to be similarly performed for the second column of the multiple beam irradiation region while shifting the position in the x direction. The whole stripe region can be written by repeating the operations described above.

Figure 14A:
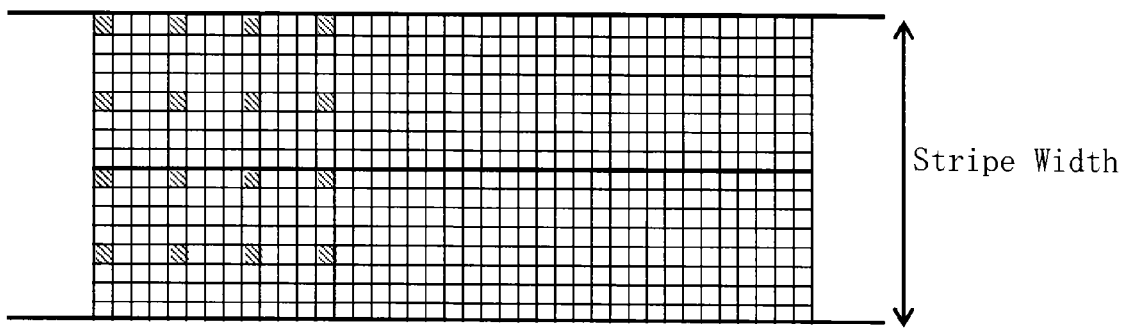
FIGS. 14A to 14C are conceptual diagrams explaining other examples of a writing operation in a stripe according to the first embodiment.
Figure 14B:
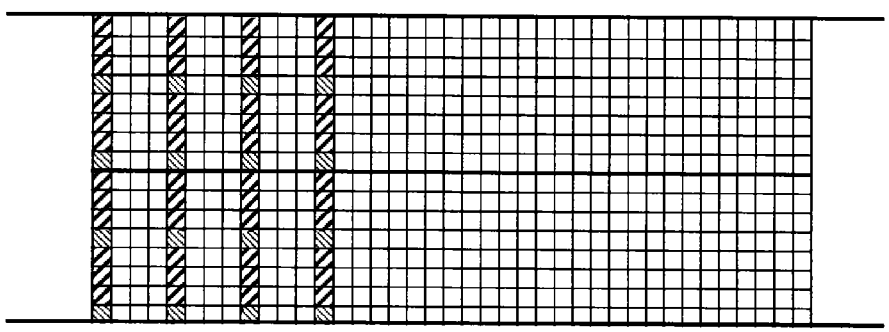
Figure 14C:
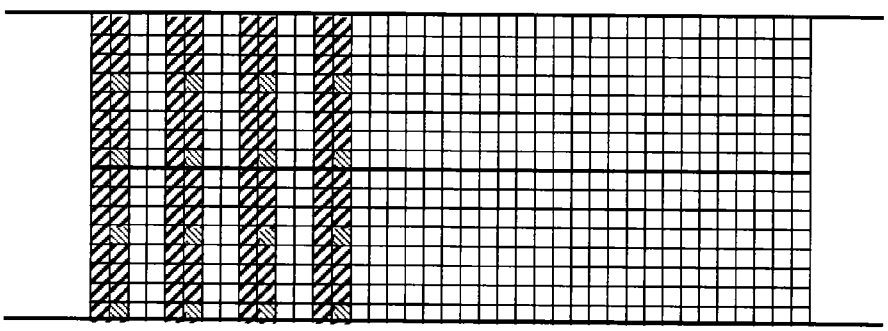

FIGS. 14A to 14C are conceptual diagrams explaining other examples of a writing operation in a stripe according to the first embodiment. FIGS. 14A to 14C show examples in which writing in a stripe is performed using 4×4 multiple beams in the x and y directions. The examples of FIG. 14A to FIG. 14C show the case where there is a distance between beams and a stripe region is divided in the y direction by a width somewhat greater than or equal to the irradiation region of the whole of multiple beams, for example. Exposure (writing) of one irradiation region by the whole of multiple beams is completed by sixteen shots (one shot is a total of a plurality of irradiation steps) performed while shifting the irradiation position by one mesh in the x direction or the y direction. FIG. 14A shows the mesh region irradiated by the first one-shot (one shot is a total of a plurality of irradiation steps). Next, as shown in FIG. 14B, the second one-shot, the third one-shot, and the fourth one-shot (one shot is a total of a plurality of irradiation steps) are performed while shifting the position by one mesh, one by one, in the y direction to the mesh region not having been irradiated yet. Next, as shown in FIG. 14C, the fifth one-shot (one shot is a total of a plurality of irradiation steps) is performed while shifting the position by one mesh in the x direction to the mesh region not having been irradiated yet. Next, the sixth one-shot, the seventh one-shot, and the eighth one-shot (one shot is a total of a plurality of irradiation steps) are performed while shifting the position by one mesh, one by one, in the y direction to the mesh region not having been irradiated yet.

Figure 15A:
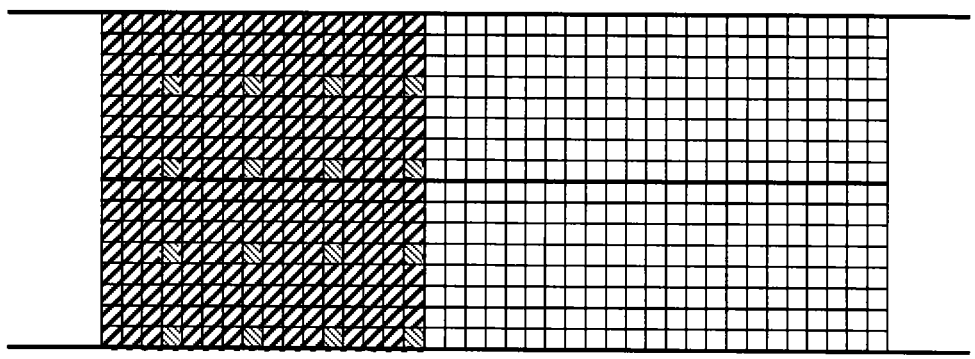
FIGS. 15A to 15C are conceptual diagrams explaining other examples of a writing operation in a stripe according to the first embodiment.
Figure 15B:
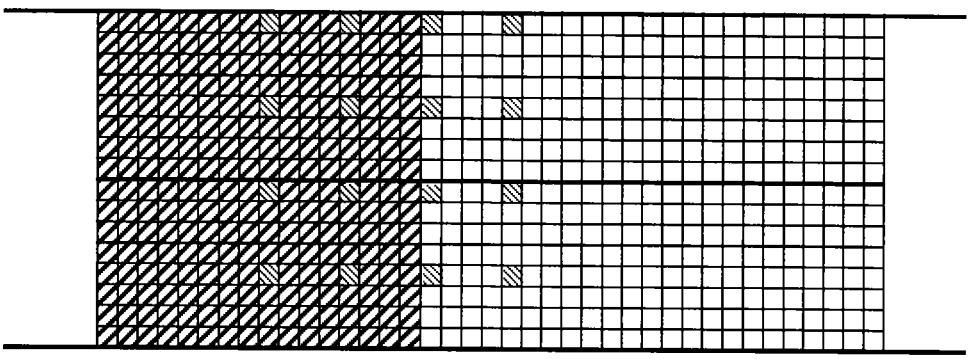
Figure 15C:
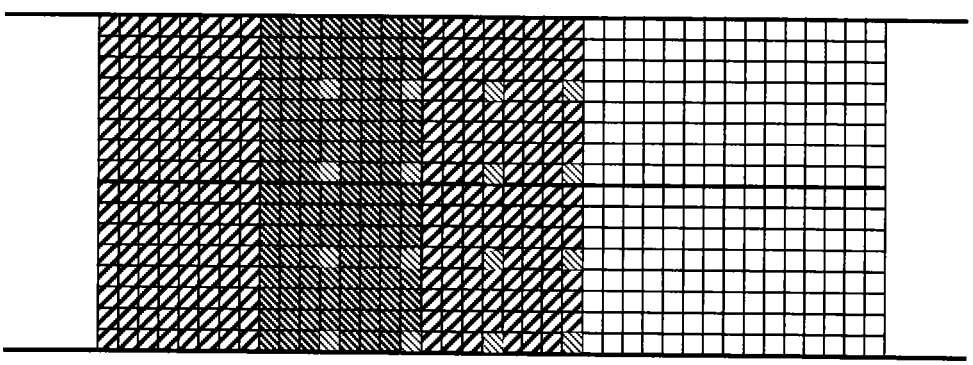

FIGS. 15A to 15C are conceptual diagrams explaining other examples of a writing operation in a stripe according to the first embodiment. FIGS. 15A to 15C are continued from FIG. 14C. As shown in FIG. 15A, the ninth one-shot to the sixteenth one-shot (one shot is a total of a plurality of irradiation steps) are repeatedly performed in order, similarly to the operations of FIGS. 13A to 13C. The examples of FIGS. 14A to 14C and FIGS. 15A to 15C show the case of performing multi-pass writing (multiplicity=2), for example. In such a case, the irradiation position is shifted in the x direction by about half the size of the irradiation region of the whole of multiple beams, and as shown in FIG. 15B, the first one-shot (one shot is a total of a plurality of irradiation steps) of the second layer of the multi-pass writing is performed. As described referring to FIGS. 14B and 14C, the second one-shot to the eighth one-shot (one shot is a total of a plurality of irradiation steps) of the second layer of the multi-pass writing are performed one by one, hereinafter. As shown in FIG. 15C, the ninth one-shot to the sixteenth one-shot (one shot is a total of a plurality of irradiation steps) are to be repeatedly performed in order similarly to the operations of FIGS. 14B to 14C.

As described above, according to the first embodiment, the number of times of clock operation of shift registers connected in series can be reduced, and a high-speed operation can be performed.

Second Embodiment

There has been described in the first embodiment the case where the control circuit 41 for individual blanking is controlled by a 10-bit control signal, but, it is not limited thereto. The second embodiment will describe the case where controlling is performed by a 1-bit control signal, for example.

Figure 16:
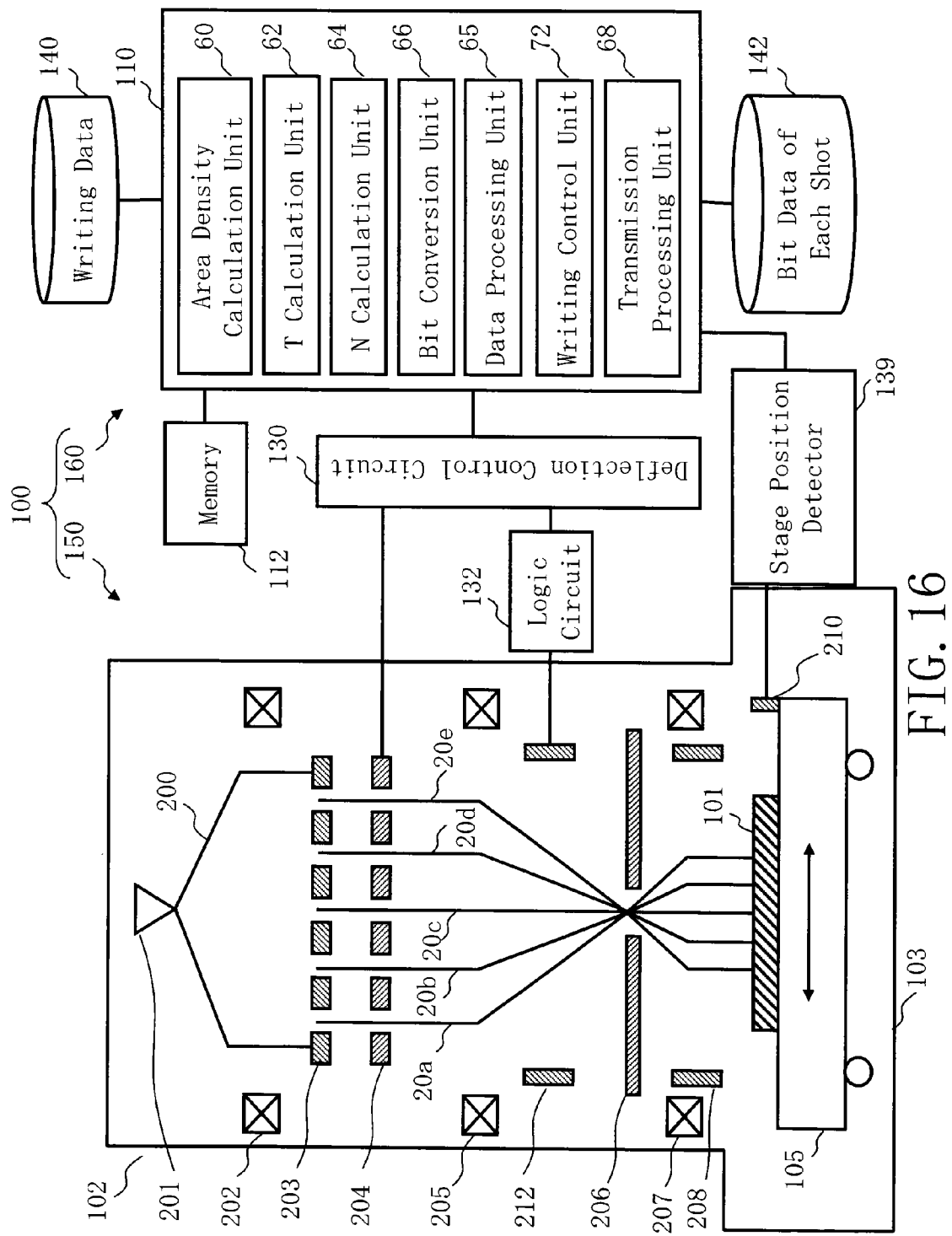
FIG. 16 is a schematic diagram showing the configuration of a writing apparatus according to a second embodiment.

FIG. 16 is a schematic diagram showing the configuration of a writing apparatus according to the second embodiment. In FIG. 16, the writing apparatus 100 includes the writing unit 150 and the control unit 160. The writing apparatus 100 is an example of a multi charged particle beam writing apparatus. The writing unit 150 includes the electron optical column 102 and the writing chamber 103. In the electron optical column 102, there are arranged the electron gun assembly 201, the illumination lens 202, the aperture member 203, the blanking plate 204, the reducing lens 205, a deflector 212, the limiting aperture member 206, the objective lens 207, and the deflector 208. In the writing chamber 103, there is arranged the XY stage 105. On the XY stage 105, there is placed the target object or "sample" 101 such as a mask serving as a writing target substrate when performing writing. The target object 101 is, for example, an exposure mask used for manufacturing semiconductor devices, or is a semiconductor substrate (silicon wafer) on which semiconductor elements are formed. The target object 101 may be, for example, a mask blank on which resist is applied and a pattern has not yet been formed. On the XY stage 105, further, there is arranged the mirror 210 for measuring the position of the XY stage.

The control unit 160 includes the control computer 110, the memory 112, the deflection control circuit 130, a logic circuit 132, the stage position detector 139, and storage devices 140 and 142, such as magnetic disk drives. The control computer 110, the memory 112, the deflection control circuit 130, the stage position detector 139, and the storage devices 140 and 142 are mutually connected through a bus (not shown). Writing data is input into the storage device 140 (storage unit) from the outside to be stored therein.

In the control computer 110, there are arranged the area density calculation unit 60, the irradiation time calculation unit 62, a gray level calculation unit 64, a bit conversion unit 66, the data processing unit 65, the writing control unit 72, and the transmission processing unit 68. Functions such as the area density calculation unit 60, the irradiation time calculation unit 62, the gray level calculation unit 64, the bit conversion unit 66, the data processing unit 65, the writing control unit 72, and the transmission processing unit 68 may be configured by hardware such as an electric circuit, or by software such as a program causing a computer to implement these functions. Alternatively, they may be configured by a combination of hardware and software. Data which is input and output to/from the area density calculation unit 60, the irradiation time calculation unit 62, the gray level calculation unit 64, the bit conversion unit 66, the data processing unit 65, the writing control unit 72, or the transmission processing unit 68 and data being calculated are stored in the memory 112 each time.

FIG. 16 shows a configuration necessary for explaining the second embodiment. Other configuration elements generally necessary for the writing apparatus 100 may also be included. The contents of the second embodiment are the same as those of the first embodiment except what is particularly described below. For example, the structure of the aperture member of the second embodiment may be the same as that explained with reference to FIGS. 2A and 2B. Description on FIGS. 2A and 2B can also be applied to the second embodiment. The sectional view showing the configuration of the blanking plate of the second embodiment is the same as that of FIG. 3. Description on FIG. 3 can also be applied to the second embodiment. The top view showing a part of the structure in the membrane region of the blanking plate of the second embodiment is the same as that of FIG. 4. Moreover, description on FIG. 4 can also be applied to the second embodiment.

Figure 17:
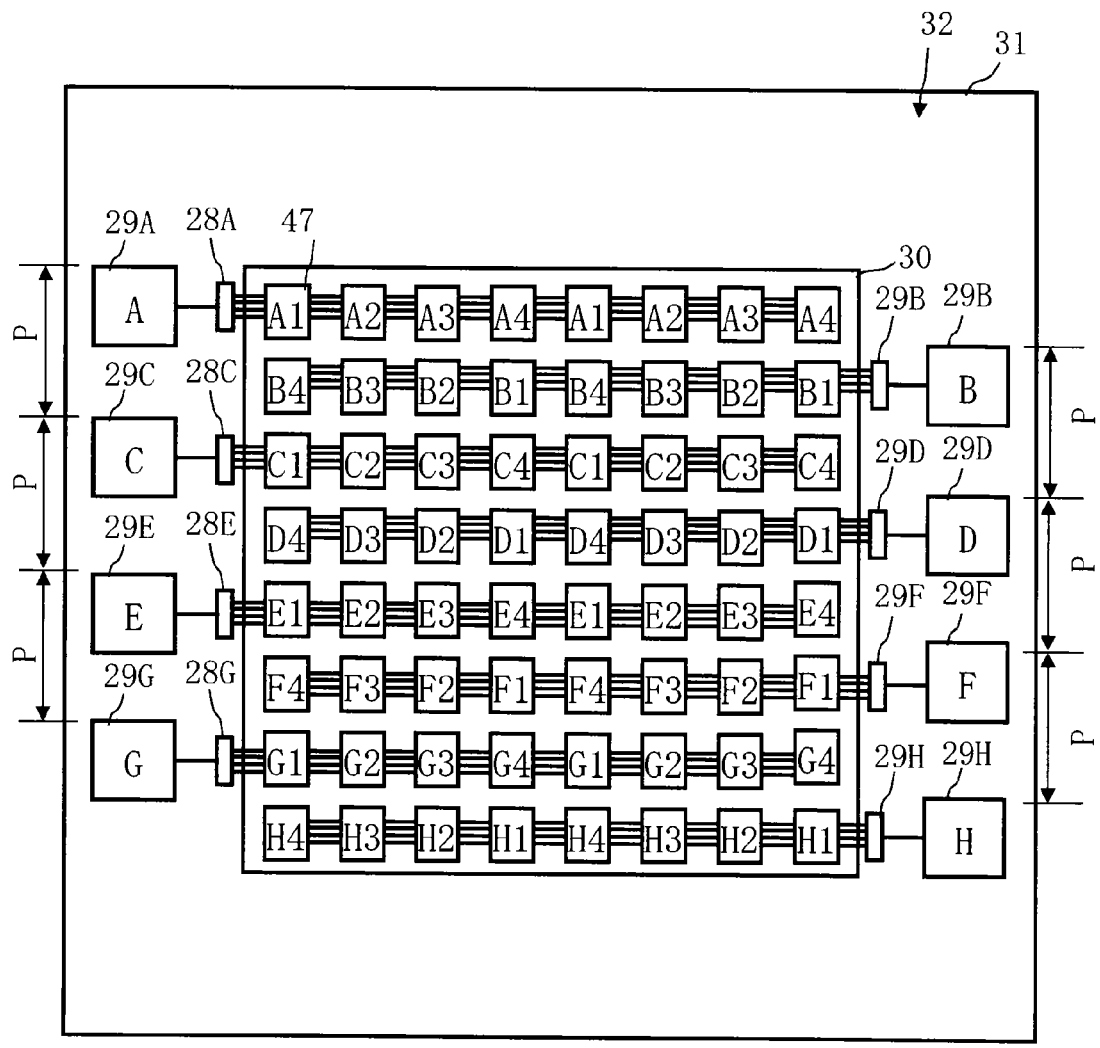
FIG. 17 is a top view showing an example of the configuration of a blanking plate according to the second embodiment.

FIG. 17 is a top view showing an example of the configuration of a blanking plate according to the second embodiment. The substrate 31 is formed in a quadrangle viewed from the above, and, the membrane region 30 at the central part is also formed in a quadrangle. A plurality of individual blanking systems 47 are arranged in two dimensions in the membrane region 30. For example, they are arranged in a matrix. A plurality of individual blanking systems 47 arranged in eight rows by eight columns (8×8) are shown in the example of FIG. 17 as well as FIG. 5. In the control circuit 41 of each individual blanking system 47, there is arranged a shift register. A plurality of shift registers for all the beams in the membrane region 30 configure a plurality of groups thereof connected in series.

In the example of FIG. 17, a group (row group) is configured by shift registers in a plurality of individual blanking systems 47 arranged in each row (arranged laterally). For example, as shown in FIG. 17, one group (row group) is composed of shift registers in, for example, eight individual blanking systems 47 each denoted by "A" in the first row from the top. Similarly, one group (row group) is composed of shift registers in, for example, eight individual blanking systems 47 each denoted by "B" in the second row. Similarly, one group (row group) is composed of shift registers in, for example, eight individual blanking systems 47 each denoted by "C" in the third row. Similarly, one group (row group) is composed of shift registers in, for example, eight individual blanking systems 47 each denoted by "D" in the fourth row. Similarly, one group (row group) is composed of shift registers in, for example, eight individual blanking systems 47 each denoted by "E" in the fifth row. Similarly, one group (row group) is composed of shift registers in, for example, eight individual blanking systems 47 each denoted by "F" in the sixth TOW. Similarly, one group (row group) is composed of shift registers in, for example, eight individual blanking systems 47 each denoted by "G" in the seventh row. Similarly, one group (row group) is composed of shift registers in, for example, eight individual blanking systems 47 each denoted by "H" in the eighth row.

One serial parallel conversion unit 28 (an example of a data transmitter) is arranged for each of groups of shift registers. Then, one pad 29 is arranged for each serial parallel conversion unit 28.

FIG. 17 shows the case in which, with respect to shift registers in a plurality of individual blanking systems 47 arranged in two dimensions, shift registers (first shift register group) arranged in a straight line make a group (row group) in each row, but, it is not limited thereto. It is also preferable that the shift registers (first shift register group) arranged in a straight line make two or more groups (row groups) each of which is composed of shift registers (second shift register group). That is, FIG. 17 shows the case where the first shift register group and the second shift register group indicate the same shift register group.

Thus, each of a plurality of serial parallel conversion units 28 is arranged for each shift register group (second shift register group) obtained by grouping shift registers (first shift register group) arranged in a straight line in a plurality of shift registers arranged in two dimensions into one or more groups.

For example, to each group (row group) composed of shift registers (first shift register group) in each row, a corresponding serial parallel conversion unit 28 is connected by a 4-bit parallel line, for example. Each pad 29 is connected to each of a plurality of serial parallel conversion units 28 by a single line.

In the example of FIG. 17, along the left side of the four sides of the membrane region 30, there are arranged a set "A" composed of a serial parallel conversion unit 28A and a pad 29A, a set "C" composed of a serial parallel conversion unit 28C and a pad 29C, a set "E" composed of a serial parallel conversion unit 28E and a pad 29E, and a set "G" composed of a serial parallel conversion unit 28G and a pad 29G. Along the right side of the four sides of the membrane region 30, there are arranged a set "B" composed of a serial parallel conversion unit 28B and a pad 29B, a set "D" composed of a serial parallel conversion unit 28D and a pad 29D, a set "F" composed of a serial parallel conversion unit 28F and a pad 29F, and a set "H" composed of a serial parallel conversion unit 28H and a pad 29H.

Then, shift registers in each group (the first shift register group or the second shift register group) are further grouped into a plurality of subgroups. In the example of FIG. 17, the shift registers in a group (row group) in each row are further grouped into a plurality of subgroups.

For example, as shown in FIG. 17, with respect to the shift registers in the eight individual blanking systems 47 each denoted by "A" in the first row from the top, one subgroup is composed of shift registers (third shift register group) in the two individual blanking systems 47 each denoted by "A1". Moreover, for example, another subgroup is composed of shift registers (third shift register group) in the two individual blanking systems 47 each denoted by "A2". Moreover, for example, another subgroup is composed of shift registers (third shift register group) in the two individual blanking systems 47 each denoted by "A3". Moreover, for example, another subgroup is composed of shift registers (third shift register group) in the two individual blanking systems 47 each denoted by "A4".

Similarly, for example, as shown in FIG. 17, with respect to the shift registers in the eight individual blanking systems 47 each denoted by "B" in the second row from the top, one subgroup is composed of shift registers (third shift register group) in the two individual blanking systems 47 each denoted by "B1". Moreover, for example, another subgroup is composed of shift registers (third shift register group) in the two individual blanking systems 47 each denoted by "B2". Moreover, for example, another subgroup is composed of shift registers (third shift register group) in the two individual blanking systems 47 each denoted by "B3". Moreover, for example, another subgroup is composed of shift registers (third shift register group) in the two individual blanking systems 47 each denoted by "B4".

Similarly, for example, as shown in FIG. 17, with respect to the shift registers in the eight individual blanking systems 47 each denoted by "C" in the third row from the top, one subgroup is composed of shift registers (third shift register group) in the two individual blanking systems 47 each denoted by "C1". Moreover, for example, another subgroup is composed of shift registers (third shift register group) in the two individual blanking systems 47 each denoted by "C2". Moreover, for example, another subgroup is composed of shift registers (third shift register group) in the two individual blanking systems 47 each denoted by "C3". Moreover, for example, another subgroup is composed of shift registers (third shift register group) in the two individual blanking systems 47 each denoted by "C4".

Similarly, for example, as shown in FIG. 17, with respect to the shift registers in the eight individual blanking systems 47 each denoted by "D" in the fourth row from the top, one subgroup is composed of shift registers (third shift register group) in the two individual blanking systems 47 each denoted by "D1". Moreover, for example, another subgroup is composed of shift registers (third shift register group) in the two individual blanking systems 47 each denoted by "D2". Moreover, for example, another subgroup is composed of shift registers (third shift register group) in the two individual blanking systems 47 each denoted by "D3". Moreover, for example, another subgroup is composed of shift registers (third shift register group) in the two individual blanking systems 47 each denoted by "D4".

Similarly, for example, as shown in FIG. 17, with respect to the shift registers in the eight individual blanking systems 47 each denoted by "E" in the fifth row from the top, one subgroup is composed of shift registers (third shift register group) in the two individual blanking systems 47 each denoted by "E1". Moreover, for example, another subgroup is composed of shift registers (third shift register group) in the two individual blanking systems 47 each denoted by "E2". Moreover, for example, another subgroup is composed of shift registers (third shift register group) in the two individual blanking systems 47 each denoted by "E3". Moreover, for example, another subgroup is composed of shift registers (third shift register group) in the two individual blanking systems 47 each denoted by "E4".

Similarly, for example, as shown in FIG. 17, with respect to the shift registers in the eight individual blanking systems 47 each denoted by "F" in the sixth row from the top, one subgroup is composed of shift registers (third shift register group) in the two individual blanking systems 47 each denoted by "F1". Moreover, for example, another subgroup is composed of shift registers (third shift register group) in the two individual blanking systems 47 each denoted by "F2". Moreover, for example, another subgroup is composed of shift registers (third shift register group) in the two individual blanking systems 47 each denoted by "F3". Moreover, for example, another subgroup is composed of shift registers (third shift register group) in the two individual blanking systems 47 each denoted by "F4".

Similarly, for example, as shown in FIG. 17, with respect to the shift registers in the eight individual blanking systems 47 each denoted by "G" in the seventh row from the top, one subgroup is composed of shift registers (third shift register group) in the two individual blanking systems 47 each denoted by "G1". Moreover, for example, another subgroup is composed of shift registers (third shift register group) in the two individual blanking systems 47 each denoted by "G2". Moreover, for example, another subgroup is composed of shift registers (third shift register group) in the two individual blanking systems 47 each denoted by "G3". Moreover, for example, another subgroup is composed of shift registers (third shift register group) in the two individual blanking systems 47 each denoted by "G4".

Similarly, for example, as shown in FIG. 17, with respect to the shift registers in the eight individual blanking systems 47 each denoted by "H" in the eighth row from the top, one subgroup is composed of shift registers (third shift register group) in the two individual blanking systems 47 each denoted by "H1". Moreover, for example, another subgroup is composed of shift registers (third shift register group) in the two individual blanking systems 47 each denoted by "H2". Moreover, for example, another subgroup is composed of shift registers (third shift register group) in the two individual blanking systems 47 each denoted by "H3". Moreover, for example, another subgroup is composed of shift registers (third shift register group) in the two individual blanking systems 47 each denoted by "H4".

Figure 18:
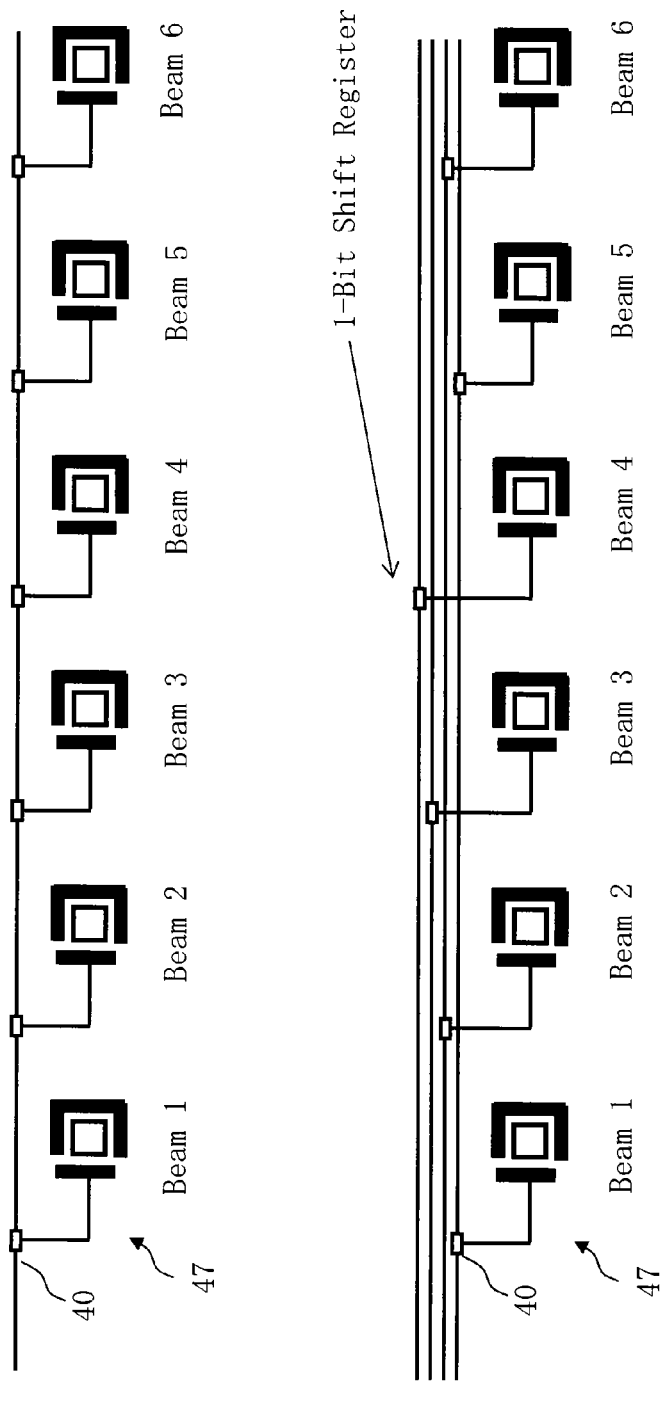
FIGS. 18A and 18B show examples of a connected state of shift registers according to the second embodiment and a comparative example.

FIGS. 18A and 18B show examples of a connected state of shift registers according to the second embodiment and a comparative example. In FIGS. 18A and 18B, circuits other than the shift registers 40 in the control circuit 41 are not shown. The comparative example of FIG. 18A shows a part of the case where all the shift registers (first shift register group) in each row are connected in series. In the example of FIG. 18A, all the shift registers 40 in the eight individual blanking systems 47 each denoted by "A" in the first row from the top shown in FIG. 17 are connected in series by a 1-bit single line, for example. The serial parallel conversion unit 28 is connected to one of shift registers in a group in each row, (that is, the shift register 40 at the end and close to the serial parallel conversion unit 28), by a 1-bit line. In such a case, the serial parallel conversion unit 28 itself can be omitted because there is no need to perform serial parallel conversion. In the case of FIG. 18A, only six of the eight individual blanking systems 47 are shown, and others are omitted. Moreover, in the case of FIG. 18A, beams passing through the eight individual blanking systems 47 each denoted by "A" in the first row are defined, for example, from the side close to the serial parallel conversion unit 28, as a beam 1, a beam 2, and so on. In the configuration shown in FIG. 18A, for example, when eight individual blanking systems 47 are arranged at "A" in the first row, performing clock operation eight times is needed for transmitting a blanking signal up to a beam 8 by using the shift registers 40. Therefore, in the case of FIG. 18A, clock operation of eight times is needed for one beam shot.

As described above, for transmitting data to N shift registers connected in series, it is necessary to execute clock operations N times by the shift registers. The heating value of a shift register is proportional to the number of times of clock operation per unit time. On the other hand, if the number of beams increases, the number of shift registers arranged in one row increases. Therefore, the number of times of clock operation per unit time increases, and the heating value increases. Consequently, the heating value of a blanking plate increases. Since the blanking plate is arranged in a vacuum region, and, further, shift registers are arranged in the membrane region of the blanking plate, the heat exhaust efficiency is low. Accordingly, for controlling the heating value to be within an acceptable value, limitation occurs to the number of times of clock operation per unit time. Thus, it becomes difficult to perform a high-speed operation. Furthermore, when the number of beams increases and the number of shift registers arranged in one row increases, data transmission will take time. Therefore, also from this point of view, it becomes difficult to achieve a high-speed operation.

By contrast, according to the second embodiment, FIG. 18B shows a part of the case where shift registers (third shift register group) in a subgroup in the group of each row are connected in series. For example, the shift registers 40 in the two individual blanking systems 47 in a subgroup "A1" are connected in series by a 1-bit single line. Simultaneously, for example, the shift registers 40 in the two individual blanking systems 47 in a subgroup "A2" are connected in series by a 1-bit single line. The serial parallel conversion unit 28 is connected, totally by a 4-bit parallel line, to each shift register (the shift register 40 at the end and close to the serial parallel conversion unit 28, in each subgroup) in shift registers in a subgroup in the group of each row. The same is applied to other groups.

In other words, each serial parallel conversion unit 28 is connected to the shift registers (third shift register group) in each subgroup in a corresponding group by parallel lines whose number is obtained by multiplying the number of bits to be data processed by the shift register 40 by the number of subgroups.

Moreover, in the case of FIG. 18B, similarly to FIG. 18A, only six of the eight individual blanking systems 47 are shown, and the others are omitted. In the case of FIG. 18B, beams passing through the eight individual blanking systems 47 each denoted by "A" in the first row are defined, for example, from the side close to the serial parallel conversion unit 28, as a beam 1, a beam 2, and so on. In the configuration shown in FIG. 18B, when eight individual blanking systems 47 are arranged at "A" in the first row, performing clock operation twice is sufficient for transmitting a blanking signal up to a beam 8 by using the shift registers 40 because four subgroups, each of which is composed of two shift registers 40 connected in series, are connected in parallel. Therefore, the number of times of clock operation can be reduced to one K-th (K being the number of subgroups). Here, the number of times of clock operation can be reduced to one fourth (¼).

Therefore, the number of times of clock operation per unit time can be reduced, and a heating value can be suppressed (or reduced). Consequently, the heating value of a blanking plate can be suppressed (or reduced). Therefore, a high-speed operation can be achieved. Furthermore, even if the number of beams increases and the number of shift registers arranged in one row increases, the heating value of the blanking plate can be suppressed and the high-speed operation can be achieved by increasing the number of subgroups. For example, even when the number of beams increases, the heating value can be reduced to 1/K, without increasing the number of times of clock operation. Alternatively, K times the high-speed operation can be achieved by the same heating value.

Furthermore, according to the second embodiment, one set composed of the serial parallel conversion units 28 and the pad 29 is connected to each group. Therefore, even if the number of subgroups increases, it is possible not to increase the number of sets each composed of the serial parallel conversion unit 28 and the pad 29. Accordingly, the problem that it is difficult to arrange pads because the distance between the pads is too narrow can be avoided.

Furthermore, according to the second embodiment, as shown in FIGS. 17 and 18B, it is preferable that shift registers 40 connected in series in each subgroup are arranged at the same pitch. Thereby, the wiring lengths between shift registers connected in series in a subgroup can be substantially equal to each other. Therefore, impedance can be equal to each other, and transmission delay of a signal to a clock can be uniform. Therefore, the transmission timing of signals can be coincident with each other. Furthermore, according to the second embodiment, as shown in FIG. 17, for example, with respect to each row of a plurality of individual blanking systems 47 arranged in eight rows by eight columns (8×8), the individual blanking systems 47, also referred to as the shift registers 40, are arranged at the same pitch such that the first subgroup (A1, B1, H1), the second subgroup (A2, B2, H2), the third subgroup (A3, B3, H3), and the fourth subgroup (A4, B4, ..., H4) are arranged in order one by one so as to repeat this arrangement. Therefore, with respect to all the shift registers arranged in two dimensions on the blanking plate 204, the wiring lengths each between the shift registers connected in series can be substantially equal to each other. Accordingly, in transmission of each shot data of multiple beams, signal transmission delay can be uniform, and thus, transmission rate can be improved and transmission error can be reduced.

Furthermore, according to the second embodiment, it is preferable that each subgroup in a plurality of subgroups in each group is composed of shift registers (third shift register group) whose number is equal to that of shift registers in another subgroup as shown in FIG. 17. If the number of shift registers differs between subgroups, when performing each shot, operation speed is rate-determined by the number of times of clock operation of a subgroup which has more shift registers. Therefore, as described in the second embodiment, the number of times of clock operation can be reduced by equalizing the number of shift registers between subgroups.

Figure 19:
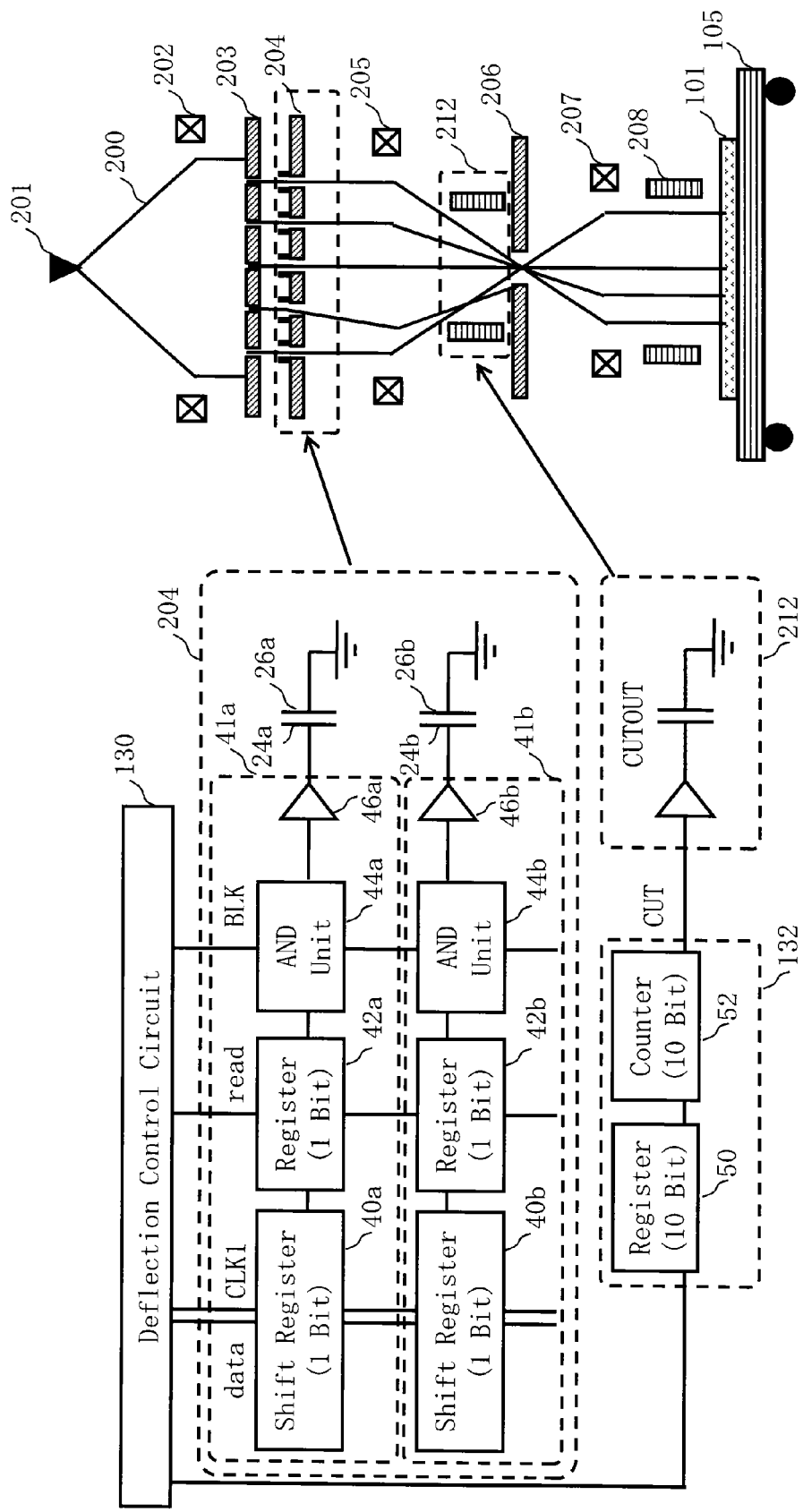
FIG. 19 is a schematic diagram showing the internal configuration of an individual blanking control circuit and a common blanking control circuit according to the second embodiment.

FIG. 19 is a schematic diagram showing the internal configuration of an individual blanking control circuit and a common blanking control circuit according to the second embodiment. In FIG. 19, the shift register 40, the register 42, and an AND unit (logical product unit) are arranged in each logic circuit 41 for individual blanking control arranged at the blanking plate 204 in the body of the writing apparatus 100. The AND unit 44 is used for compulsorily making all the individual blanking be OFF, for example, when a problem arises in a register operation, but, it may be omitted in the second embodiment. According to the second embodiment, for example, a 1-bit control signal is used for individual blanking control for each beam, which has conventionally been controlled by, for example, a 10-bit control signal. That is, a 1-bit control signal is input/output to/from the shift register 40, the register 42, and the AND unit 44. Since the amount of data of a control signal is small, an installation area of the control circuit can be small. In other words, even when a logic circuit is arranged on the blanking plate 204 whose installation space is small, more beams can be arranged at a smaller beam pitch. This enables the amount of current passing the blanking plate to be increased, and therefore, a writing throughput can be improved.

Moreover, an amplifier is arranged at the deflector 212 for common blanking, and a register 50 and a counter 52 (an example of a shot time control unit) are arranged at the logic circuit 132. These do not perform several different controlling at the same time, and therefore, it is sufficient to use one circuit to perform ON/OFF control. Accordingly, even when arranging a circuit for a high speed response, no problem occurs with respect to the restriction on the installation space and the current to be used in the circuit. Therefore, this amplifier is operated at very high speed compared with an amplifier realizable on a blanking aperture. This amplifier is controlled by a 10-bit control signal, for example. That is, for example, a 10-bit control signal is input/output to/from the register 50 and the counter 52.

According to the second embodiment, blanking control of each beam is performed by using both the beam ON/OFF control by each logic circuit 41 for individual blanking control described above and the beam ON/OFF control by the logic circuit 132 for common blanking control that collectively control all the multiple beams.

Figure 20:
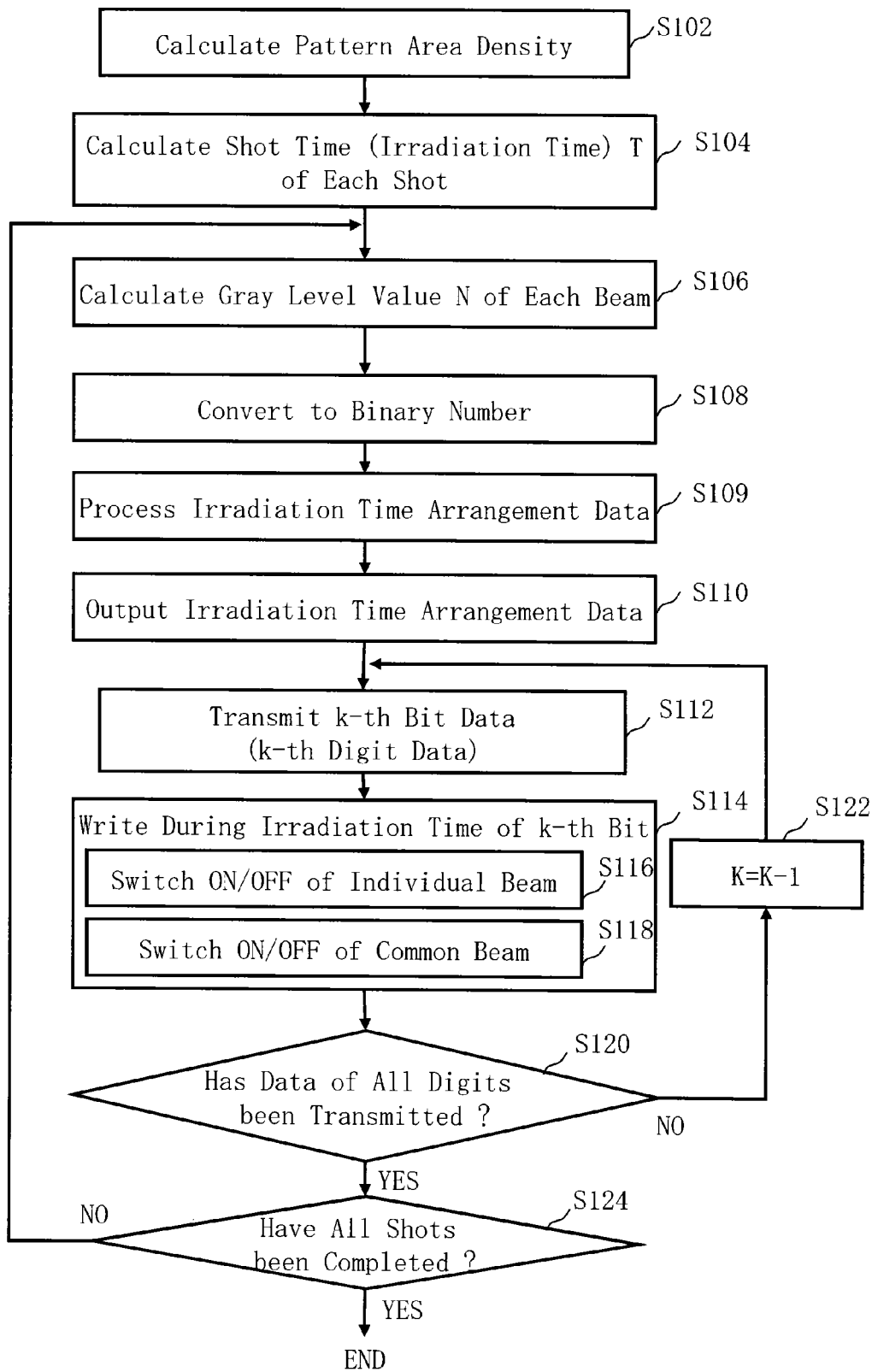
FIG. 20 is a flowchart showing main steps of a writing method according to the second embodiment.

FIG. 20 is a flowchart showing main steps of a writing method according to the second embodiment. In FIG. 20, the writing method of the second embodiment executes a series of steps: a pattern area density calculation step (S102), a shot time period (irradiation time) T calculation step (S104), a gray level value N calculation step (S106), a conversion to binary number step (S108), an irradiation time arrangement data processing step (S109), an irradiation time arrangement data output step (S110), a target digit data transmission step (S112), a writing step (S114) based on irradiation time of a target digit, a determination step (S120), a digit change step (S122), and a determination step (S124). The writing step (S114) based on irradiation time of a target digit executes, as its internal steps, a series of steps: an individual beam ON/OFF switching step (S116) and a common beam ON/OFF switching step (S118).

In the pattern area density calculation step (S102), the area density calculation unit 60 reads writing data from the storage device 140, and calculates the area density of a pattern arranged in the writing region of the target object 101 or in each mesh region of a plurality of mesh regions obtained by virtually dividing a chip region to be written into meshes. For example, the writing region of the target object 101 or a chip region to be written is divided into strip-shaped stripe regions each having a predetermined width. Then, each stripe region is virtually divided into a plurality of mesh regions described above. It is preferable that the size of a mesh region is, for example, a beam size, or smaller than a beam size. For example, the size of a mesh region is preferably about 10 nm. The area density calculation unit 60 reads, for each stripe region, corresponding writing data from the storage device 140, and assigns a plurality of figure patterns defined in the writing data to a mesh region, for example. Then, the area density of a figure pattern arranged in each mesh region is calculated.

In the shot time (irradiation time) T calculation step (S104), the irradiation time calculation unit 62 calculates an irradiation time T (which hereinafter will also be called a shot time, a shot time period, or an exposure time) of an electron beam per shot, for each predetermined sized mesh region. When performing multi-pass writing, an irradiation time T of the electron beam per shot in each hierarchy of multi-pass writing should be calculated. It is preferable to obtain an irradiation time T, being a reference, to be in proportion to the area density of a calculated pattern. Moreover, it is preferable that the irradiation time T to be finally calculated is a time equivalent to a dose after correction, that is a dose having been corrected with respect to a dimension change amount by a dimension change phenomenon, such as a proximity effect, a fogging effect, a loading effect, etc. not shown. The size of a plurality of mesh regions used for defining an irradiation time T and the size of a plurality of mesh regions where a pattern area density is defined may be the same size or different sizes. When they are different sizes, each irradiation time T is calculated after interpolating an area density by linear interpolation, etc. The irradiation time T for each mesh region is defined in an irradiation time map, and the irradiation time map is stored in the storage device 142, for example.

In the gray scale value N calculation step (S106), the gray scale value calculation unit 64 calculates a gray scale value N, being an integer, which is used when defining the irradiation time T for each mesh region, defined in the irradiation time map, by using a predetermined quantization unit Δ. The irradiation time T is defined by the following equation (1).

$$T = \Delta N \quad (1)$$

Therefore, the gray scale value N is defined as an integer value obtained by dividing the irradiation time T by a quantization unit Δ. The quantization unit Δ can be variously set, and, for example, can be defined by 1 ns (nanosecond), etc. It is preferable that a value of, for example, 1 to 10 ns is used as the quantization unit Δ. Δ indicates a quantization unit for controlling, such as a clock period in the case of performing control by a counter.

In the conversion to binary number step (S108), the bit conversion unit 66 converts, for each shot, the irradiation time (in this case, a gray level value N) of each of multiple beams into a predetermined n-digit binary value. For example, when N=50, since it is $50=2^1+2^4+2^5$, if converting into a 10-digit binary value, it becomes "0000110010". For example, if N=500, it is "0111110100". For example, if N=700, it is "1010111100". For example, if N=1023, it is "1111111111". For each shot, the irradiation time of each beam is equivalent to an irradiation time defined for a mesh region to be irradiated by each beam concerned. Thereby, the irradiation time T is defined by the following equation (2).

$$T = \Delta \sum_{k=0}^{n-1} a_k 2^k \quad (2)$$

$a_k$ indicates a value (1 or 0) of each digit in the case defining the gray level value N by a binary number. Although it is sufficient for n, being the number of digits, to be two or more, preferably it should be four or more digits, and more preferably, it should be eight or more digits.

According to the second embodiment, for each shot of beams, irradiation of each beam of each shot of beams concerned is divided into irradiation steps of "n" times, "n" being the number of digits of a binary number sequence (data of binary numbers) set in advance. The irradiation of steps of n times is equivalent to a combination of irradiation of irradiation time periods (a plurality of first irradiation time periods). A maximum irradiation time period per shot of beams of the multiple beams is divided into a plurality, being the digit number "n", of the irradiation time periods (a plurality of first irradiation time periods). Each of the irradiation time periods (a plurality of first irradiation time periods) is calculated by multiplying a corresponding gray scale value (second gray scale value) of a plurality of gray scale values (a plurality of second gray scale values) by Δ, where the plurality of gray scale values (a plurality of second gray scale values) are gray scale values defined in decimal numbers converted from each digit value of a binary value (data of binary numbers) of n-digit. In other words, one shot is divided into a plurality of irradiation steps of irradiation time periods of $\Delta a_0 2^0$, $\Delta a_1 2^1$, $\Delta a_k 2^k$, ..., $\Delta a_{n-1} 2^{n-1}$. In the case of n, the number of digits, being 10, that is n=10, one shot is divided into irradiation steps of ten times.

For example, in the case of n, the number of digits, being 10, that is n=10, if N=700, the irradiation time of the tenth digit (the tenth bit) is Δ×512. The irradiation time of the ninth digit (the ninth bit) is Δ×0=0. The irradiation time of the eighth digit (the eighth bit) is Δ×128. The irradiation time of the seventh digit (the seventh bit) is Δ×0=0. The irradiation time of the sixth digit (the sixth bit) is Δ×32. The irradiation time of the fifth digit (the fifth bit) is Δ×16. The irradiation time of the fourth digit (the fourth bit) is Δ×8. The irradiation time of the third digit (the third bit) is Δ×4. The irradiation time of the second digit (the second bit) is Δ×0=0. The irradiation time of the first digit (the first bit) is Δ×0=0.

For example, in the case of performing irradiation in order from the largest digit, if Δ=1 ns, the first irradiation step is 512 ns (beam ON) irradiation. The second irradiation step is 0 ns (beam OFF) irradiation. The third irradiation step is 128 ns (beam ON) irradiation. The fourth irradiation step is 0 ns (beam OFF) irradiation. The fifth irradiation step is 32 ns (beam ON) irradiation. The sixth irradiation step is 16 ns (beam ON) irradiation. The seventh irradiation step is 8 ns (beam ON) irradiation. The eighth irradiation step is 4 ns (beam ON) irradiation. The ninth irradiation step is 0 ns (beam OFF) irradiation. The tenth irradiation step is 0 ns (beam OFF) irradiation.

As described above, according to the second embodiment, for each shot of beams, irradiation of each beam of each shot of beams concerned is divided into irradiation steps (divided shot) of "n" times, "n" being the number of digits of a binary number sequence (data of binary numbers) set in advance. The irradiation of steps of n times is equivalent to a combination of irradiation of irradiation time periods (a plurality of first irradiation time periods). A maximum irradiation time period per shot of beams of the multiple beams is divided into a plurality, being the digit number "n", of the irradiation time periods (a plurality of first irradiation time periods). Each of the irradiation time periods (a plurality of first irradiation time periods) is calculated by multiplying a corresponding gray scale value (second gray scale value) of a plurality of gray scale values (a plurality of second gray scale values) by Δ, where the plurality of gray scale values (a plurality of second gray scale values) are gray scale values defined in decimal numbers converted from each digit value of a binary value (data of binary numbers) of n-digit. Then, as described later, beam during an irradiation time corresponding to each digit irradiates (divided shot to) the target object 101 in order.

In the irradiation time arrangement data processing step (S109), the data processing unit 65 performs processing, for each group of shift registers (third shift register group) connected in series, such that data on the irradiation time of a corresponding beam is aligned according to the transmission order transmitted by a plurality of shift registers 40 in a corresponding subgroup. The arrangement processing is performed so that data may be aligned in order from the data for a shift register at the posterior side in a plurality of shift registers connected in series in a subgroup. Moreover, arrangement processing is performed such that data of subgroups are collected for each group. For example, the arrangement processing is performed such that data of each subgroup is aligned in order in each group.

In the irradiation time arrangement data output step (S110), the transmission processing unit 68 outputs, for each beam shot, irradiation time arrangement data, which has been converted into binary digit data and whose order has been processed, to the deflection control circuit 130.

In the target digit data transmission step (S112), the deflection control circuit 130 outputs, for each shot, irradiation time arrangement data to the logic circuit 41 for each beam. Moreover, synchronized with this, the deflection control circuit 130 outputs timing data of each irradiation step to the logic circuit 132 for common blanking.

FIG. 21 shows an example of a part of irradiation time arrangement data according to the second embodiment. Referring to FIG. 21, there is shown a part of irradiation time arrangement data of a predetermined shot of beams 1 to 4 in the multiple beams, for example. The example of FIG. 21 shows irradiation time arrangement data of from the k-th bit (k-th digit) irradiation step to the (k–3)th bit ((k–3)th digit) irradiation step of the beams 1 to 4. In the example of FIG. 21, as to the beam 1, data "1101" is expressed for the irradiation steps from the k-th bit (k-th digit) to the (k–3)th bit ((k–3)th digit). As to the beam 2, data "1100" is expressed for the irradiation steps from the k-th bit (k-th digit) to the (k–3)th bit ((k–3)th digit). As to the beam 3, data "0110" is expressed for the irradiation steps from the k-th bit (k-th digit) to the (k–3)th bit ((k–3)th digit). As to the beam 4, data "0111" is expressed for the irradiation steps from the k-th bit (k-th digit) to the (k–3)th bit ((k–3)th digit).

According to the second embodiment, as shown in FIG. 19, since the shift register 40 is used for the logic circuit 41, when performing data transmission, the deflection control circuit 130 transmits data of the same bit (the same digit number) to each logic circuit 41 of the blanking plate 204 in the order of beam arrangement (or in the order of identification number). Moreover, a clock signal (CLK1) for synchronization, a read signal (read) for data read-out, and a gate signal (BLK) are output. In the example of FIG. 21, as data of the k-th bit (k-th digit) of the beams 1 to 4, each one bit data of "0011" is transmitted from the posterior beam. The shift register 40 of each beam transmits data to the next shift register 40 in order from the top, based on a clock signal (CLK1). For example, with respect to the data of the k-th bit (k-th digit) of the beams 1 to 4, based on four times clock signals, "1" being one bit data is stored in the shift register 40 of the beam 1. "1" being one bit data is stored in the shift register 40 of the beam 2. "0" being one bit data is stored in the shift register 40 of the beam 3. "0" being one bit data is stored in the shift register 40 of the beam 4.

Next, in response to an input of a read signal (read), the register 42 of each beam reads the data of the k-th bit (k-th digit) of each beam from the shift register 40. In the example of FIG. 21, as the data of the k-th bit (k-th digit), "1" being one bit data is stored in the register 42 with respect to the beam 1. As the data of the k-th bit (k-th digit), "1" being one bit data is stored in the register 42 with respect to the beam 2. As the data of the k-th bit (k-th digit), "0" being one bit data is stored in the register 42 with respect to the beam 3. As the data of the k-th bit (k-th digit), "0 being one bit data is stored in the register 42 with respect to the beam 4. When inputting the data of the k-th bit (k-th digit), the individual register 42 of each beam outputs, based on the data, an ON/OFF signal to the AND unit 44. If the data of the k-th bit (k-th digit) is "1", an ON signal is output, and if it is "0", an OFF signal is output. Then, when the BLK signal is an ON signal and the signal of the register 42 is ON, the AND unit 44 outputs an ON signal to the amplifier 46, and the amplifier 46 applies an ON voltage to the electrode 24 of the individual blanking deflector. In the case other than the above, the AND unit 44 outputs an OFF signal to the amplifier 46, and the amplifier 46 applies an OFF voltage to the electrode 24 of the individual blanking deflector.

While the data of the k-th bit (k-th digit) is being processed, the deflection control circuit 130 transmits the data of the (k–1)th bit ((k–1)th digit), in the order of beam arrangement (or in the order of identification number), to each logic circuit 41 of the blanking plate 204. In the example of FIG. 21, as the data of the (k–1)th bit ((k–1)th digit) of the beams 1 to 4, each one bit data of "1111" is transmitted from the posterior beam. The shift register 40 of each beam transmits the data to the next shift register 40 in order from the high order side, based on a clock signal (CLK1). For example, with respect to the data of the (k–1)th bit ((k–1)th digit) of the beams 1 to 4, based on four times clock signals, "1" being one bit data is stored in the shift register 40 of the beam 1. "1" being one bit data is stored in the shift register 40 of the beam 2. "1" being one bit data is stored in the shift register 40 of the beam 3. "1" being one bit data is stored in the shift register 40 of the beam 4. Based on the read signal of the (k–1)th bit ((k–1)th digit), the register 42 of each beam reads data of the (k–1)th bit ((k–1)th digit) of each beam, from the shift register 40. Similarly, it should go to the data processing of the first bit (the first digit).

The AND unit 44 shown in FIG. 19 may be omitted. However, for example, in a state where it is impossible to provide beam OFF because of a trouble of an element of the logic circuit 41, it is an effective means to provide beam OFF by using the AND unit 44. Although a 1-bit data transmission line where the shift registers are arranged in series is used in FIG. 19, it is also effective to provide a plurality of parallel transmission lines in order to improve the speed of transmission.

In the writing step (S114) based on an irradiation time of a target digit, for each beam shot, writing is performed based on the irradiation time of a target digit (for example, the k-th bit (k-th digit)) which is obtained by dividing the irradiation into a plurality of irradiation steps.

Figure 22:
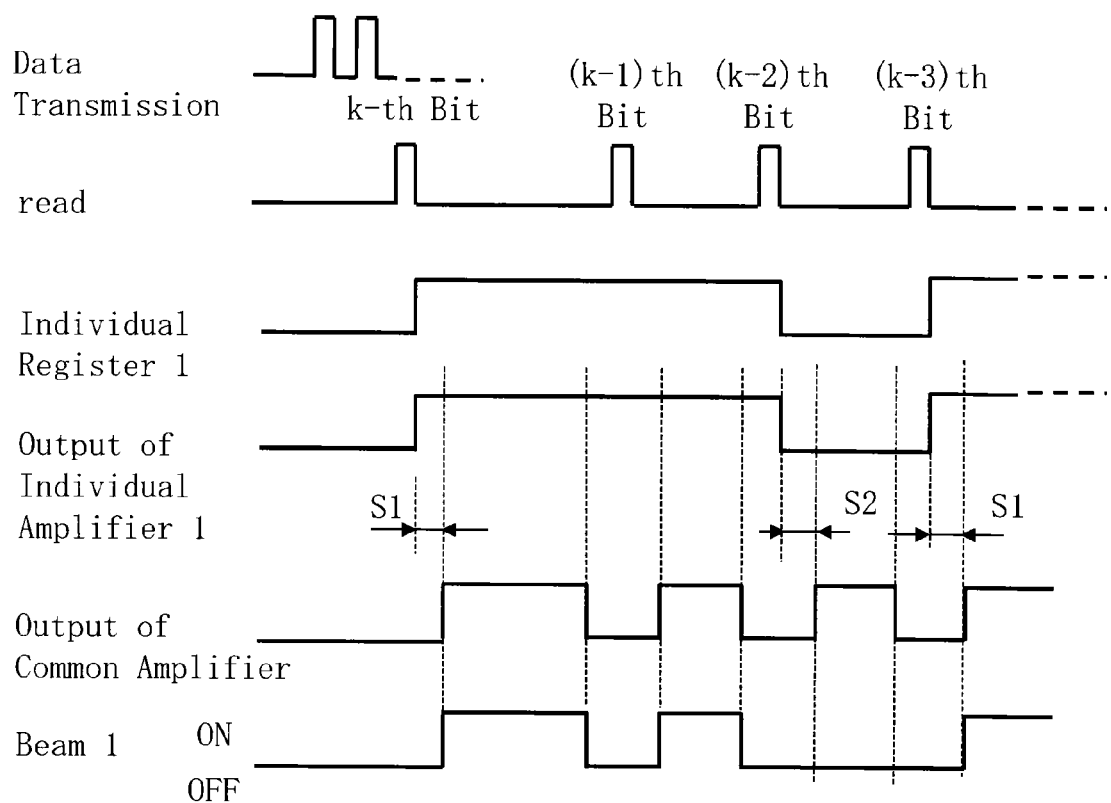
FIG. 22 is a flowchart showing a beam ON/OFF switching operation with respect to a part of an irradiation step of one shot according to the second embodiment.

FIG. 22 is a flowchart showing a beam ON/OFF switching operation with respect to a part of an irradiation step of one shot according to the second embodiment. FIG. 22 shows one beam (beam 1) in multiple beams. In the example of FIG. 21, the irradiation time arrangement data of the k-th bit (k-th digit) to the (k−3)th bit ((k−3)th digit) is represented by "1101". First, in response to an input of a read signal of the k-th bit (the k-th digit), the individual register 42 (individual register 1) outputs an ON/OFF signal based on the stored data of the k-th bit (the k-th digit). In the case of FIG. 22, an ON signal is output. According to the second embodiment, since it is the case of a 1-bit signal, the individual register 42 maintains data output until the next (k−1)th bit ((k−1)th digit) data is read.

Since the data of the k-th bit (k-th digit) is data indicating ON, the individual amplifier 46 (individual amplifier 1) outputs an ON voltage to be applied to the blanking electrode 24 for the beam 1. On the other hand, in the logic circuit 132 for common blanking, ON or OFF is switched depending upon a 10-bit timing data of each irradiation step. In the common blanking system, an ON signal is output during the irradiation time of each irradiation step. For example, if $\Delta=1$ ns, the irradiation time of the first irradiation step (for example, the tenth digit (the tenth bit)) is $4\times512=512$ ns. The irradiation time of the second irradiation step (for example, the ninth digit (the ninth bit)) is $\Delta\times256=256$ ns. The irradiation time of the third irradiation step (for example, the eighth digit (the eighth bit)) is $\Delta\times128=128$ ns. Similarly, hereinafter, an ON signal is output during the irradiation time of each digit (each bit). In the logic circuit 132, when timing data of each irradiation step is input into the register 50, and then the register 50 outputs data indicating ON of the k-th digit (k-th bit), the counter 52 counts the irradiation time of the k-th digit (k-th bit), and controlling is performed to be OFF after the irradiation time has passed.

In the common blanking system, in contrast with ON/OFF switching of the individual blanking system, ON/OFF switching is performed after the voltage stabilization time (settling time) S1/S2 of the amplifier 46 has passed. In the example of FIG. 22, after the individual amplifier 1 has become ON and the settling time S1 of the individual amplifier 1 at the time of switching from OFF to ON has passed, the common amplifier becomes ON. Thereby, beam irradiation at an unstable voltage at the time of rise of the individual amplifier 1 can be eliminated. Then, the common amplifier becomes OFF when the irradiation time of the k-th digit (k-th bit) has passed. Consequently, in the case of both the individual amplifier and the common amplifier being ON, an actual beam becomes ON, and irradiates the target object 101. Therefore, it is controlled such that the ON time of the common amplifier becomes the irradiation time of the actual beam. In other words, the common blanking system specifies the irradiation time. That is, it is controlled such that the common amplifier and the deflector 212 specify the irradiation time by using the counter 52 (irradiation time control unit). On the other hand, in the case where the common amplifier becomes ON when the individual amplifier 1 is OFF, after the individual amplifier 1 becomes OFF and the settling time S2 of the individual amplifier 1 at the time of switching from ON to OFF has passed, the common amplifier becomes ON. Thereby, beam irradiation at an unstable voltage at the time of fall of the individual amplifier 1 can be eliminated. As described in FIG. 22, if the operation of the individual amplifier is started after the common amplifier becomes OFF, an unstable operation can be eliminated and accurate beam irradiation can be executed.

As described above, in the individual beam ON/OFF switching step (S116), beam ON/OFF control is individually performed for a corresponding beam in multiple beams by a plurality of individual blanking systems (blanking plate 204, etc.), and, for each beam, with respect to an irradiation step (irradiation) of the k-th bit (k-th bit), beam ON/OFF switching is performed by the individual blanking system for a beam concerned. In the example of FIG. 22, since the beam is not in the beam OFF condition in the irradiation step of the (k−1)th digit ((k−1)th bit), switching from ON to OFF is not performed. However, for example, if the beam is in the beam OFF condition in the irradiation step of the (k−1)th digit ((k−1)th bit), it should be understood that switching from ON to OFF is performed.

In the common beam ON/OFF switching step (S118), for each beam, with respect to the irradiation step (irradiation) of the k-th digit (k-th bit), in addition to performing beam ON/OFF switching by the individual blanking system, beam ON/OFF controlling is collectively performed by the common blanking system (the logic circuit 132, the deflector 212, etc.) for the whole of the multiple beams, and blanking control is performed so that the beam may be in the beam ON condition during the irradiation time corresponding to the irradiation step (irradiation) of the k-th digit (k-th bit).

As described above, since there is a restriction on the installation area of the circuit and the current to be used in the circuit in the blanking plate 204, a simple amplifier circuit is used. Therefore, it is also limited in reducing the settling time of the individual amplifier. By contrast, in the common blanking system, a highly precise amplifier circuit of a sufficient size, current, and scale can be installed outside the electron optical column. Therefore, the settling time of the common amplifier can be shortened. Thus, according to the second embodiment, by providing a beam ON condition by the common blanking system after the beam ON condition by the individual blanking system (or after a read signal of a target digit is output) and after the settling time has passed, it is possible to eliminate a voltage unstable time and a noise component containing crosstalk of the individual amplifier on the blanking plate and to perform a blanking operation based on a highly precise irradiation time.

In the determination step (S120), the writing control unit 72 determines whether transmission of irradiation time arrangement data with respect to all the digits has been completed or not. When it has not been completed yet, it goes to the digit change step (S122). When it has already been completed, it goes to the determination step (S124).

In the digit change step (S122), the writing control unit 72 changes a target bit (digit). For example, the target digit is changed to the (k−1)th digit ((k−1) th bit) from the k-th digit (k-th bit). Then, it returns to the target digit data transmission step (S112). With respect to the processing of the (k−1) th digit ((k−1) th bit), processing from the target digit data transmission step (S112) to the digit change step (S122) is executed. Then, it is similarly repeated until processing of irradiation time arrangement data with respect to all the digits have been completed in the determination step (S120).

In the example of FIG. 22, after the beam ON time for the irradiation step of the k-th digit (k-th bit) has passed, a read signal of the (k−1)th digit ((k−1)th bit) is input into the register 42. Since the data of the (k−1)th digit ((k−1)th bit) is "1" in the register 42 with respect to the beam 1, it is continued to output an ON signal. Therefore, the output of the individual amplifier 1 becomes ON, and an ON voltage is applied to the electrode 24 for individual blanking. Similarly, after the settling time of the individual amplifier 1 has passed, the beam ON condition is provided by the common blanking system. Then, after the irradiation time of the (k−1)th digit ((k−1)th bit) has passed, the beam becomes OFF by the common blanking system.

Next, after the beam ON time for the irradiation step of the (k−1)th digit ((k−1)th bit) has passed, a read signal of the (k−2) th digit ((k−2) th bit) is input into the register 42. Since the data of the (k−2)th digit ((k−2)th bit) is "0" in the register 42 with respect to the beam 1, it is switched to output an OFF signal. Therefore, the output of the individual amplifier 1 becomes OFF, and an OFF voltage is applied to the electrode 24 for individual blanking. Similarly, after the settling time of the individual amplifier 1 has passed, the beam ON condition is provided by the common blanking system. However, since the output of the individual amplifier 1 is OFF, consequently, the beam 1 is made to be OFF. Then, after the irradiation time of the (k−2)th digit ((k−2) th bit) has passed, the beam OFF is provided by the common blanking system.

Next, after the beam ON time for the irradiation step of the (k−2)th digit ((k−2)th bit) has passed, a read signal of the (k−3) th digit ((k−3) th bit) is input into the register 42. Since the data of the (k−3)th digit ((k−3)th bit) is "1" in the register 42 with respect to the beam 1, it is switched to output an ON signal. Therefore, the output of the individual amplifier 1 becomes ON, and an ON voltage is applied to the electrode 24 for individual blanking. Similarly, after the settling time of the individual amplifier 1 has passed, the beam ON is provided by the common blanking system. This time, since the output of the individual amplifier 1 is ON, consequently, the beam 1 becomes ON. Then, after the irradiation time of the (k−3)th digit ((k−3)th bit) has passed, the beam OFF is provided by the common blanking system.

As described above, for each beam in multiple beams, beam ON/OFF switching is performed by the individual blanking system for the beam concerned, with respect to each time irradiation of irradiation performed the number of times equal to the number of digits (irradiation steps performed the number of times equal to the number of digits), by using a plurality of individual blanking systems that respectively perform beam ON/OFF control of a corresponding beam in the multiple beams. Simultaneously, with respect to each time irradiation of irradiation performed the number of times equal to the number of digits (irradiation steps performed the number of times equal to the number of digits), in addition to performing beam ON/OFF switching for each beam by the individual blanking system, blanking control is performed so that the condition of the beam may be ON during the irradiation time corresponding to irradiation of the digit concerned by using the common blanking system that collectively performs beam ON/OFF control for the whole of multiple beams. By the switching operation of the individual blanking system and the common blanking system, beam of the irradiation time corresponding to each digit irradiates the target object 101 in order.

The electron beam 200 emitted from the electron gun assembly 201 (emission unit) almost perpendicularly illuminates the whole of the aperture member 203 by the illumination lens 202. A plurality of holes (openings), each being a quadrangle, are formed in the aperture member 203. The region including all the plurality of holes is irradiated with the electron beam 200. For example, a plurality of quadrangular electron beams (multiple beams) 20a to 20e are formed by letting parts of the electron beam 200 irradiating the positions of a plurality of holes pass through a corresponding hole of the plurality of holes of the aperture member 203 respectively. The multiple beams 20a to 20e respectively pass through a corresponding blanker (the first deflector: individual blanking system) of the blanking plate 204. Each blanker respectively deflects (performs blanking deflection) the electron beam 20 passing individually.

Figure 23:
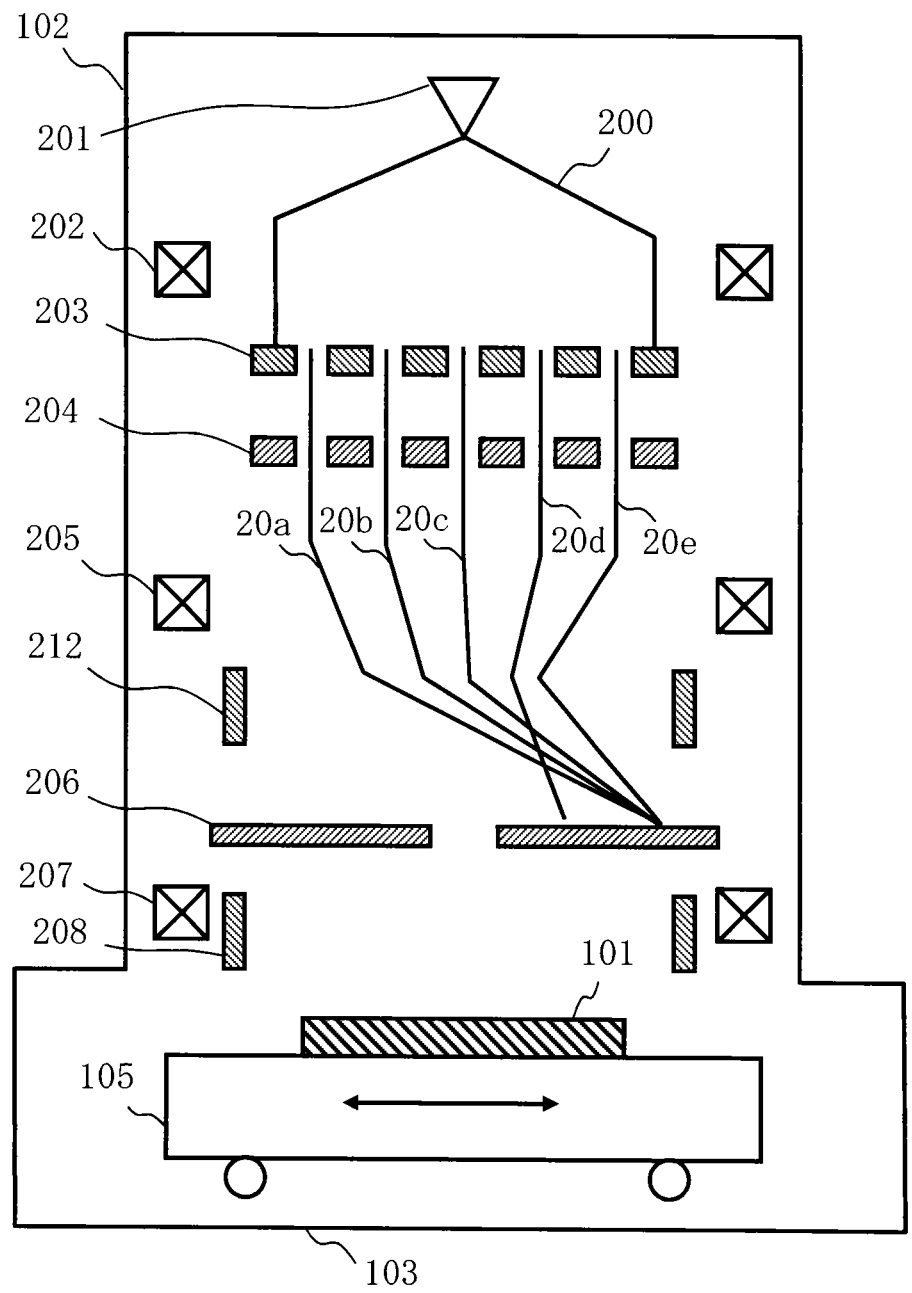
FIG. 23 is a schematic diagram explaining a blanking operation according to the second embodiment.

FIG. 23 is a schematic diagram explaining a blanking operation according to the second embodiment. The multiple beams 20a, 20b, . . . , 20e, having passed through the blanking plate 204 are reduced by the reducing lens 205, and go toward the hole at the center of the limiting aperture member 206. At this stage, the electron beam 20 which was deflected by the blanker of the blanking plate 204 deviates from the hole of the center of the limiting aperture member 206 (blanking aperture member) and is blocked by the limiting aperture member 206. On the other hand, if the electron beam 20 which was not deflected by the blanker of the blanking plate 204 is not deflected by the deflector 212 (common blanking system), it passes through the hole at the center of the limiting aperture member 206, as shown in FIG. 1. Blanking control is performed by combination of ON/OFF of the individual blanking system and ON/OFF of the common blanking system so as to control ON/OFF of the beam. Thus, the limiting aperture member 206 blocks each beam which was deflected to be a beam OFF state by the individual blanking system or the common blanking system. Then, beam of an irradiation step obtained by dividing one beam shot is formed by beams having been made during from a beam ON state to a beam OFF state and having passed through the limiting aperture member 206. The multi-beams 20 having passed through the limiting aperture member 206 are focused by the objective lens 207 in order to be a pattern image of a desired reduction ratio, and respective beams (the entire multi-beams 20) having passed through the limiting aperture member 206 are collectively deflected in the same direction by the deflector 208 so as to irradiate respective irradiation positions on the target object 101. While the XY stage 105 is continuously moving, controlling is performed by the deflector 208 so that irradiation positions of beams may follow the movement of the XY stage 105, for example. Ideally, multi-beams 20 to irradiate at a time are aligned at pitches obtained by multiplying the arrangement pitch of a plurality of holes of the aperture member 203 by a desired reduction ratio described above. The writing apparatus 100 performs a writing operation by the raster scan method which continuously irradiates shot beams in order, and when writing a desired pattern, a required beam is controlled by blanking control to be ON according to the pattern.

In the determination step (S124), the writing control unit 72 determines whether all the shots have been completed. If all the shots have been completed, it ends. If all the shots have not been completed yet, it returns to the gray level value N calculation step (S106), and the steps from the gray level value N calculation step (S106) to the determination step (S124) are repeated until all the shots have been completed.

The writing operation according to the second embodiment is the same as that described in FIG. 11 and explanation is the same as that for FIG. 11. Moreover, the contents of description with reference to from FIG. 12A to FIG. 15C can be applied to an example of the writing operation in a stripe according to the second embodiment.

As described above, according to the second embodiment, in addition to the effects of the first embodiment, the precision of irradiation time control and, further, the precision of dose control can be improved while maintaining the restriction on a circuit installation space. Moreover, since the logic circuit 41 of the individual blanking system has a data amount of one bit, power consumption can be suppressed.

Third Embodiment

The second embodiment has described the case of transmitting data for n times irradiation steps in order of the data amount from the largest, for example, but, it is not limited thereto. The third embodiment will describe the case of transmitting data obtained by combining data for a plurality of irradiation steps. The apparatus configuration according to the third embodiment is the same as that of FIG. 16. Moreover, the top view showing an example of the configuration of the blanking plate according to the third embodiment is the same as that of FIG. 17. While shown in FIG. 17 being connected by a 4-bit parallel line, it is connected by a 8-bit parallel line, to be described later, in the third embodiment. The flowchart showing main steps of a writing method according to the third embodiment is the same as that of FIG. 20. The contents of the third embodiment are the same as those of the second embodiment except what is particularly described below.

The time for data transmission can be included in the irradiation time of an irradiation step by performing, in parallel for each beam, transmission of data indicating ON/OFF of the (k−1)th bit ((k−1)th digit)) and the irradiation step of the k-th bit (k-th digit). However, since the irradiation time of an irradiation step becomes short if k becomes small, it becomes difficult to include the transmission of data indicating ON/OFF of the (k−1)th bit ((k−1)th digit)) in the irradiation time of the irradiation step. Then, according to the third embodiment, a digit whose irradiation time is long and a digit whose irradiation time is short are grouped. Thereby, the data transmission time of the next group can be included in the total of grouped irradiation time in the irradiation step. It is preferable to perform grouping by using a plurality of groups so that the difference between totals of grouped irradiation time may become shorter. That is, for example, it is preferable to perform grouping, such as to group an n-th digit (n-th bit) and the first digit (first bit), to group the (n−1)th digit ((n−1)th bit)) and the second digit (second bit), to group the (n−2)th digit ((n−2)th bit) and the third digit (third bit) and so on. Thus, the individual blanking control for each beam is controlled, for example, by a 2-bit control signal.

Figure 24A:
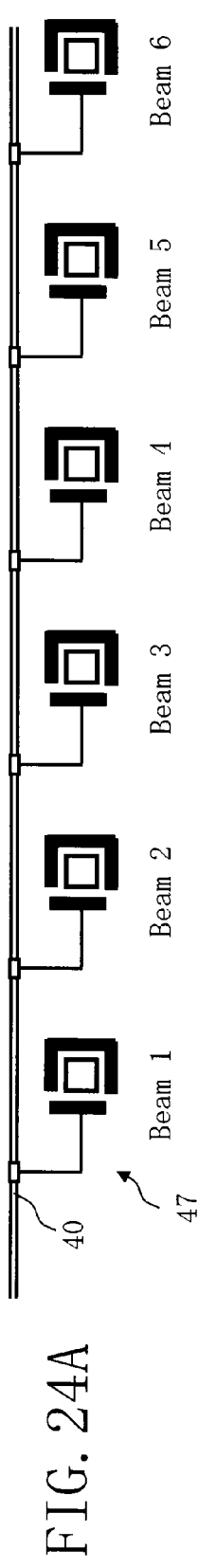
FIGS. 24A and 24B show examples of a connected state of shift registers according to a third embodiment and a comparative example.
Figure 24B:
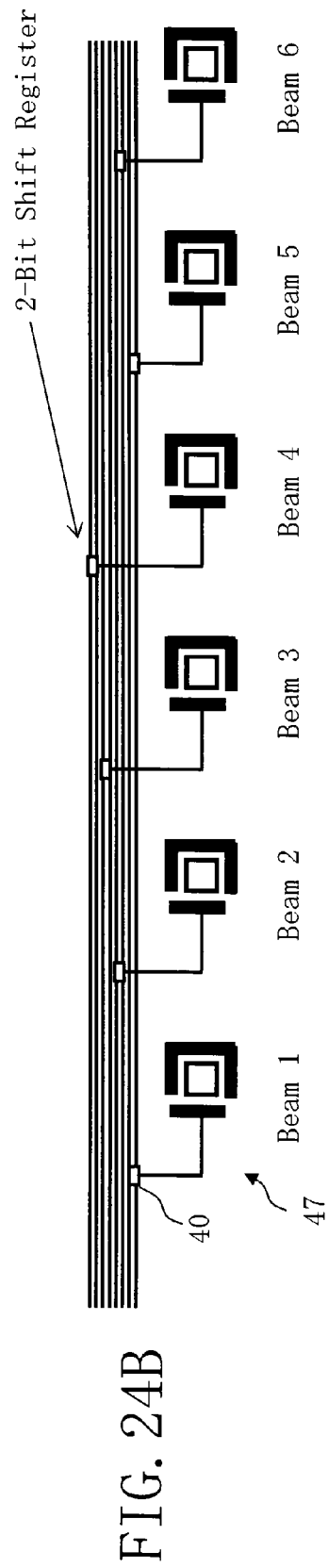

FIGS. 24A and 24B show examples of a connected state of shift registers according to the third embodiment and a comparative example. In FIGS. 24A and 24B, circuits other than the shift registers 40 in the control circuits 41 are not shown. The comparative example of FIG. 24A shows a part of the case where all the shift registers (first shift register group) in each row are connected in series. In the example of FIG. 24A, all the shift registers 40 in the eight individual blanking systems 47 each denoted by "A" in the first row from the top shown in FIG. 17 are connected in series by a 2-bit parallel line, for example. The serial parallel conversion unit 28 is connected to one of shift registers in a group in each row, (that is, the shift register 40 at the end and close to the serial parallel conversion unit 28), by a 2-bit parallel line. In the case of FIG. 24A, only six of the eight individual blanking systems 47 are shown, and the others are omitted. Moreover, in the case of FIG. 24A, beams passing through the eight individual blanking systems 47 each denoted by "A" in the first row are defined, for example, from the side close to the serial parallel conversion unit 28, as a beam 1, a beam 2, and so on. In the configuration shown in FIG. 24A, when eight individual blanking systems 47 are arranged at "A" in the first row, performing clock operation eight times is needed for transmitting a blanking signal up to a beam 8 by using the shift registers 40. Therefore, in the case of FIG. 24A, clock operation of eight times is needed for one beam shot.

By contrast, according to the third embodiment, FIG. 24B shows a part of the case where the shift registers (third shift register group) in a subgroup in the group of each row are connected in series. For example, the shift registers 40 in the two individual blanking systems 47 in a subgroup "A1" are connected in series by a 2-bit parallel line. Moreover, for example, the shift registers 40 in the two individual blanking systems 47 in a subgroup "A2" are connected in series by a 2-bit parallel line. The serial parallel conversion unit 28 is connected, totally by a 8-bit parallel line, to each shift register (the shift register 40 at the end and close to the serial parallel conversion unit 28, in each subgroup,) in shift registers in a subgroup in the group of each row. The same is applied to other groups.

In other words, each serial parallel conversion unit 28 is connected to the shift registers (third shift register group) in each subgroup in a corresponding group by parallel lines, the number of which is equal to the number obtained by multiplying the number of bits to be data processed by the shift register 40 by the number of subgroups.

Moreover, in the case of FIG. 24B, similarly to FIG. 24A, only six of the eight individual blanking systems 47 are shown, and the others are omitted. In the case of FIG. 24B, beams passing through the eight individual blanking systems 47 each denoted by "A" in the first row are defined, for example, from the side close to the serial parallel conversion unit 28, as a beam 1, a beam 2, and so on. In the configuration shown in FIG. 24B, when eight individual blanking systems 47 are arranged at "A" in the first row, performing clock operation twice is sufficient for transmitting a blanking signal up to a beam 8 by using the shift registers 40 because four subgroups, each of which is composed of two shift registers 40 connected in series, are connected in parallel. Therefore, the number of times of clock operation can be reduced to one K-th (K being the number of subgroups). Here, the number of times of clock operation can be reduced to one fourth (¼).

Therefore, the number of times of clock operation per unit time can be reduced, and a heating value can be suppressed (or reduced). Consequently, the heating value of a blanking plate can be suppressed (or reduced). Therefore, a high-speed operation can be achieved. Furthermore, even if the number of beams increases and the number of shift registers arranged in one row increases, the heating value of the blanking plate can be suppressed and the high-speed operation can be achieved by increasing the number of subgroups. For example, even when the number of beams increases, the heating value can be reduced to 1/K, without increasing the number of times of clock operation. Alternatively, K times the high-speed operation can be achieved by the same heating value.

Furthermore, according to the third embodiment, one set composed of the serial parallel conversion units 28 and the pad 29 is connected to each group. Therefore, even if the number of subgroups increases, it is possible not to increase the number of sets each composed of the serial parallel conversion unit 28 and the pad 29. Accordingly, the problem that it is difficult to arrange pads because the distance between the pads is too narrow can be avoided.

Furthermore, according to the third embodiment, as well as the second embodiment, as shown in FIGS. 17 and 24B, it is preferable that shift registers 40 connected in series in each subgroup are arranged at the same pitch. Thereby, the wiring lengths between shift registers connected in series in a subgroup can be substantially equal to each other. Therefore, impedance can be equal to each other, and transmission delay of a signal to a clock can be uniform. Therefore, the transmission timing of signals can be coincident with each other. Furthermore, according to the third embodiment, as shown in FIG. 17, for example, with respect to each row of a plurality of individual blanking systems 47 arranged in eight rows by eight columns (8×8), the individual blanking systems 47, also referred to as the shift registers 40, are arranged at the same pitch such that the first subgroup (A1, B1, H1), the second subgroup (A2, B2, . . . , H2), the third subgroup (A3, B3, . . . , H3), and the fourth subgroup (A4, B4, . . . , H4) are arranged in order one by one so as to repeat this arrangement. Therefore, with respect to all the shift registers arranged in two dimensions on the blanking plate 204, the wiring lengths each between the shift registers connected in series can be substantially equal to each other. Accordingly, in each shot of multiple beams, signal transmission delay to a clock can be uniform.

Furthermore, according to the third embodiment, it is preferable that each subgroup in a plurality of subgroups in each group is composed of shift registers (third shift register group) whose number is equal to that of shift registers in another subgroup as shown in FIG. 17. If the number of shift registers differs between subgroups, when performing each shot, operation speed is rate-determined by the number of times of clock operation of a subgroup which has more shift registers. Therefore, as described in the second embodiment, the number of times of clock operation can be reduced by equalizing the number of shift registers between subgroups.

Figure 25:
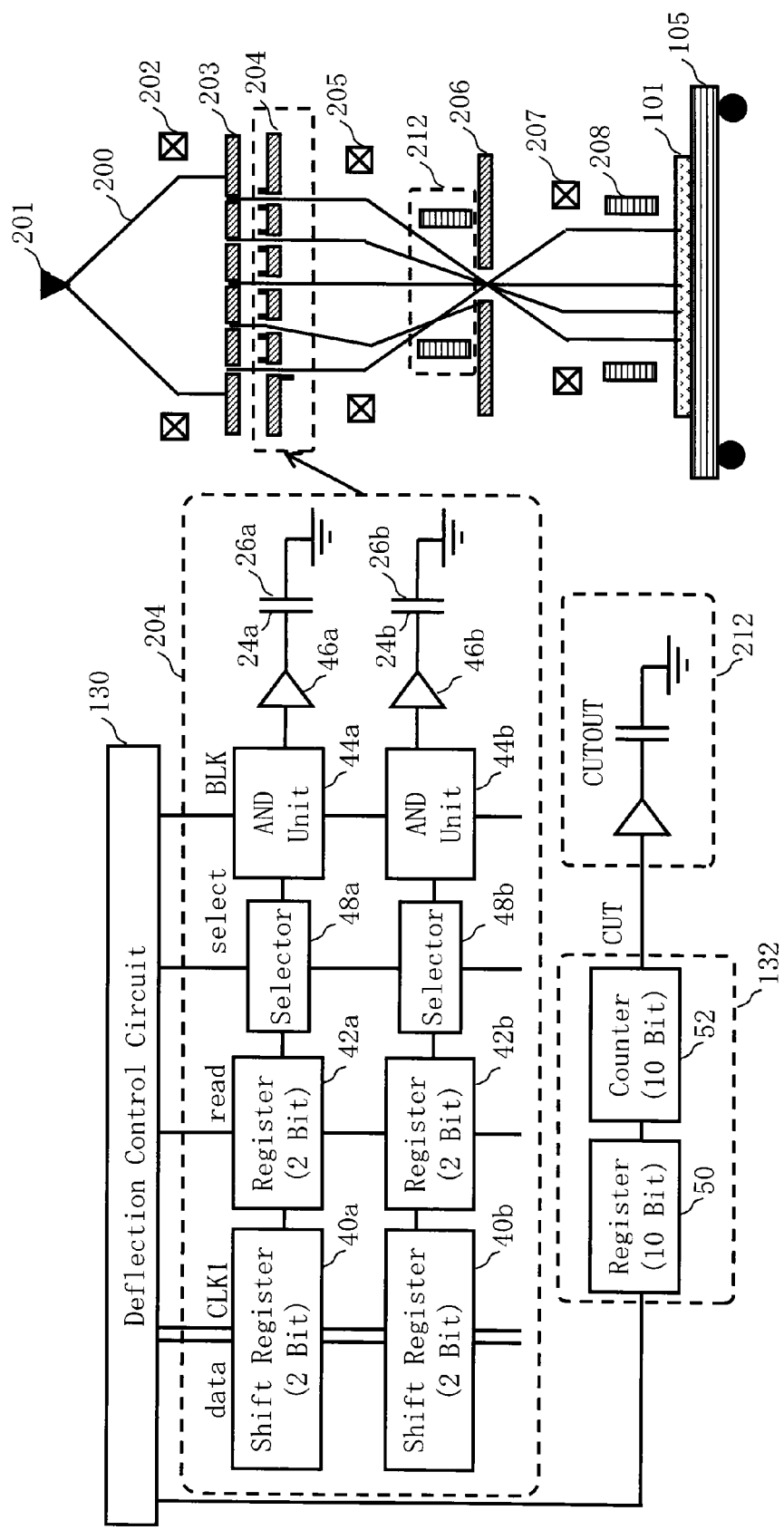
FIG. 25 is a schematic diagram showing the internal structure of an individual blanking control circuit and a common blanking control circuit according to the third embodiment.

FIG. 25 is a schematic diagram showing the internal structure of an individual blanking control circuit and a common blanking control circuit according to the third embodiment. FIG. 25 is the same as FIG. 19 except that a selector 48 is added to each logic circuit 41 for individual blanking control arranged at the blanking plate 204 in the body of the writing apparatus 100, and that individual blanking control for each beam is controlled by, for example, a 2-bit control signal. Here, the case of combining two irradiation steps to set one group is shown, for example. Therefore, one bit each is used as a control signal, for each irradiation step in the group. Accordingly, a 2-bit control signal is used for each group. Even though the control signal is two bits, the logic circuit itself of the control circuit for beam ON/OFF can be overwhelmingly small compared with a circuit in which dose control is performed using ten bits. Therefore, the installation area (of a circuit on the blanking aperture) can be made small while improving the response of blanking control (using a common blanking system). In other words, even in the case of arranging a logic circuit on the blanking plate 204 having a narrow installation space, precision of dose control can be improved while realizing a smaller beam pitch.

Figure 26:
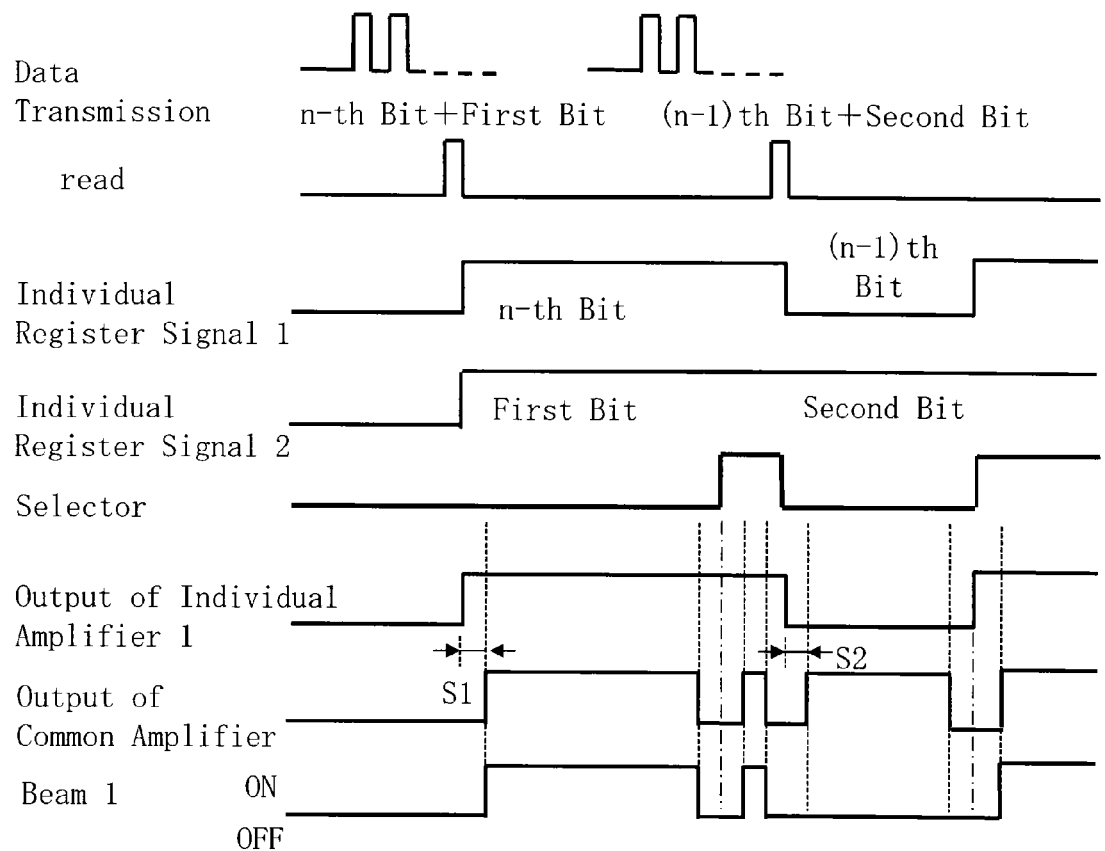
FIG. 26 is a flowchart showing a beam ON/OFF switching operation with respect to a part of an irradiation step of one shot according to the third embodiment.

FIG. 26 is a flowchart showing a beam ON/OFF switching operation with respect to a part of an irradiation step of one shot according to the third embodiment. FIG. 26 shows one beam (the beam 1) as an example in a plurality of beams of a multi-beam. Irradiation steps of: from a group of the n-th bit (n-th digit) and the first bit (first digit) to a group of the (n−1) th bit ((n−1) th digit)) and the second bit (second digit) of the beam 1 are shown, for example. As for irradiation time arrangement data, there is shown the case of the n-th bit (n-th digit) being "1", the first bit (first digit) being "1", the (n−1) th bit ((n−1) th digit) being "0", and the second bit (second digit) being "1", for example.

First, in response to an input of a read signal of the group of the n-th bit (n-th digit) and the first bit (first digit), the individual register 42 (an individual register signal 1 (the n-th digit) and an individual register signal 2 (the first digit)) outputs ON/OFF signals in parallel (as parallel transmission signals), based on the stored data of the n-th bit (n-th digit) and the first bit (first digit). Since a 2-bit signal is used in the third embodiment, it is necessary to select and switch a signal. Referring to FIG. 26, first, data of the individual register signal 1 is selected by the selector 48, and an ON signal of the n-th bit (the n-th digit) is output to the individual amplifier.

Next, with respect to the output of the individual register 42, data of the individual register 2 is selected by the switching of the selector 48, and the output of the n-th bit (the n-th digit) is switched to the output of the first bit (the first digit). This switching is sequentially repeated for each irradiation step.

Since the data of the n-th bit (the n-th digit) is data indicating ON, the individual amplifier 46 (the individual amplifier 1) outputs an ON voltage to be applied to the blanking electrode 24 for the beam 1. On the other hand, in the logic circuit 132 for common blanking, ON/OFF is switched depending upon timing data of ten bits of each irradiation step. In the common blanking system, an ON signal is output during the irradiation time of each irradiation step. For example, if Δ=1 ns, the irradiation time of the first irradiation step (for example, the tenth digit (the tenth bit)) is Δ×512=512 ns. The irradiation time of the second irradiation step (for example, the first digit (the first bit)) is Δ×1=1 ns. The irradiation time of the third irradiation step (for example, the ninth digit (the ninth bit)) is Δ×256=256 ns. The irradiation time of the fourth irradiation step (for example, the second digit (the second bit)) is Δ×2=2 ns. Similarly, it becomes ON during the irradiation time of each digit (each bit) of each group, hereafter. In the logic circuit 132, when timing data of each irradiation step is input into the register 50, the register 50 outputs data indicating ON of the k-th digit (the k-th bit), the counter 52 counts the irradiation time of the k-th digit (the k-th bit), and it is controlled to be OFF after the irradiation time has passed. Hereafter, beam irradiation is performed in order for each group.

As described above, according to the third embodiment, data transmission time can be included in the total grouped irradiation time in an irradiation step.

Although it is configured to switch two data by using a selector in the third embodiment, it is also effective to perform transmission in order by using a shift register without using a selector.

Furthermore, although the case of grouping two irradiation steps has been described in the third embodiment, it is not limited thereto. For example, if three irradiation steps are grouped, the total time of a data transmission time and a grouped irradiation time in an irradiation step can be more uniformized. If the number of grouped irradiation steps is increased, uniformity can be enhanced. For example, when the irradiation step is each digit of a binary number, if the number of irradiation steps to be grouped is three or four, a sufficient uniformity result can be acquired. However, when the number of irradiation steps is increased, the number of necessary registers is also increased, which results in increasing the circuit area. Therefore, the number of irradiation steps to be grouped is to be suitably selected according to a demand. A concrete embodiment is not limited to what is described above. Various embodiments can be selected in accordance with the gist of the present invention that the transmission time of group data is to be included in the total grouped irradiation time in an irradiation step.

Fourth Embodiment

While, in the second and third embodiments described above, blanking control is performed, for each beam, for an irradiation step (divided shot) of each of a plurality times of irradiation obtained by dividing one shot, by using the blanking plate 204 for individual blanking control and the deflector 212 for common blanking, it is not limited thereto. In the fourth embodiment, there will be described a configuration in which blanking control is performed, for each beam, for an irradiation step of each of a plurality of irradiation obtained by dividing one shot, by using the blanking plate 204 for individual blanking control without using the deflector 212 for common blanking.

Figure 27:
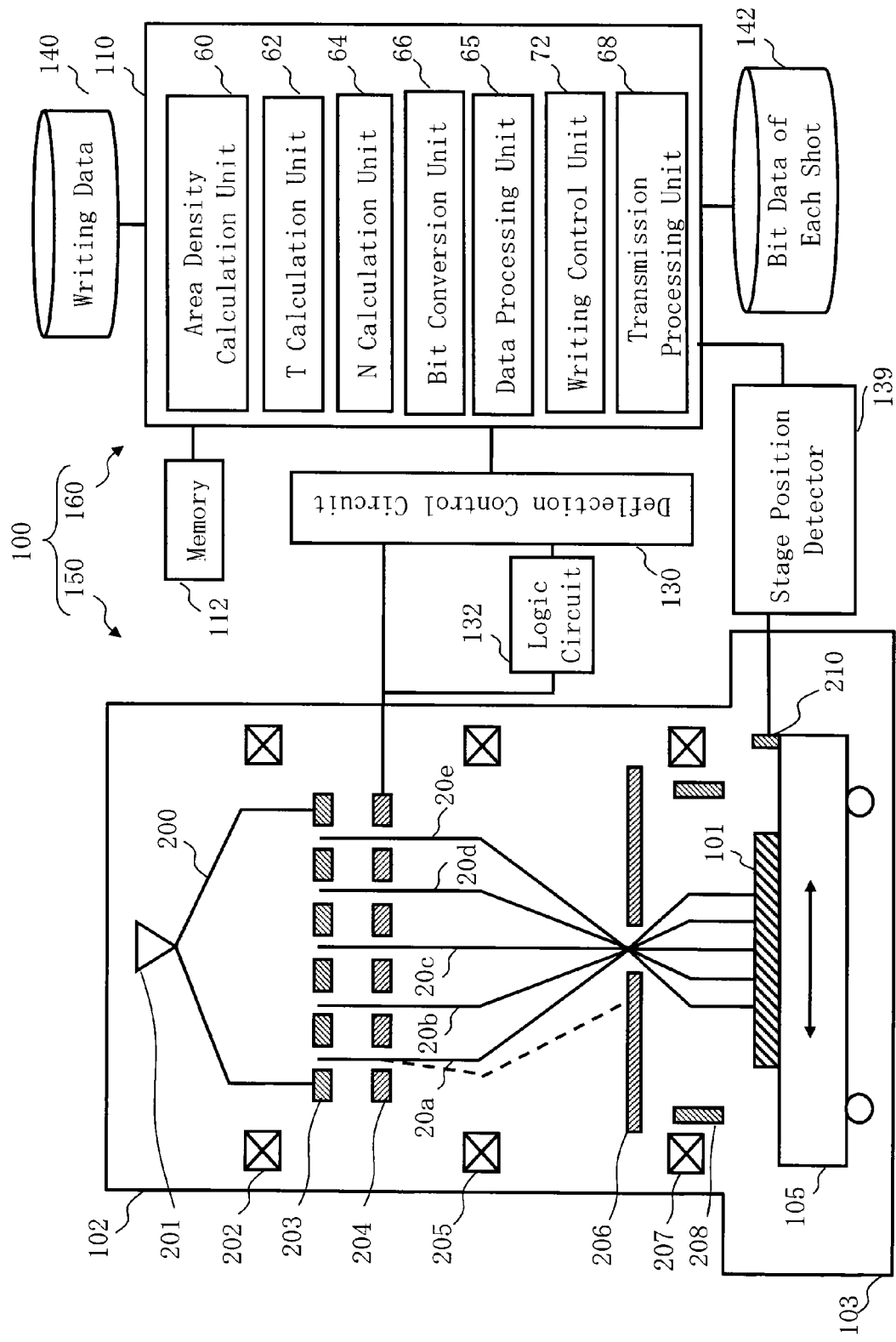
FIG. 27 is a schematic diagram showing the structure of a writing apparatus according to a fourth embodiment.

FIG. 27 is a schematic diagram showing the structure of a writing apparatus according to the fourth embodiment. FIG. 27 is the same as FIG. 16 except that the deflector 212 does not exist and output of the logic circuit 132 is connected to the blanking plate 204. The top view showing an example of the configuration of the blanking plate according to the fourth embodiment is the same as that of FIG. 17. Main steps of a writing method according to the fourth embodiment are the same as those of FIG. 20. The contents of the fourth embodiment are the same as those of the second embodiment except what is particularly described below.

Figure 28:
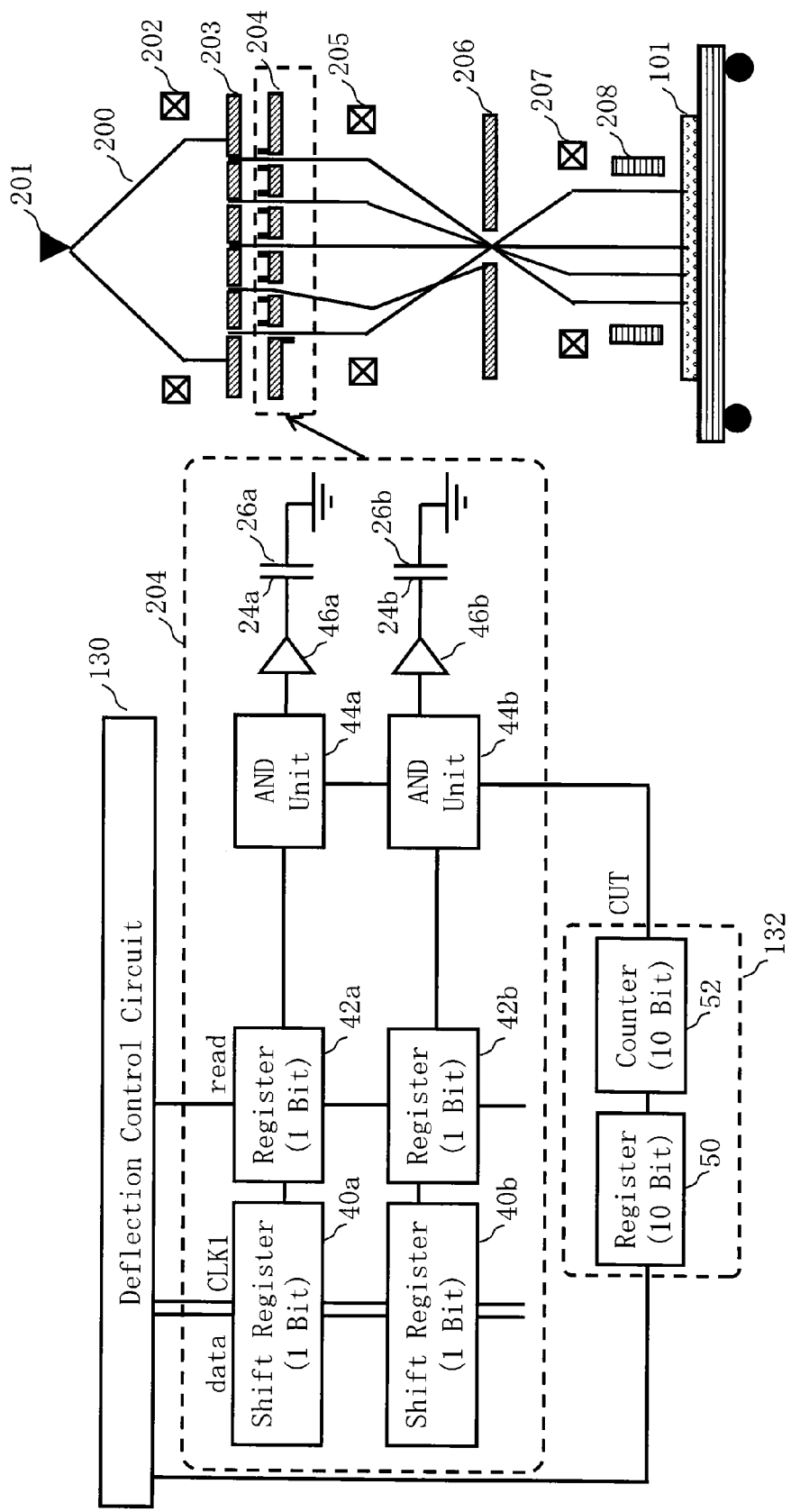
FIG. 28 is a schematic diagram showing the internal structure of an individual blanking control circuit and a common blanking control circuit according to the fourth embodiment.

FIG. 28 is a schematic diagram showing the internal structure of an individual blanking control circuit and a common blanking control circuit according to the fourth embodiment. The contents of FIG. 28 are the same as those of FIG. 19 except that the deflector 212 does not exist and an output signal of the logic circuit 132 is input into the AND unit 44 (AND circuit) instead of a signal from the deflection control circuit 130.

In the individual beam ON/OFF switching step (S116), by using a plurality of logic circuits (first logic circuit) each including the shift register 40 and the individual register 42 that output a beam ON/OFF control signal to a corresponding beam in multiple beams, an ON/OFF control signal (first ON/OFF control signal) for a beam is output by a logic circuit (first logic circuit) for the beam concerned, with respect to each beam, for each irradiation of a plurality of times of irradiation. Specifically, as described above, when inputting the k-th bit (k-th digit) data, the individual register 42 of each beam outputs an ON/OFF signal to the AND unit 44, based on the input data. If the k-th bit (k-th digit) data is "1", an ON signal is to be output, and if the data is "0", an OFF signal is to be output.

In the common beam ON/OFF switching step (S118), for each beam, with respect to each irradiation of a plurality of times of irradiation, after a beam ON/OFF control signal has been switched by the logic circuit for individual blanking, another beam ON/OFF control signal (second ON/OFF control signal) is output so that a beam may be in the ON condition during the irradiation time corresponding to an irradiation concerned, by using the logic circuit 132 (second logic circuit) which collectively outputs a beam ON/OFF control signal to the whole of multiple beams. Specifically, in the logic circuit 132 for common blanking, ON/OFF is switched depending upon 10-bit timing data of each irradiation step. The logic circuit 132 outputs an ON/OFF control signal to the AND unit 44. In the logic circuit 132, an ON signal is output during the irradiation time of each irradiation step.

In the blanking control step, when both the ON/OFF control signal for an individual beam and the ON/OFF control signal for a common beam are ON control signals, the AND unit 44 provides blanking control so that a beam concerned may be in an ON state during the irradiation time corresponding to the irradiation concerned. When both the ON/OFF control signal for an individual beam and the ON/OFF control signal for a common beam are ON control signals, the AND computing units 44 outputs an ON signal to the amplifier 46, and, then, the amplifier 46 applies an ON voltage to the electrode 24 of the individual blanking deflector. In other case, the AND unit 44 outputs an OFF signal to the amplifier 46, and, then, the amplifier 46 applies an OFF voltage to the electrode 24 of the individual blanking deflector. Thus, when both the ON/OFF control signal for an individual beam and the ON/OFF control signal for a common beam are ON control signals, the electrode 24 (individual blanking system) of the individual blanking deflector individually performs beam ON/OFF control so that a beam concerned may be in the ON condition during the irradiation time corresponding to the irradiation concerned.

Since the individual blanking circuit is arranged in the large region of the blanking plate, time deviation is generated in operations of the individual blanking circuit because of delay by the circuit, delay by the length of wiring, and the like. However, if a beam-on signal is supplied from the common blanking when the operation of the individual blanking circuit affected by the response speed deviation has been settled, it is possible to avoid unstable beam irradiation caused by individual circuit delay and the like.

As described above, even when the blanking plate 204 for individual blanking control is used without using the deflector 212 for common blanking, the restriction on a circuit installation space can be maintained like the first embodiment. Moreover, since the logic circuit 41 for individual blanking has a data amount of one bit, power consumption can also be suppressed. Furthermore, there is an advantage that the deflector 212 for common blanking can be omitted.

In the present embodiment, the logic circuit 132 for common blanking may be manufactured independently, or alternatively, it can also be manufactured, as an integrated circuit of a monolithic structure, to be arranged at the peripheral part of the blanking plate. If the logic circuit 132 for common blanking is arranged at the peripheral part of the blanking plate, the wiring length to the individual blanking circuit can be short, which has an advantage of facilitating an exact timing control.

In the example described above, although the case in which the logic circuit 41 for individual blanking has a data amount of one bit is described, it is not limited thereto. The configuration according to the fourth embodiment can also be applied to the case of a data amount of two bits as in the third embodiment. Moreover, the configuration of the fourth embodiment is applicable to other embodiments.

Embodiments have been explained referring to concrete examples described above. However, the present invention is not limited to these specific examples. While the case of inputting a 10-bit control signal to the shift register 40 has been described above, the number of bits may be suitably set. For example, a 2-bit (or 3 to 9 bit) control signal may be used. In such a case, with respect to between the shift registers 40 connected in series in each subgroup, and between the shift register 40 at the end of shift registers 40 connected in series and the serial parallel conversion unit 28, they should be connected by a parallel line having a set bit number. Of course, a 11 or more bit control signal may also be used.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other multi charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A blanking device for multiple charged particle beams comprising:
   a plurality of shift registers configured to be arranged in two dimensions; and
   a plurality of data transmitters each configured to be arranged, where each of first shift register groups is aligned in a same row or a same column, in the plurality of shift registers arranged in two dimensions, the plurality of data transmitters each arranged for each of second shift register groups each obtained by grouping shift registers of any one of the first shift register groups into one or more groups wherein
   each of the second shift register groups is further grouped into third shift register groups each having shift registers connected in series, as a plurality of subgroups, and
   each of the plurality of data transmitters is connected to shift registers configuring a part of shift registers connected in series in each of the third shift register groups such that all of the plurality of subgroups in a corresponding second shift register group are connected in parallel.

2. The device according to claim 1, wherein the shift registers of the third shift register group, connected in series, in each of the plurality of subgroup are arranged at a same pitch.

3. The device according to claim 1, wherein each of the plurality of subgroups in the each of the one or more groups is composed of a same number of the shift registers of the third shift register group.

4. The device according to claim 1, wherein each of the plurality of data transmitters is connected to each the third shift register group in a corresponding group in the one or more groups by parallel lines whose number is equal to a number obtained by multiplying a number of bits to be data processed by each of the plurality of shift registers by a number of subgroups.

5. The device according to claim 1, wherein each of the first shift register groups includes all second shift register groups in one group of the one or more groups, and one shift register of one of the second shift register groups of other groups in the one or more groups.

6. The device according to claim 1, wherein each of the second shift register groups is composed of a plurality of shift registers arranged at intervals of k shift registers in the first shift register group.

7. The device according to claim 6, wherein the each of the second shift register groups is composed of a plurality of shift registers arranged at intervals of one shift register in the first shift register group.

8. The device according to claim 1, wherein each the third shift register group is composed of a plurality of shift registers connected in series in the second shift register group.

9. The device according to claim 6, wherein each the third shift register group is composed of a plurality of shift registers connected in series in the second shift register group which is composed of a plurality of shift registers arranged at intervals of n shift registers.

10. The device according to claim 1, wherein each of the plurality of data transmitters is composed of a set of one pad or a pair of pads and one serial parallel conversion unit.

11. The device according to claim 1, wherein each of the plurality of data transmitters includes a pad that outputs first signals having been serially transmitted and a serial parallel conversion unit that converts the first signals from the pad to second signals and outputs the second signals to be transmitted in parallel.

12. A multi charged particle beam writing method comprising:
   performing ON/OFF switching of a beam by an individual blanking system for the beam concerned, for each beam in multi-beams of charged particle beam, with respect to each time irradiation of irradiation of a plurality of times, by using a plurality of individual blanking systems that respectively perform beam ON/OFF control of a corresponding beam in the multi-beams; and
   performing blanking control, in addition to the performing ON/OFF switching of the beam for the each beam by the individual blanking system, with respect to the each time irradiation of the irradiation of the plurality of times, so that the beam is in an ON state during an irradiation time corresponding to irradiation concerned, by using a common blanking system that collectively performs beam ON/OFF control for a whole of the multi-beams, wherein the plurality of individual blanking systems includes
   a plurality of shift registers configured to be arranged in two dimensions, and
   a plurality of data transmitters each configured to be arranged, where each of first shift register groups is aligned in a same row or a same column, in the plurality of shift registers arranged in two dimensions, the plurality of data transmitters each arranged for each of second shift register groups each obtained by grouping shift registers of any one of the first shift register groups into one or more groups, wherein
   each of the second shift register groups is further grouped into third shift register groups each having shift registers connected in series, as a plurality of subgroups, and
   each of the plurality of data transmitters is connected to shift registers configuring a part of shift registers connected in series in each of the third shift register groups such that all of the plurality of subgroups in a corresponding second shift register group are connected in parallel.

* * * * *